United States Patent
Jiang et al.

(10) Patent No.: US 12,069,863 B2
(45) Date of Patent: Aug. 20, 2024

(54) METHOD OF FORMING MEMORY DEVICE COMPRISING CONDUCTIVE PILLARS

(71) Applicant: Taiwan Semiconductor Manufacturing Company, Ltd., Hsinchu (TW)

(72) Inventors: Yu-Wei Jiang, Hsinchu (TW); Sheng-Chih Lai, Hsinchu County (TW); TsuChing Yang, Taipei (TW); Hung-Chang Sun, Kaohsiung (TW); Kuo-Chang Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 74 days.

(21) Appl. No.: 17/884,536

(22) Filed: Aug. 9, 2022

(65) Prior Publication Data
US 2022/0384486 A1    Dec. 1, 2022

Related U.S. Application Data

(62) Division of application No. 17/159,179, filed on Jan. 27, 2021, now Pat. No. 11,729,988.

(60) Provisional application No. 63/040,538, filed on Jun. 18, 2020.

(51) Int. Cl.
| | |
|---|---|
| *H10B 51/20* | (2023.01) |
| *H01L 29/24* | (2006.01) |
| *H10B 51/10* | (2023.01) |
| *H10B 51/30* | (2023.01) |

(52) U.S. Cl.
CPC .............. *H10B 51/20* (2023.02); *H01L 29/24* (2013.01); *H10B 51/10* (2023.02); *H10B 51/30* (2023.02)

(58) Field of Classification Search
CPC ........ H10B 51/10; H10B 51/20; H10B 51/30; H01L 29/24; H01L 29/41741; H01L 29/41775
See application file for complete search history.

(56) References Cited

U.S. PATENT DOCUMENTS

| | | | |
|---|---|---|---|
| 2020/0026990 A1* | 1/2020 | Lue | G11C 5/025 |
| 2020/0051990 A1* | 2/2020 | Harari | H01L 27/1214 |
| 2020/0075631 A1* | 3/2020 | Dong | H01L 29/7827 |
| 2021/0375919 A1* | 12/2021 | Wang | H01L 27/11519 |
| 2021/0375938 A1* | 12/2021 | Lin | H01L 29/78391 |
| 2021/0376153 A1* | 12/2021 | Lu | G11C 11/2255 |

FOREIGN PATENT DOCUMENTS

| | | | | |
|---|---|---|---|---|
| KR | 20220010027 A | * | 1/2022 | ........ H01L 27/11578 |
| WO | WO-2020086566 A1 | * | 4/2020 | ......... H01L 27/0688 |

* cited by examiner

*Primary Examiner* — Matthew E Warren
(74) *Attorney, Agent, or Firm* — JCIPRNET

(57) ABSTRACT

A first conductive pillar is formed. A plurality of second conductive pillars are formed at different sides of the first conductive pillar. A plurality of dielectric pillars are respectively formed between the first conductive pillar and the plurality of second conductive pillars. A channel layer is formed to continuously surround the first conductive pillar, the plurality of second conductive pillars and the plurality of dielectric pillars. A memory material layer is formed to surround the channel layer.

20 Claims, 54 Drawing Sheets

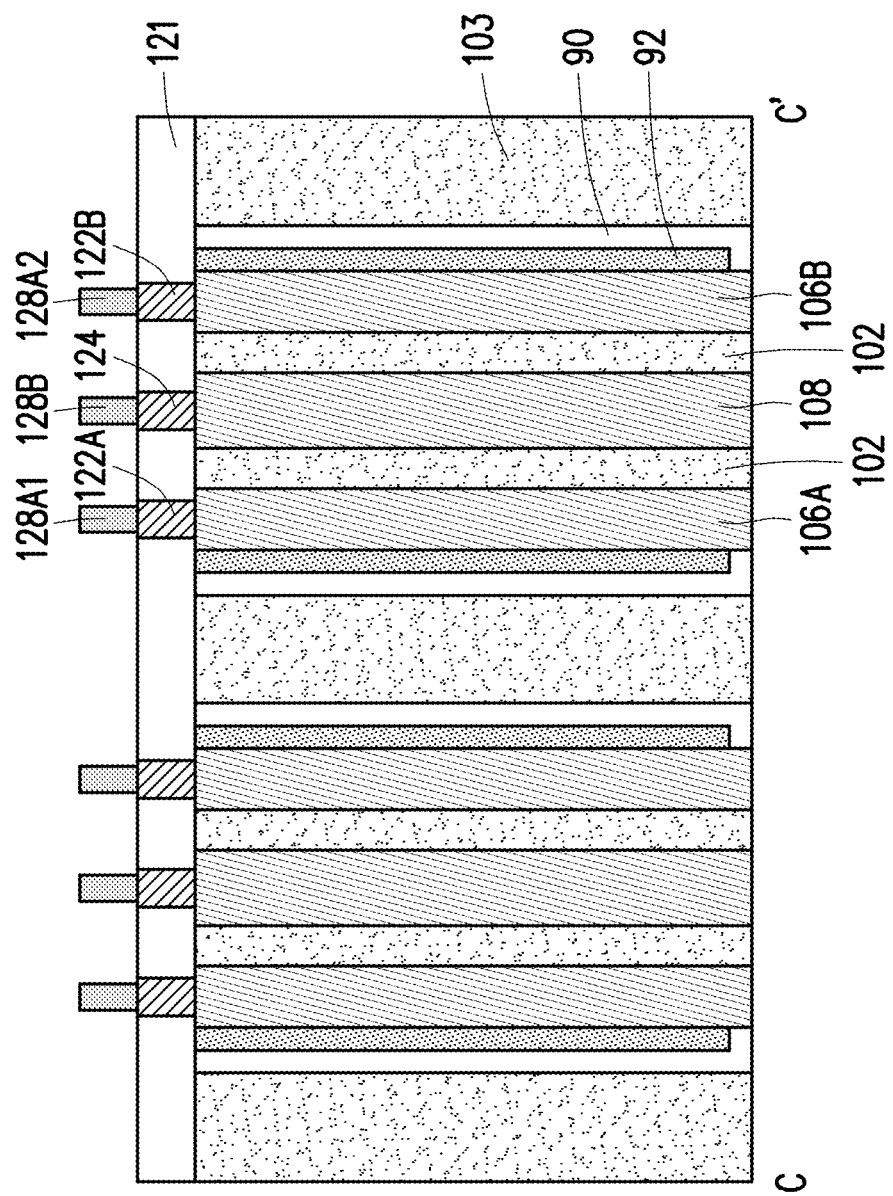

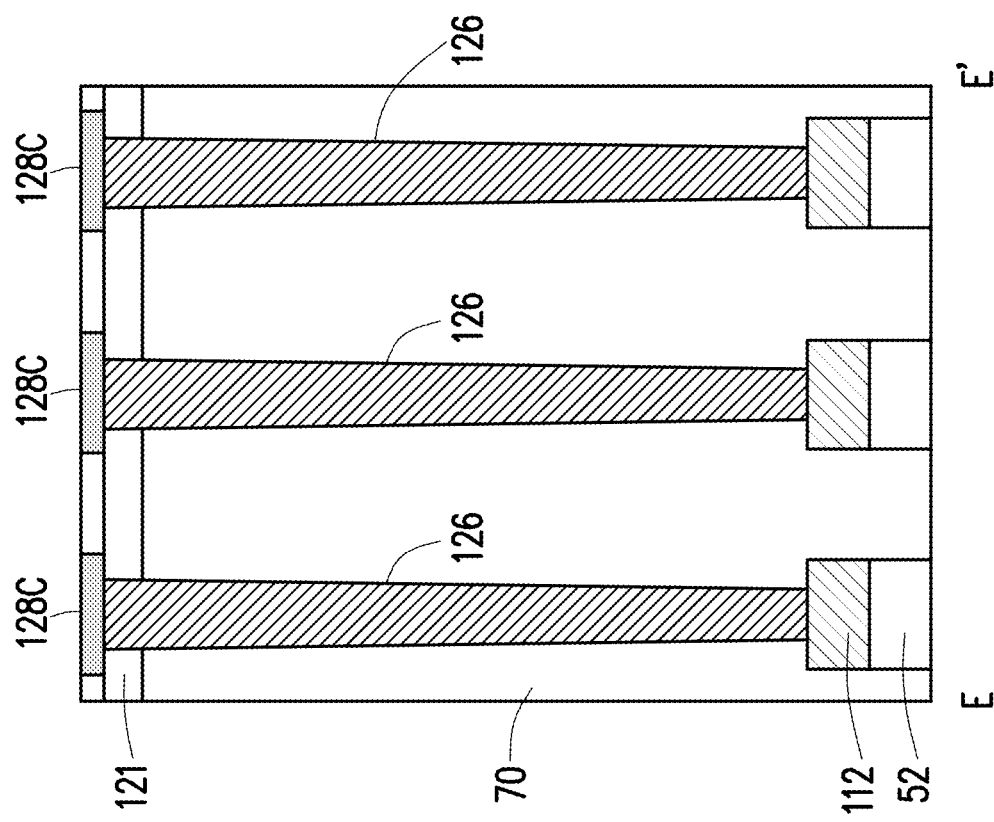

METHOD OF FORMING MEMORY DEVICE COMPRISING CONDUCTIVE PILLARS

CROSS-REFERENCE TO RELATED APPLICATION

This application is a divisional application of and claims the priority benefit of a prior application Ser. No. 17/159,179, filed on Jan. 27, 2021. The prior application Ser. No. 17/159,179 claims the priority benefit of U.S. provisional applications Ser. No. 63/040,538, filed on Jun. 18, 2020. The entirety of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25, 26A, 26B, 27A, 27B, 27C and 27D illustrate varying views of manufacturing a memory device in accordance with some embodiments.

DETAILED DESCRIPTION

Figure 1A:
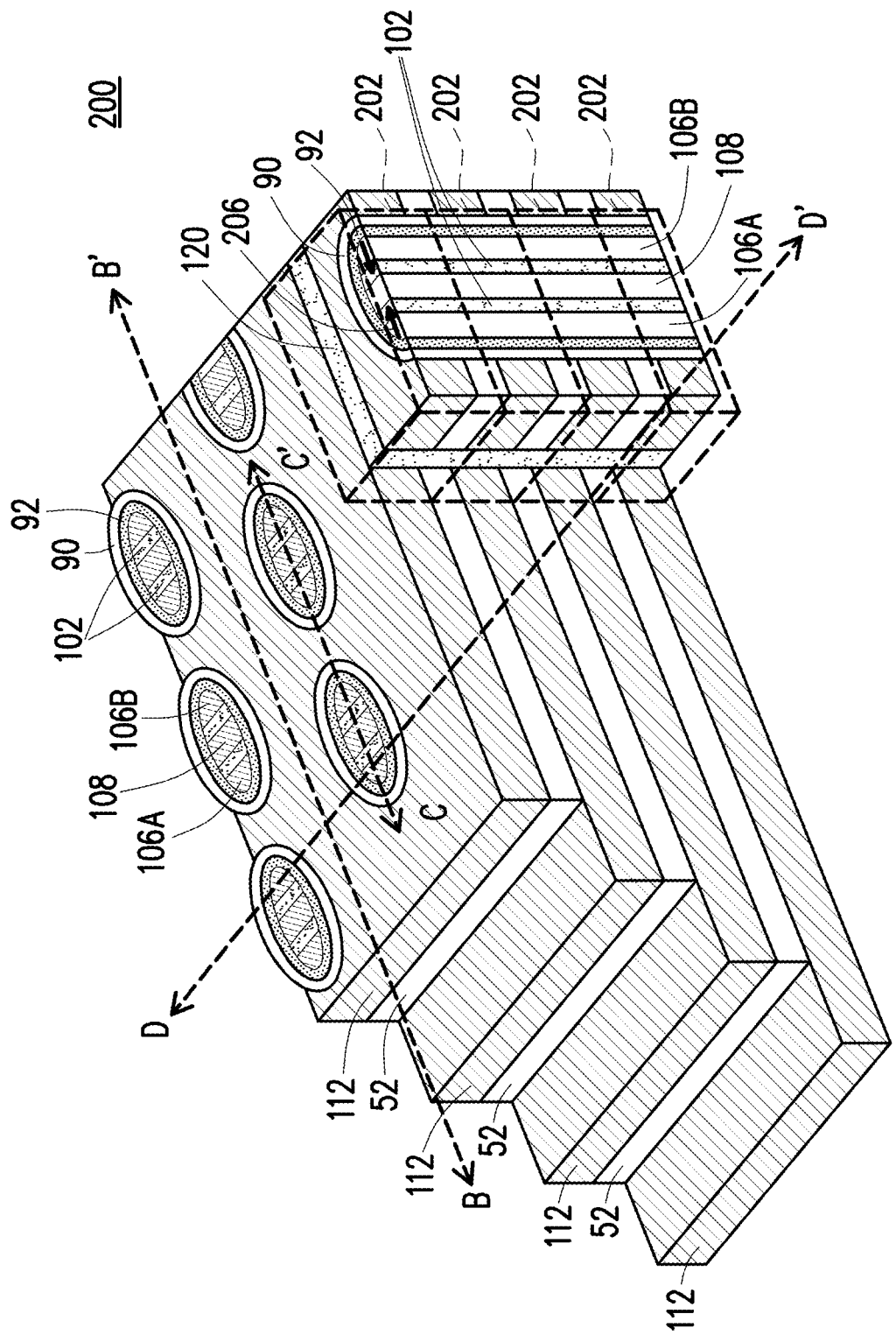
FIGS. 1A, 1B, and 1C illustrate a simplified perspective view, a circuit diagram, and a top down view of a memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, a source line region acting as a second source/drain electrode, a ferroelectric material acting as a gate dielectric, and an oxide semiconductor (OS) acting as a channel region. In some embodiments, each memory cell is regarded as a thin film transistor (TFT).

Figure 1B:
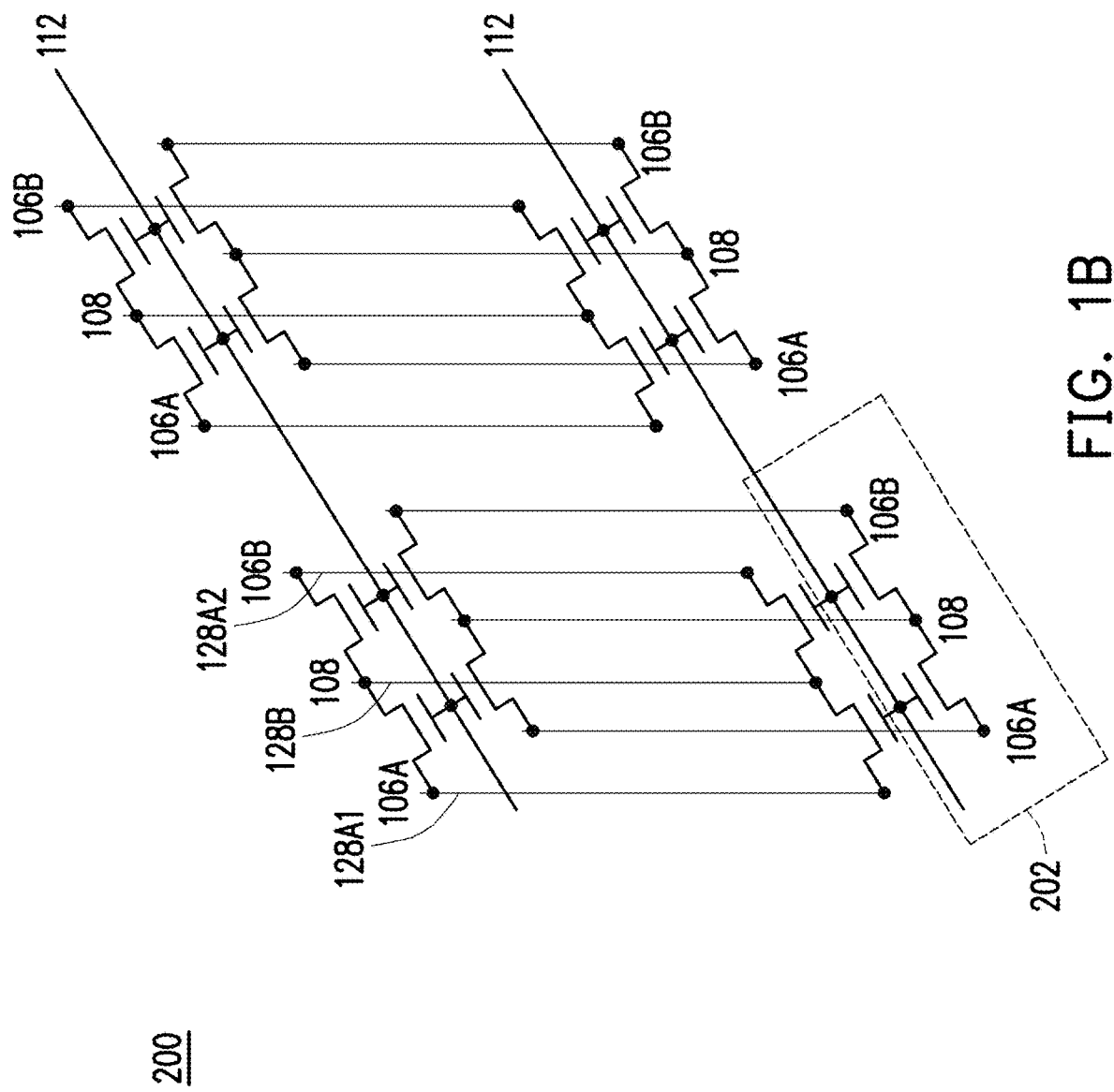
Figure 1C:
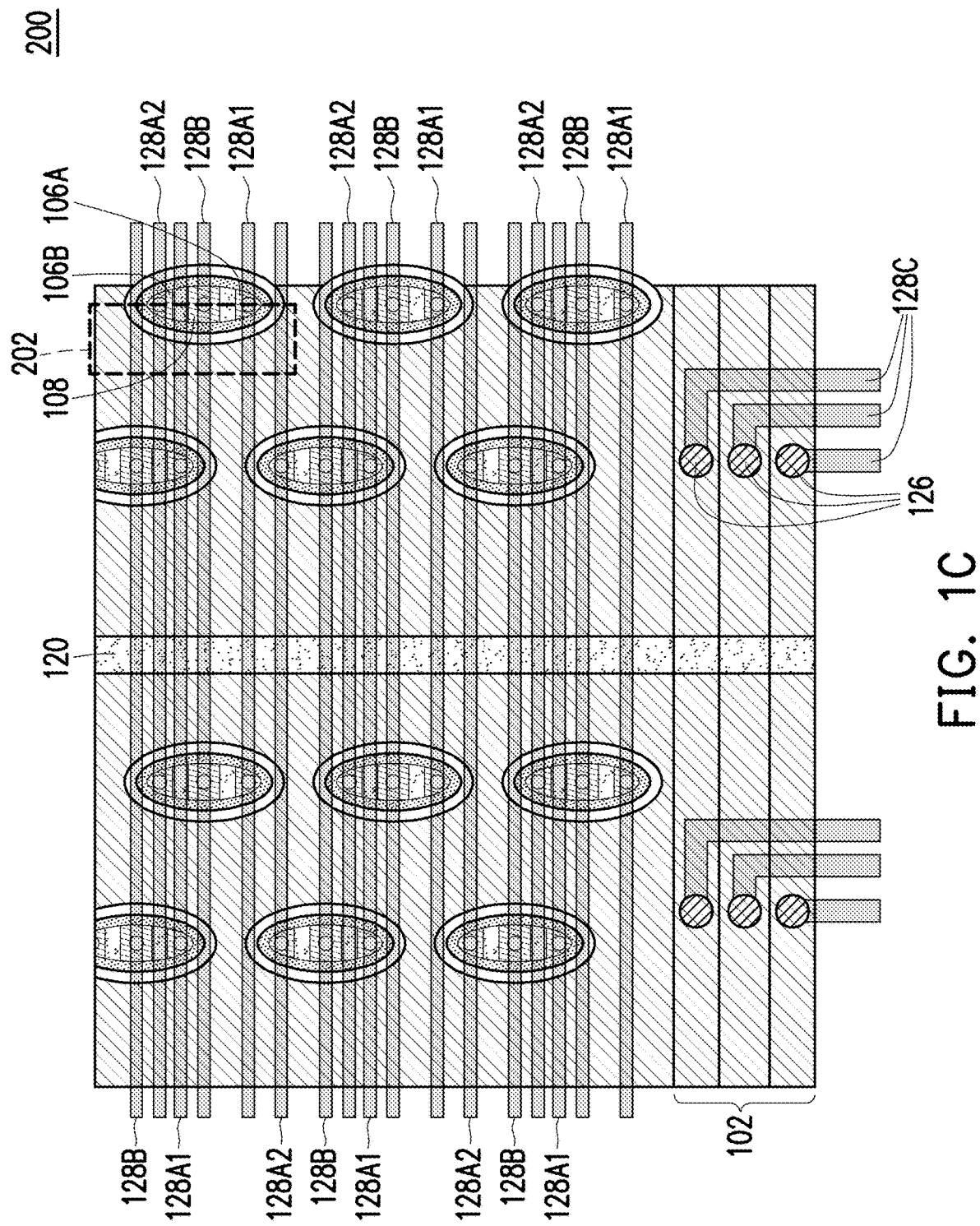

FIGS. 1A, 1B, and 1C illustrate examples of a memory array according to some embodiments. FIG. 1A illustrates an example of a portion of a simplified memory device 200 in a partial three-dimensional view; FIG. 1B illustrates a circuit diagram of the memory device 200; and FIG. 1C illustrates a top down view of the memory device 200 in accordance with some embodiments. The memory device 200 includes a plurality of memory cells 202, which may be arranged in a grid of rows and columns. The memory cells 202 may be further stacked vertically to provide a three dimensional memory array, thereby increasing device density. The memory device 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory device 200 is a flash memory array, such as a NOR flash memory array, or the like. In some embodiments, a gate of each memory cell 202 is electrically coupled to a respective word line (e.g., conductive line 112), a first source/drain region of each memory cell 202 is electrically coupled to a respective bit line (e.g., conductive line 128A1), a second source/drain region of each memory cell 202 is electrically coupled to a respective source line (e.g., conductive line 128B), and a third source/drain region of each memory cell 202 is electrically coupled to a respective bit line (e.g., conductive line 128A2). The memory cells 202 in a same horizontal row of the memory device 200 may share a common word line while the memory cells 202 in a same vertical column of the memory device 200 may share a common source line and common bit lines.

The memory device 200 includes a plurality of vertically stacked conductive lines 112 (e.g., word lines) with dielectric layers 52 disposed between adjacent ones of the conductive lines 112. The conductive lines 112 extend in a direction parallel to a major surface of an underlying substrate (not explicitly illustrated in FIGS. 1A and 1C). The conductive lines 112 may have a staircase configuration such that lower conductive lines 112 are longer than and extend laterally past endpoints of upper conductive lines 112. For example, in FIG. 1A, multiple, stacked layers of conductive lines 112 are illustrated with topmost conductive lines 112 being the shortest and bottommost conductive lines 112 being the longest. Respective lengths of the conductive lines 112 may increase in a direction towards the underlying substrate. In this manner, a portion of each of the conductive lines 112 may be accessible from above the memory device 200, and conductive contacts may be made to exposed portions of the conductive lines 112, respectively.

The memory device 200 further includes conductive pillars 106A (e.g., electrically connected to first conductive lines), conductive pillars 108 (e.g., electrically connected to second conductive lines) and conductive pillars 106B (e.g., electrically connected to first conductive lines) arranged alternately. The conductive pillars 106B are disposed between the conductive pillars 106A and the conductive pillars 106B. The conductive pillars 106A, 106B and 108 may each extend in a direction perpendicular to the conductive lines 112. A dielectric pillar 102 is disposed between and isolates adjacent ones of the conductive pillars 106A, 106B and the conductive pillars 108. The first conductive line is one of a source line and a bit line, and the second conductive line is the other of a source line and a bit line. In some embodiments, the conductive pillars 106A and the conductive pillars 106B are electrically connected to bit lines, and the conductive pillars 108 are electrically connected to source lines. In alternative embodiments, the conductive pillars 106A and the conductive pillars 106B are electrically connected to source lines, and the conductive pillars 108 are electrically connected to bit lines.

Sets of the conductive pillars 106A, 106B and 108 along with an intersecting conductive line 112 define boundaries of each memory cell 202, and the dielectric layer 120 is disposed between the adjacent conductive lines 112 (also referred to as common conductive lines 112). In some embodiments, the conductive pillars 108 are electrically coupled to ground. Although FIG. 1A illustrates a particular placement of the conductive pillars 106A, 106B relative the conductive pillars 108, it should be appreciated that the placement of the conductive pillars 106A, 106B and 108 may be exchanged in other embodiments.

In some embodiments, the memory device 200 include an oxide semiconductor (OS) material as a channel layer 92. The channel layer 92 may provide channel regions for the memory cells 202. For example, when an appropriate voltage (e.g., higher than a respective threshold voltage ($V_{th}$) of a corresponding memory cell 202) is applied through a corresponding conductive line 112, a region of the channel layer 92 that intersects the conductive line 112 allows current to flow from the conductive pillars 106A, 106B to the conductive pillars 108 (e.g., in the direction indicated by arrow 206).

In some embodiments, a memory material layer 90 is disposed between the channel layer 92 and each of the conductive lines 112 and the dielectric layers 52, and the memory material layer 90 serves as a gate dielectric for each memory cell 202. In some embodiments, the memory material layer 90 includes a ferroelectric material, such as a hafnium oxide, hafnium zirconium oxide, silicon-doped hafnium oxide, or the like. In such embodiments, the memory device 200 is also referred to as a ferroelectric memory device. In alternative embodiments, the memory material layer 90 include different types of memory materials. For example, the memory material layer 90 includes a non-ferroelectric material, such as a multilayer memory structure including a layer of SiNx between two SiOx layers (e.g., an ONO structure).

The memory material layer 90 may be polarized in one of two different directions, and the polarization direction may be changed by applying an appropriate differential voltage across the memory material layer 90 and generating an appropriate electric field. The polarization may be relatively localized (e.g., generally contained within each boundaries of the memory cells 202), and a continuous region of the memory material layer 90 may extend across a plurality of memory cells 202. Depending on a polarization direction of a particular region of the memory material layer 90, a threshold voltage of a corresponding memory cell 202 varies, and a digital value (e.g., 0 or 1) can be stored. For example, when a region of the memory material layer 90 has a first electrical polarization direction, the corresponding memory cell 202 may have a relatively low threshold voltage, and when the region of the memory material layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory material layer 90 corresponding to the memory cell 202. In some embodiments, the write voltage is applied, for example, by applying appropriate voltages to a corresponding conductive line 112 (e.g., the word line) and the corresponding conductive pillars 106A, 106B/108 (e.g., the bit line/source line). By applying the write voltage across the portion of the memory material layer 90, a polarization direction of the region of the memory material layer 90 may be changed. As a result, the corresponding threshold voltage of the corresponding memory cell 202 may also be switched from a low threshold voltage to a high threshold voltage or vice versa, and a digital value may be stored in the memory cell 202. Because the conductive lines 112 intersect the conductive pillars 106A, 106B and 108, individual memory cells 202 may be selected for the write operation.

To perform a read operation on the memory cell 202 in such embodiments, a read voltage (a voltage between the low and high threshold voltages) is applied to the corresponding conductive line 112 (e.g., the word line). Depending on the polarization direction of the corresponding region of the memory material layer 90, the memory cell 202 may or may not be turned on. As a result, the conductive pillars 106A, 106B may or may not be discharged through the conductive pillar 108 (e.g., a source line that is coupled to ground), and the digital value stored in the memory cell 202 can be determined. Because the conductive lines 112 intersect the conductive pillars 106A, 106B and 108, individual memory cells 202 may be selected for the read operation.

FIG. 1A further illustrates reference cross-sections of the memory device 200 that are used in later figures. Cross-section B-B' is along a longitudinal axis of conductive lines 112 and in a direction, for example, parallel to the direction of current flow of the memory cells 202. Cross-section C-C' is parallel to cross-section B-B' and extends through the conductive pillars 106A, the conductive pillars 108 and the conductive pillars 106B. Cross-section D-D' is perpendicular to cross-section B-B' and extends through the conductive pillars 106A and the conductive pillars 106B. Subsequent figures refer to these reference cross-sections for clarity.

Figure 2:
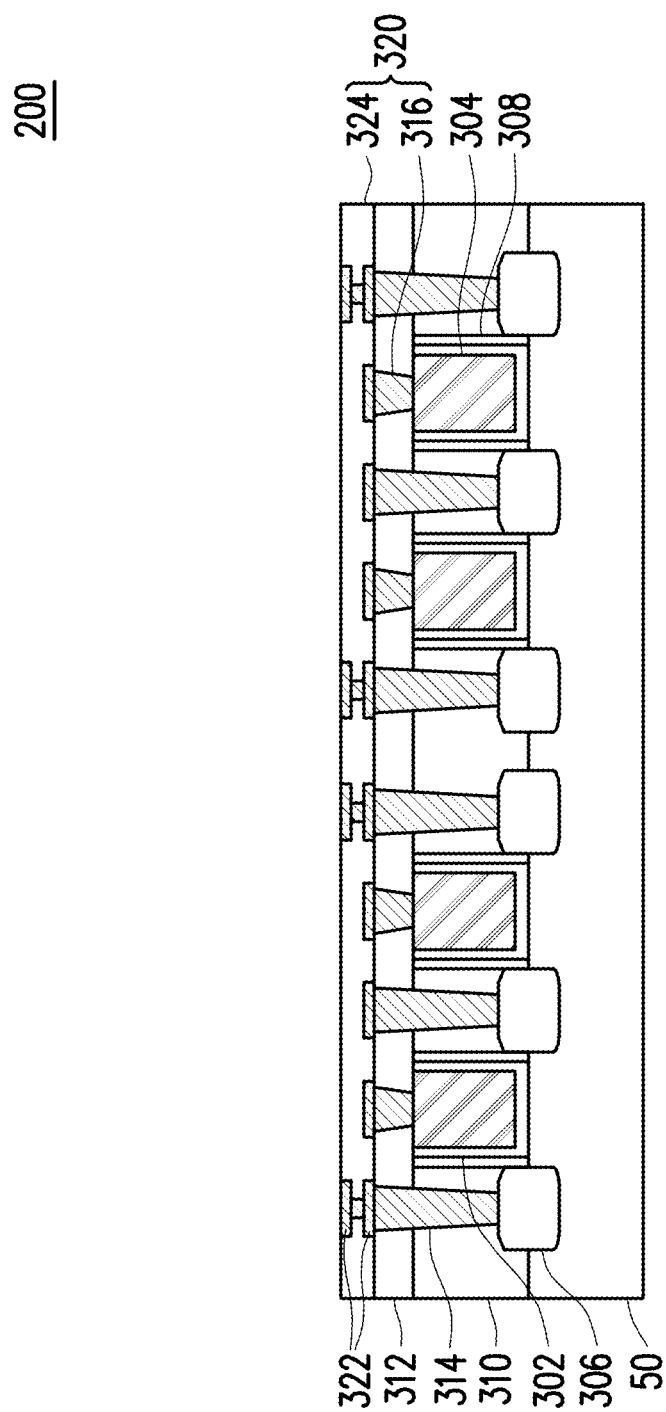

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
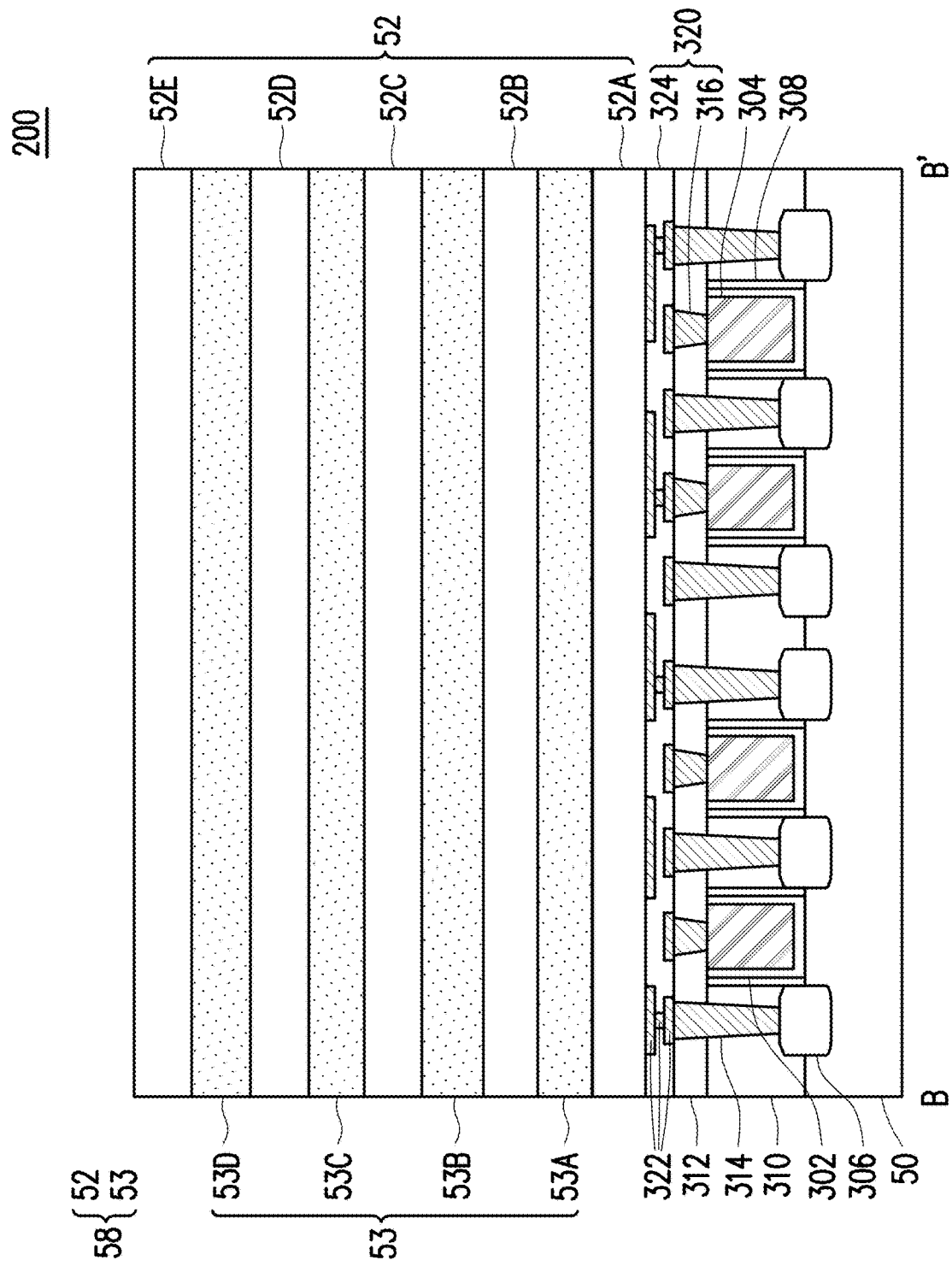

In FIG. 3, a multi-layer stack 58 is formed over the structure of FIG. 2. The substrate 50, the transistors, the ILDs 310 and 312, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulating layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory device 200 (see FIGS. 1A and 1B). In some embodiments, one or more interconnect layers including conductive features in insulating layers (e.g., low-k dielectric layers) are disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 112 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the memory device 200, in accordance with some embodiments. FIGS. 4 through 12 are illustrated along reference cross-section B-B' illustrated in FIG. 1A.

Figure 4:
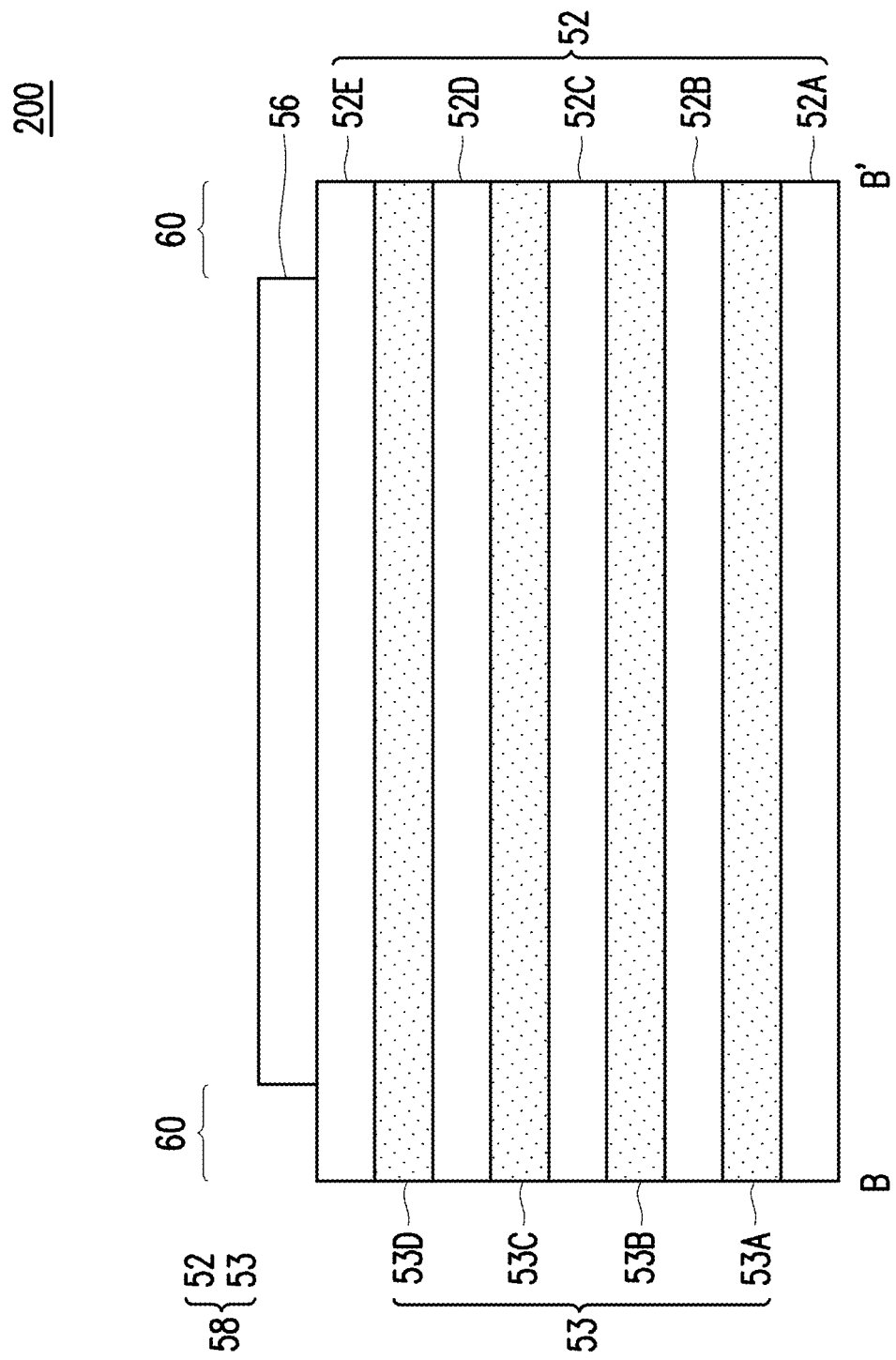

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) is exposed in the regions 60.

Figure 5:
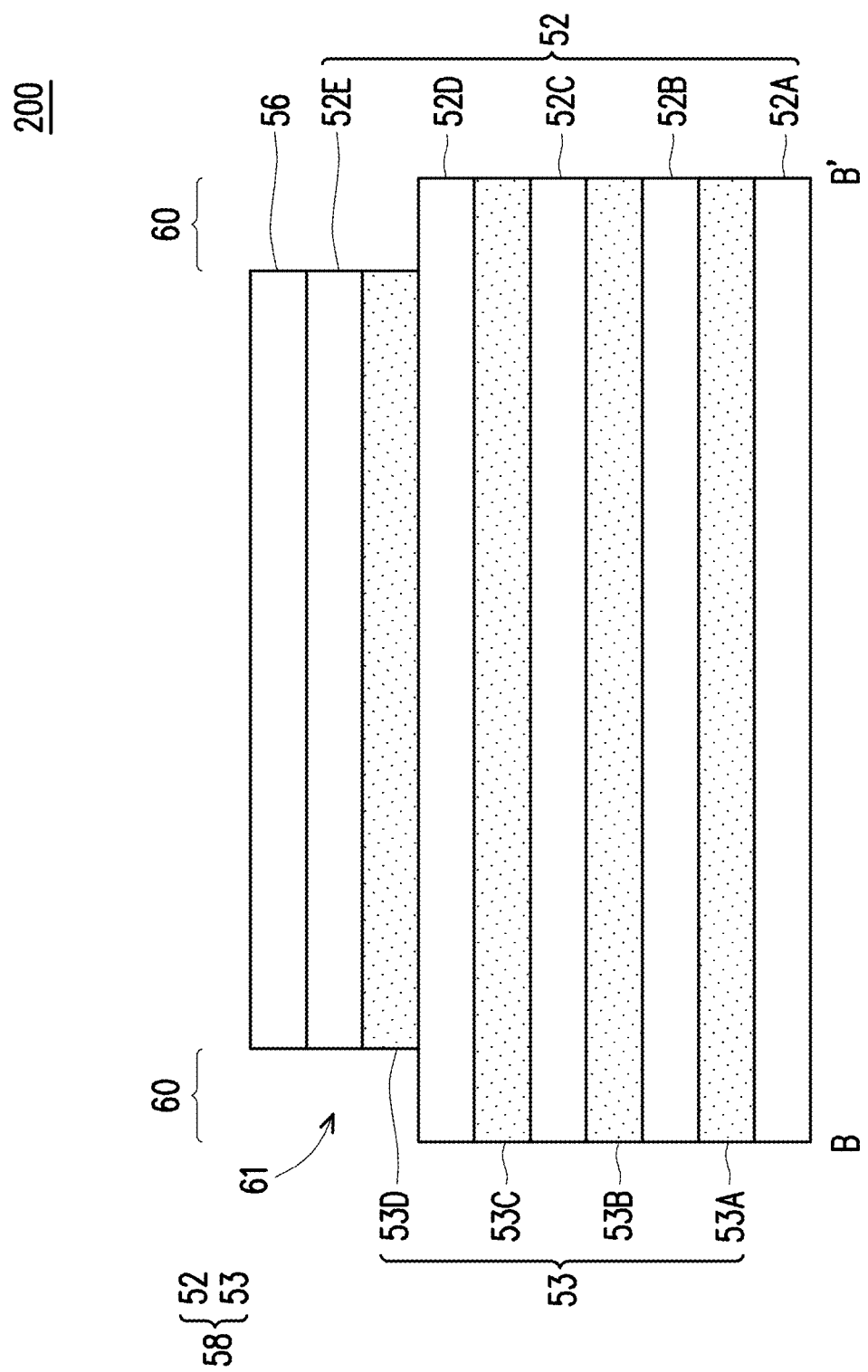

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
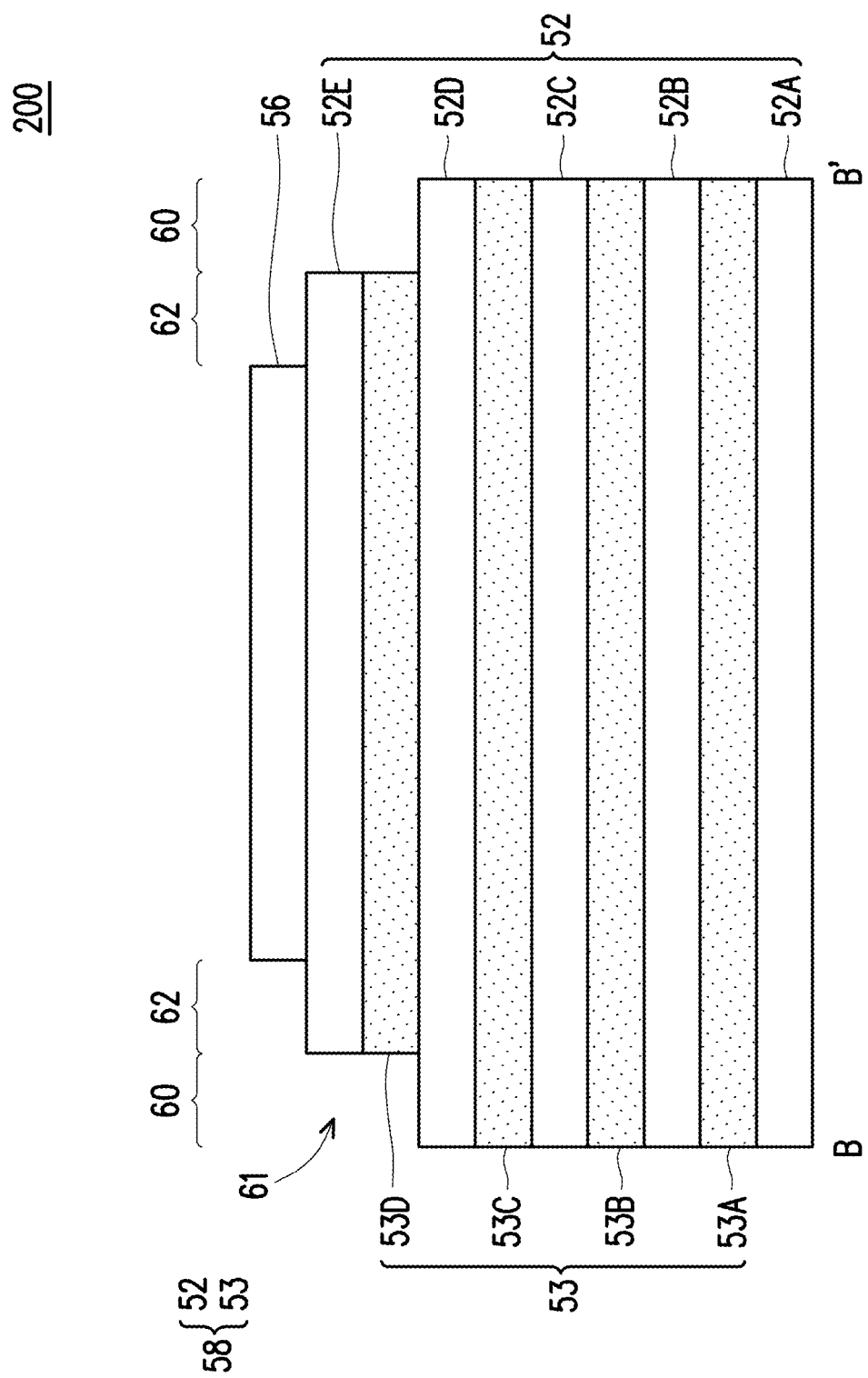

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
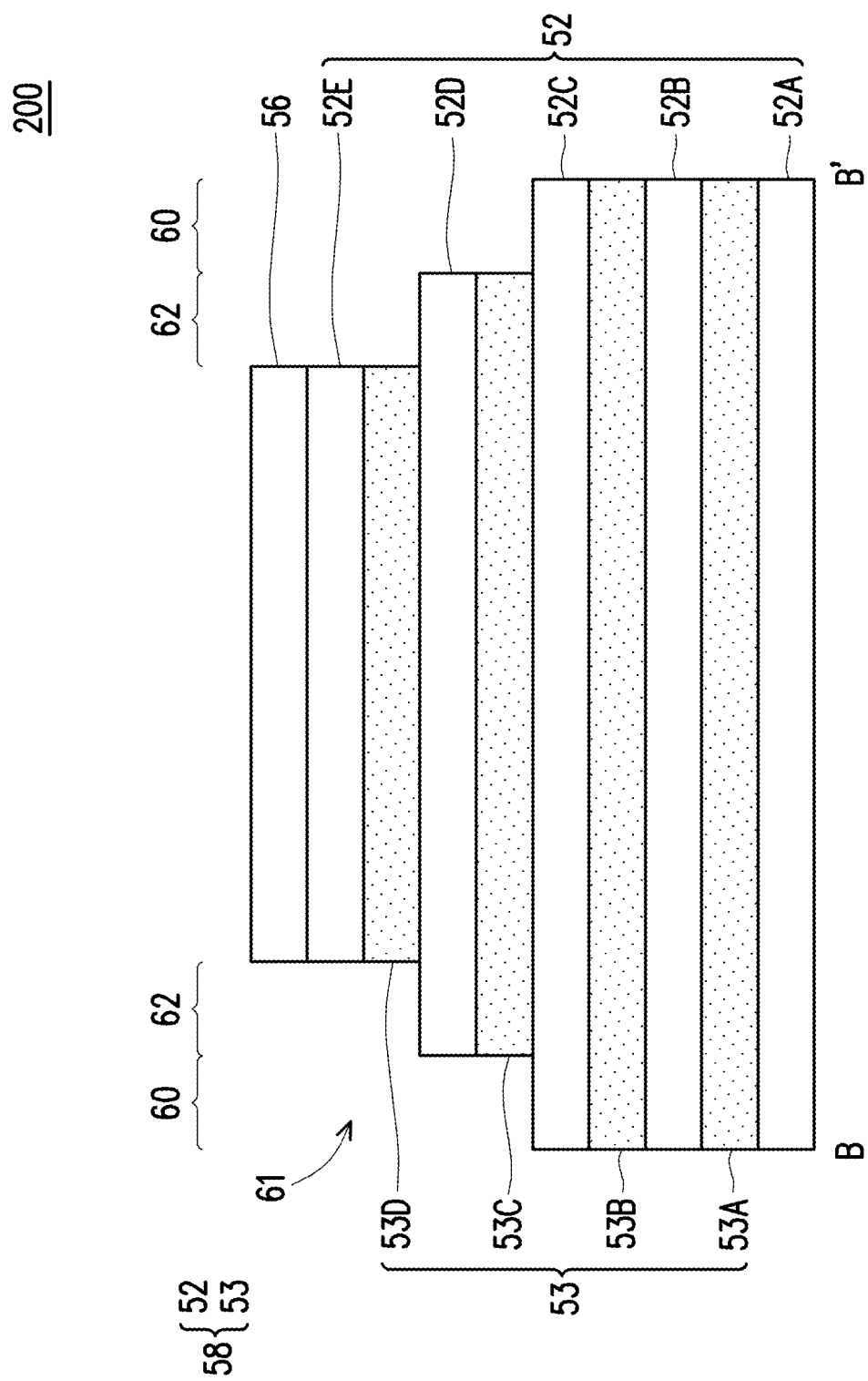

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
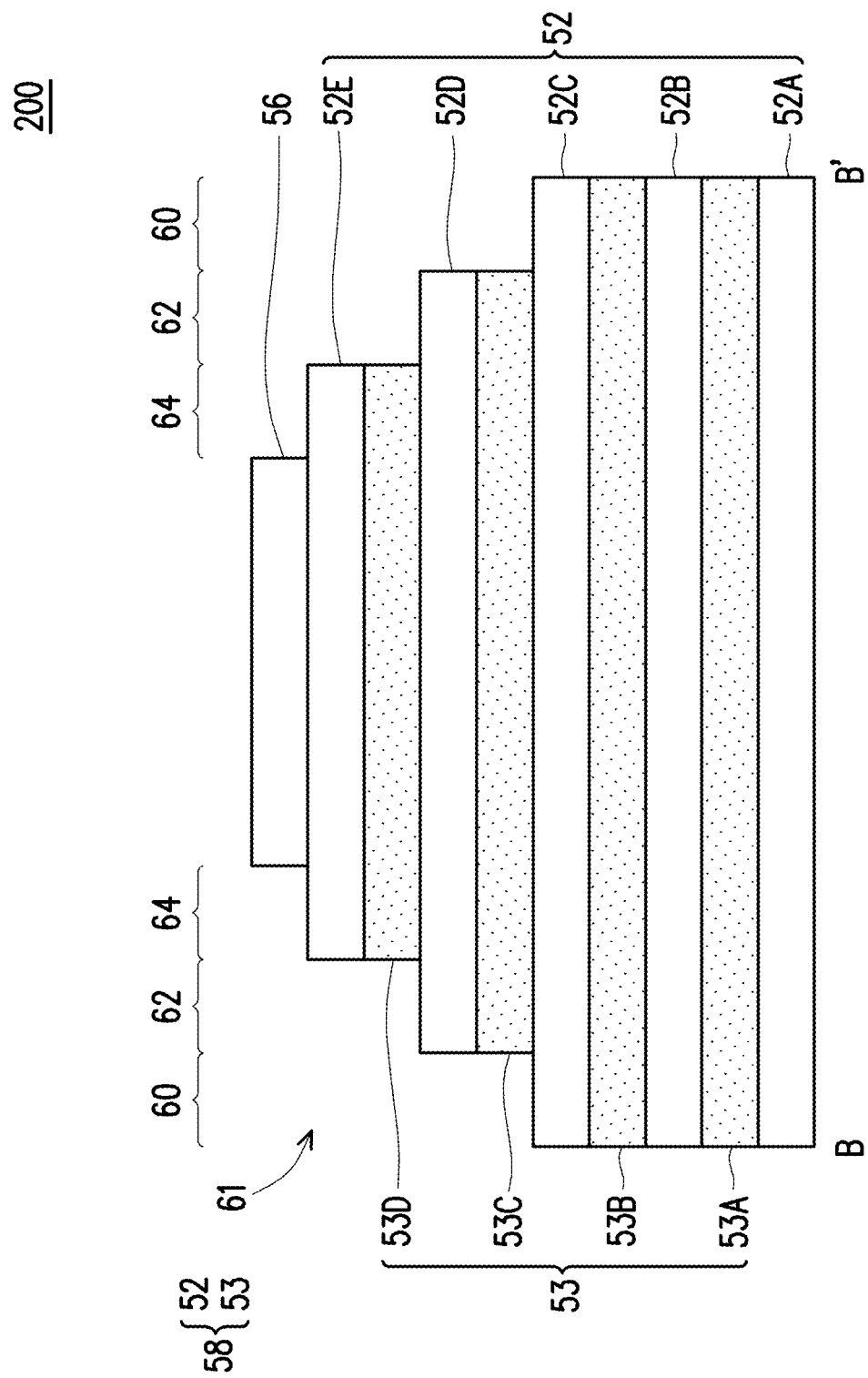

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C are exposed in the regions 60; top surfaces of the dielectric layer 52D are exposed in the regions 62; and top surfaces of the dielectric layer 52E are exposed in the regions 64.

Figure 9:
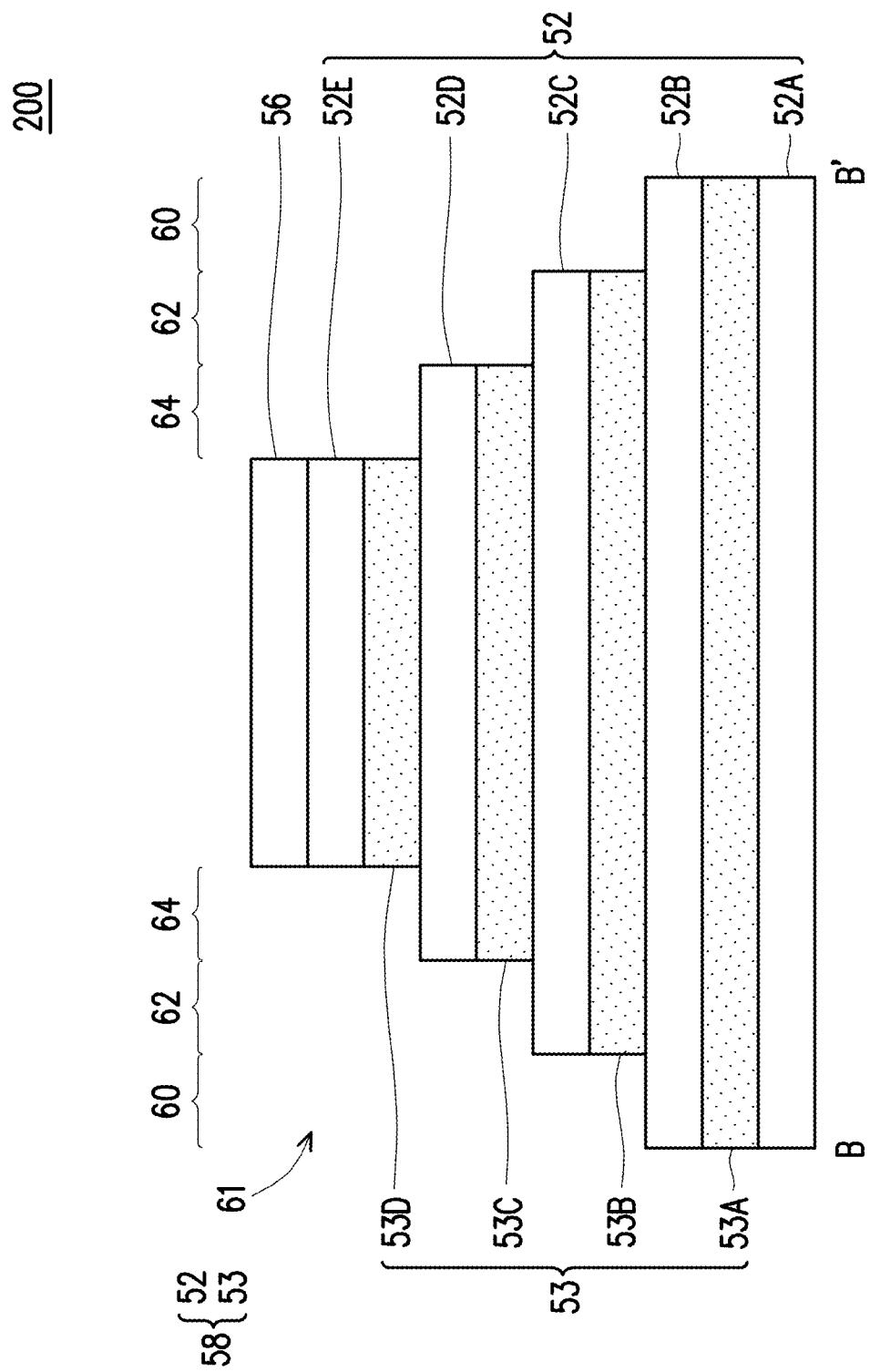

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
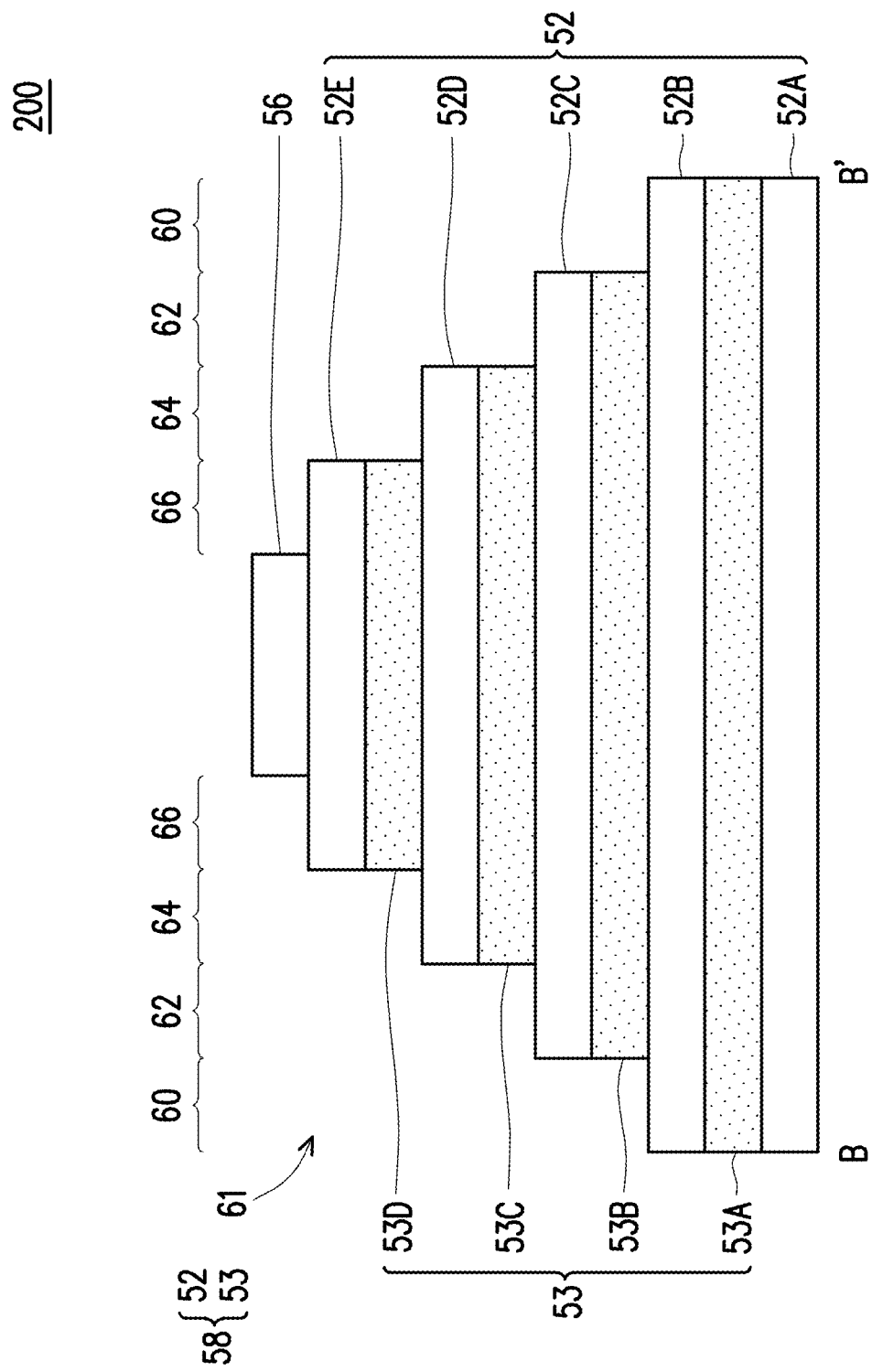

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B are exposed in the regions 60; top surfaces of the dielectric layer 52C are exposed in the regions 62; and top surfaces of the dielectric layer 52D are exposed in the regions 64; and top surfaces of the dielectric layer 52E are exposed in the regions 66.

Figure 11:
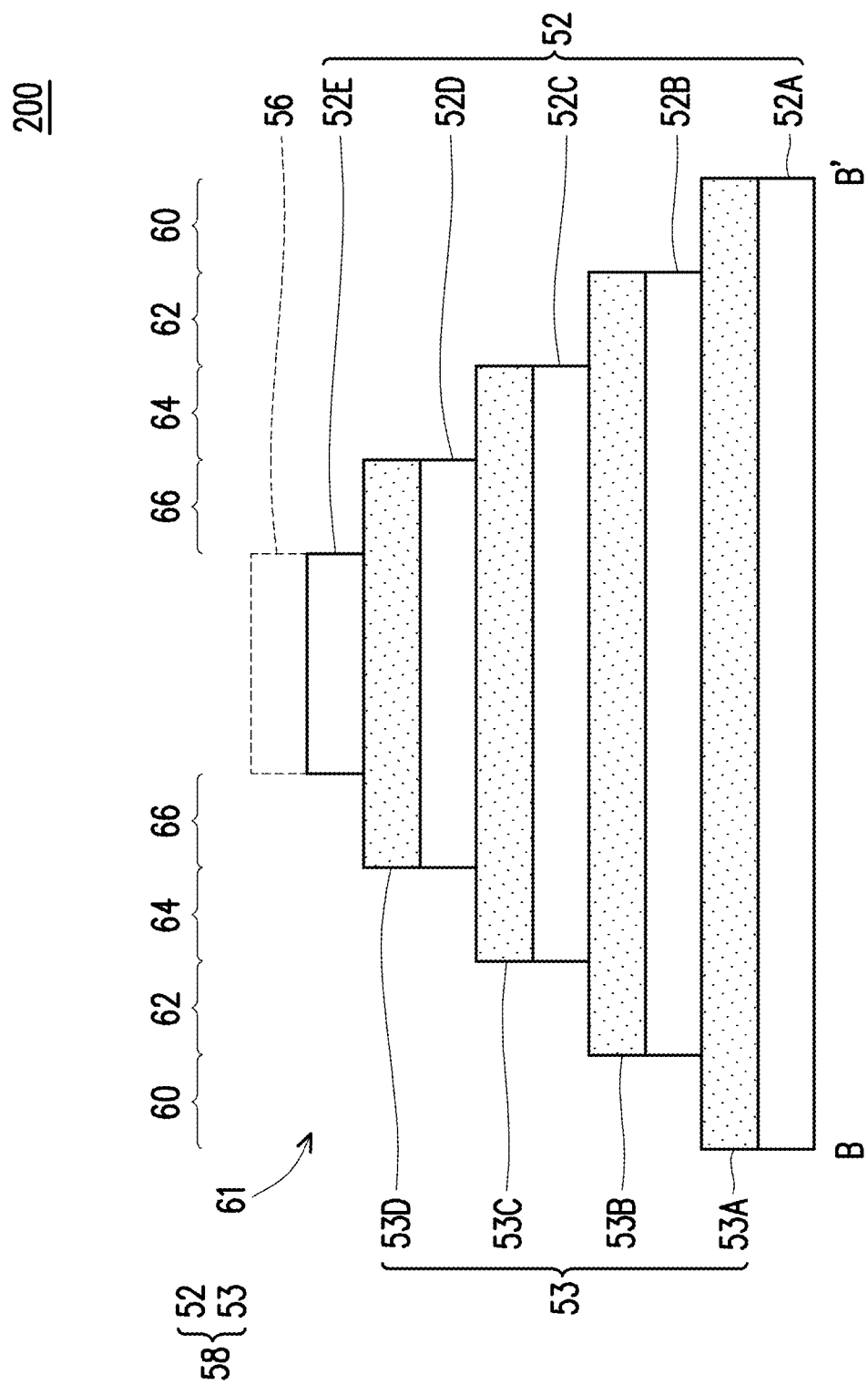

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:
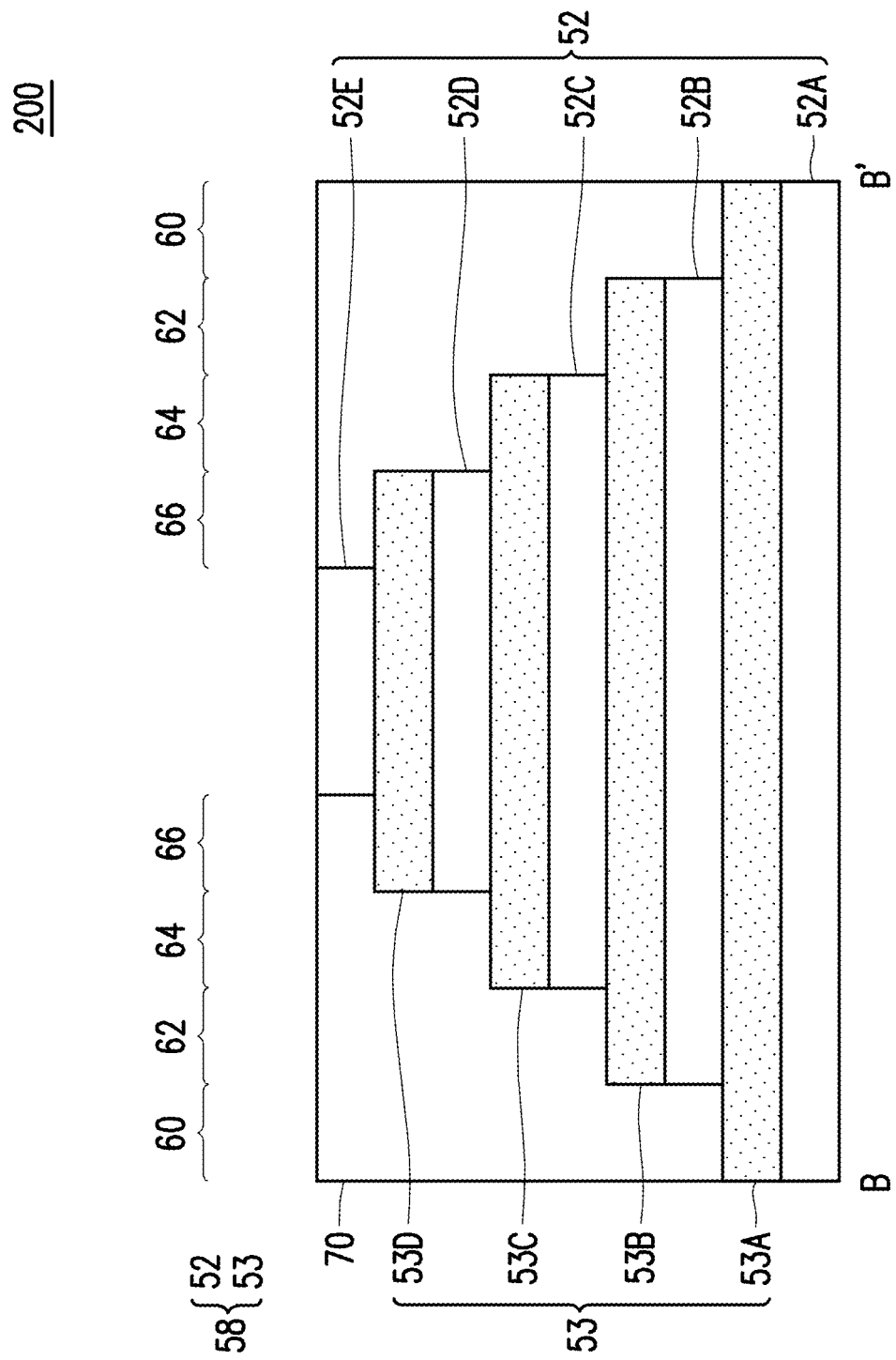

In FIG. 12, an inter-metal dielectric (IMD) 70 is formed over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 includes an oxide (e.g., silicon oxide or the like), a nitride (e.g., silicon nitride or the like), a combination thereof or the like. Other dielectric materials formed by any acceptable process may be used. Thereafter, a removal process is performed to remove excess dielectric material over the multi-layer stack 58. In some embodiments, the removal process is a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive lines 112, which will be described in details in FIGS. 24A through 26B. Lower conductive lines 112 are longer and extend laterally past upper conductive lines 112, and a width of each of the conductive lines 112 increases in a direction towards the substrate 50 (see FIGS. 1A and 27D).

FIGS. 13A through 16B are views of intermediate stages in the manufacturing of a memory region and a channel region of the memory device 200, in accordance with some embodiments. In FIGS. 13A through 14B, the bulk multi-layer stack 58 is patterned to form trenches 100 therethrough. FIGS. 13A, 14A, 15A and 16A illustrate top-down views. FIGS. 13B, 14B, 15B and 16B are illustrated along reference cross-section C-C' illustrated in FIGS. 13A, 14A, 15A and 16A (also along reference cross-section C-C' illustrated in FIG. 1A).

Figure 13A:
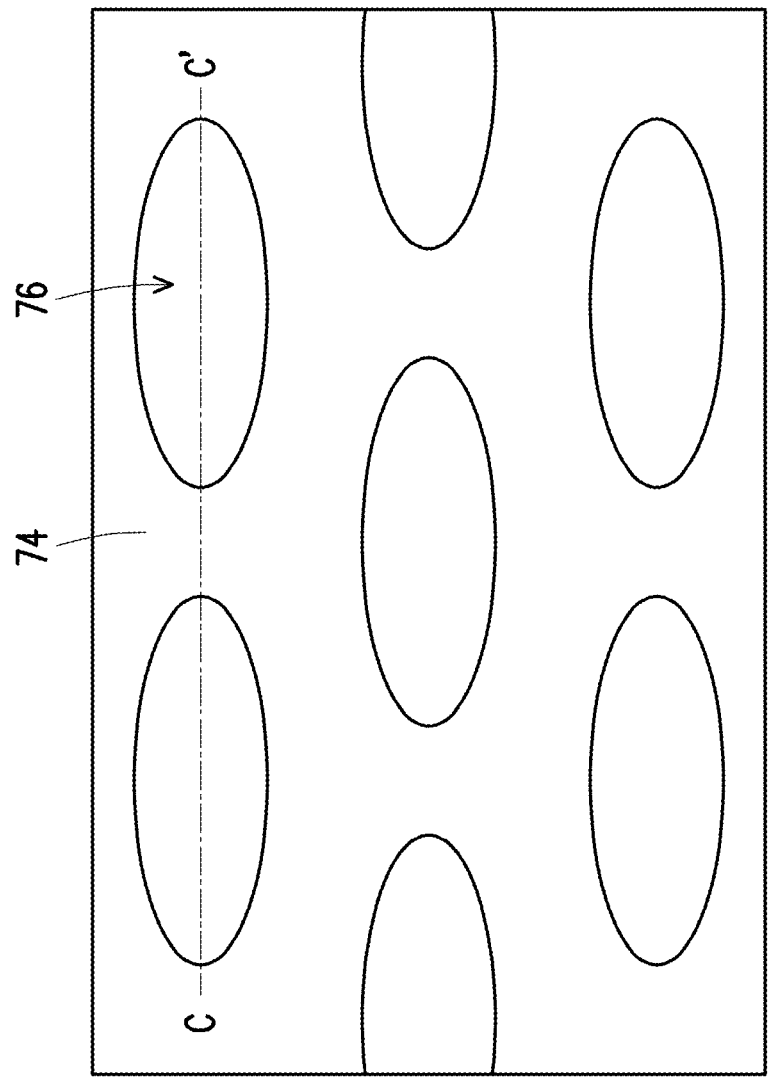
Figure 13B:
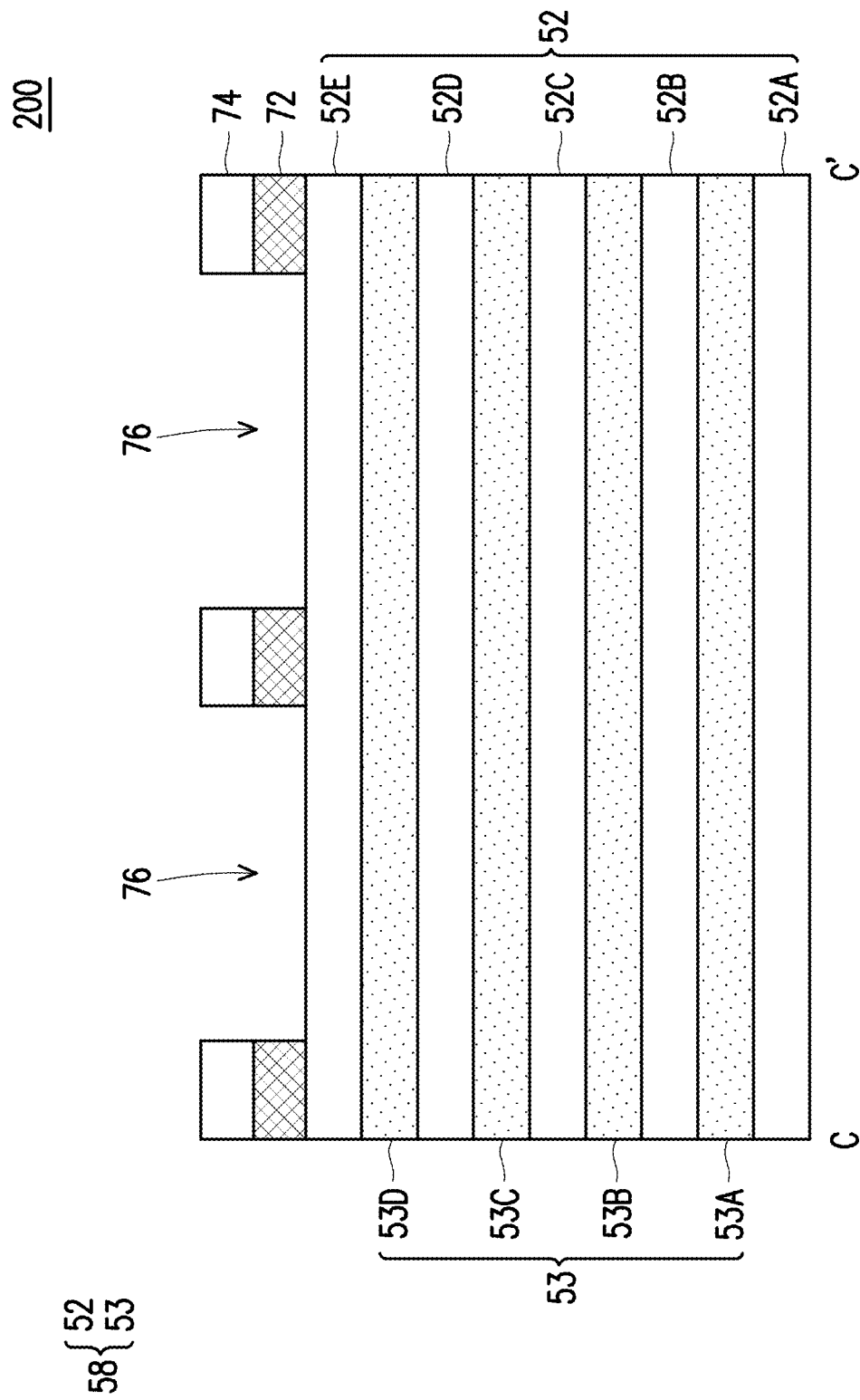

In FIGS. 13A and 13B, photoresist patterns 74 and underlying hard mask patterns 72 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 74 and trenches 76 between the photoresist patterns 74. The photoresist is patterned by an acceptable photolithography technique, for example. The trenches 76 may be any shape such as an oval-like shape, a triangle-like shape, a rectangle-like shape and a polygon-like shape. The patterns of the photoresist patterns 74 are then transferred to the hard mask layer to form hard mask patterns 72 by using an acceptable etching process, such as by a dry etch (e.g., RIE, NBE, the like), a wet etch, the like, or a combination thereof. The etching may be anisotropic. Thus, trenches 76 are formed extending through the hard mask layer. Thereafter, the photoresist patterns 74 may be optionally removed by an ashing process.

Figure 14A:
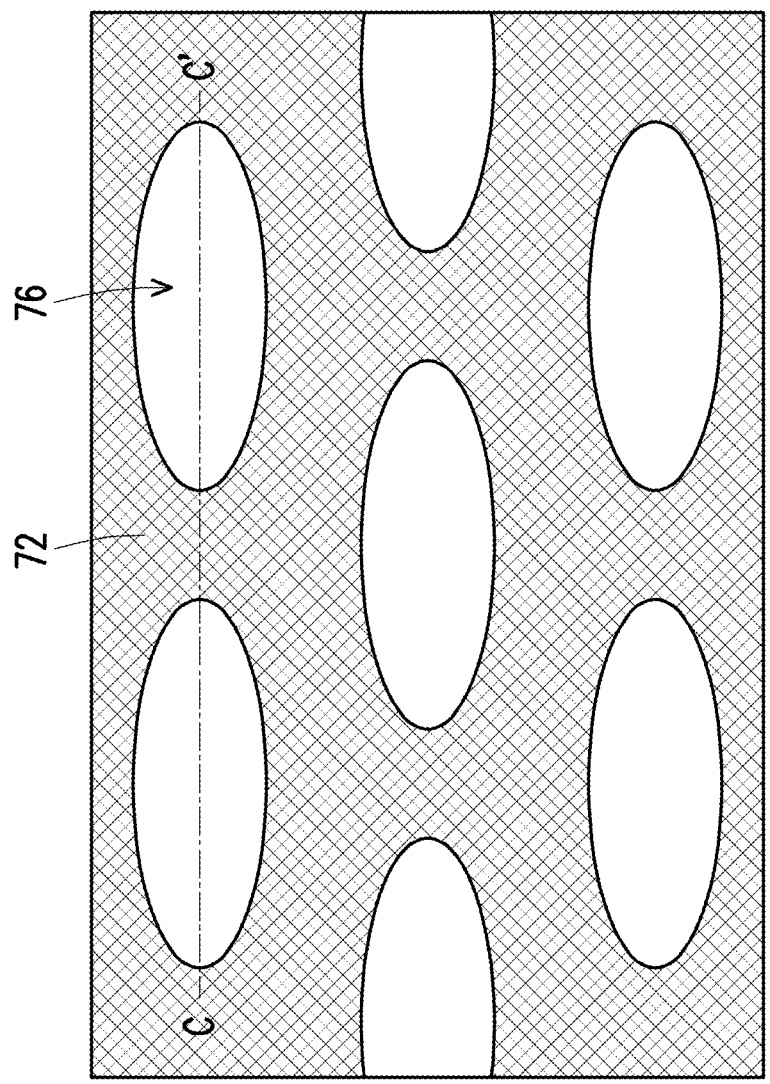
Figure 14B:
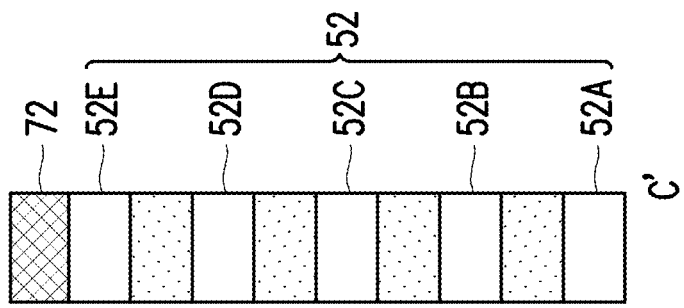
Figure 14B:
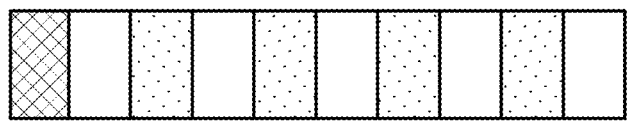
Figure 14B:
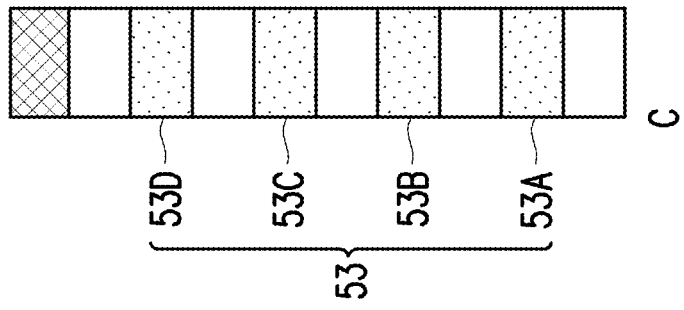

In FIGS. 14A and 14B, the patterns of the hard mask patterns 72 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 76 extend through the bulk multi-layer stack 58. The hard mask patterns 72 may be then removed by an acceptable process, such as a wet etching process, a dry etching process, a planarization process, combinations thereof, or the like.

Figure 15A:
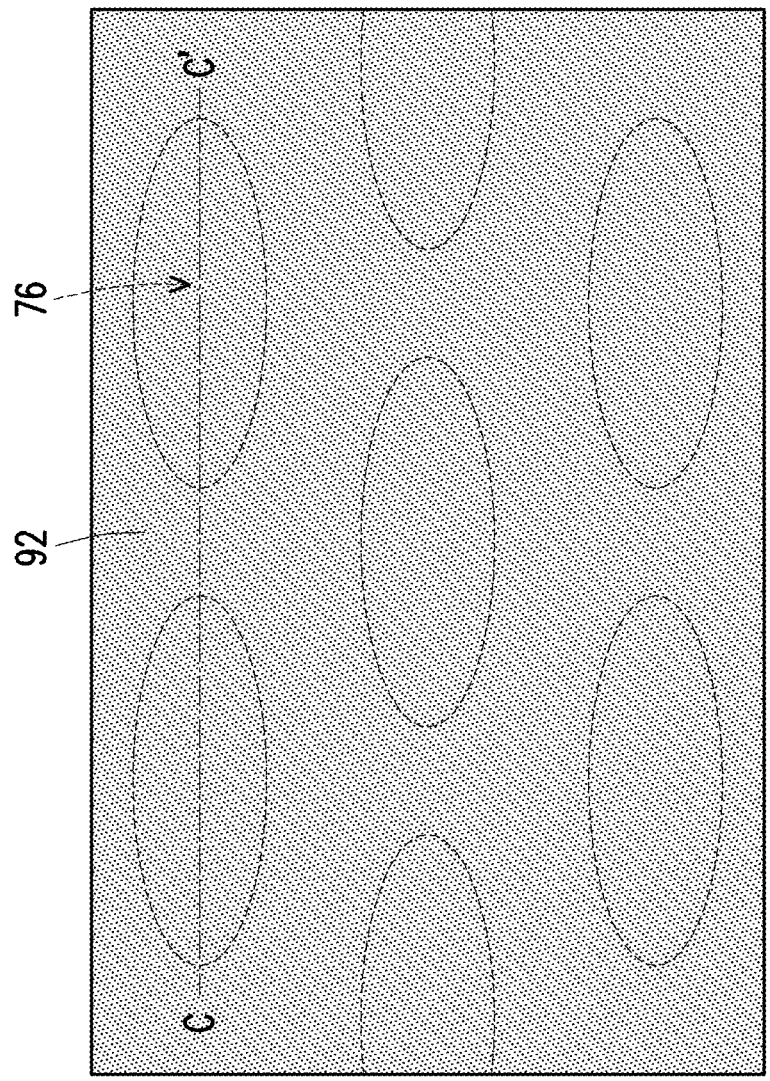
Figure 15B:
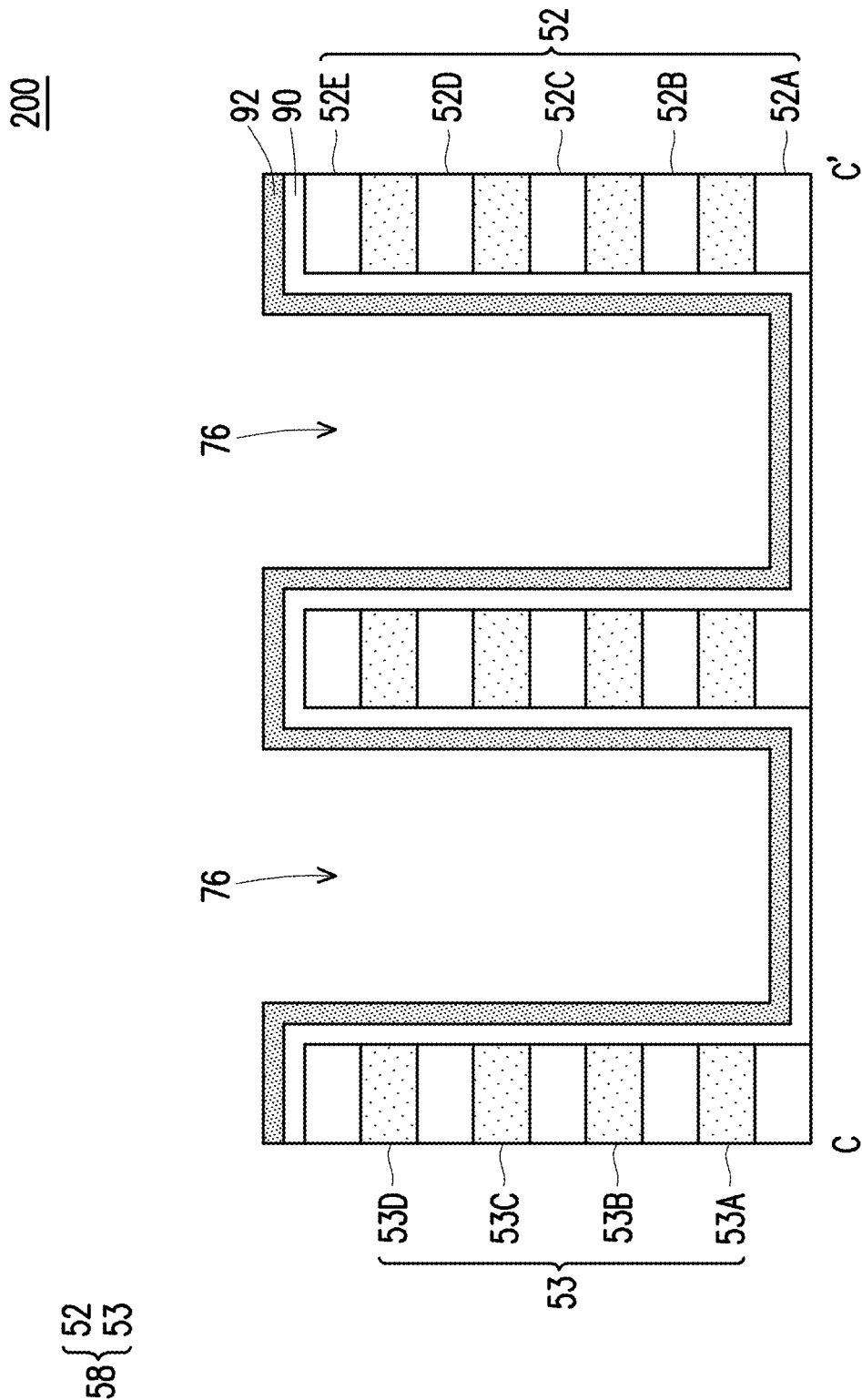

In FIGS. 15A and 15B, a memory material layer 90 may be deposited conformally in the trenches 76 along sidewalls and bottom surfaces of the trenches 76. The memory material layer 90 may include a material that is capable of switching between two different polarization directions by applying an appropriate voltage differential across the memory material layer 90. For example, the memory material layer 90 includes a high-k dielectric material, such as a hafnium (Hf) based dielectric materials or the like. In some embodiments, the memory material layer 90 includes hafnium oxide, hafnium zirconium oxide, silicon-doped hafnium oxide, or the like.

In some embodiments, the memory material layer 90 includes barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or a combination thereof, or the like. In some embodiments, the memory material layer 90 include different ferroelectric materials or different types of memory materials. For example, the memory material layer 90 is replaced with a non-ferroelectric material, such as a multilayer memory structure comprising a layer of $SiN_x$ between two $SiO_x$ layers (e.g., an ONO structure). In some embodiments, the method of forming the memory material layer 90 includes performing a suitable deposition technique, such as CVD, PECVD, metal oxide chemical vapor deposition (MOCVD), ALD, RPALD, PEALD, MBD or the like.

In some embodiments, the memory material layer 90 has a thickness of about 1-50 nm, such as 5-10 nm. Other thickness ranges (e.g., more than 20 nm or 5-15 nm) may be applicable. In some embodiments, the memory material layer 90 is formed in a fully amorphous state. In alternative embodiments, the memory material layer 90 is formed in a partially crystalline state; that is, the memory material layer 90 is formed in a mixed crystalline-amorphous state and having some degree of structural order. In yet alternative embodiments, the memory material layer 90 is formed in a fully crystalline state. In some embodiments, the memory material layer 90 is a single layer. In alternative embodiments, the memory material layer 90 is a multi-layer structure.

After the memory material layer 90 is deposited, an annealing step may be performed, so as to achieve a desired crystalline lattice structure for the memory material layer 90.

In some embodiments, upon the annealing process, the memory material layer 90 is transformed from an amorphous state to a partially or fully crystalline state. In alternative embodiments, upon the annealing memory material layer 90 is transformed from a partially crystalline state to a fully crystalline state.

Then, a channel layer 92 is conformally deposited in the trenches 76 over the memory material layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, the channel layer 92 includes polycrystalline silicon (poly-Si), amorphous silicon (a-Si), or the like. The channel layer 92 may be deposited by CVD, PVD, ALD, PECVD, or the like. The channel layer 92 may extend along the sidewalls and the bottom surfaces of the trenches 76 over the memory material layer 90. After the channel layer 92 is deposited, an annealing step may be performed to activate the charge carriers of the channel layer 92.

Figure 16A:
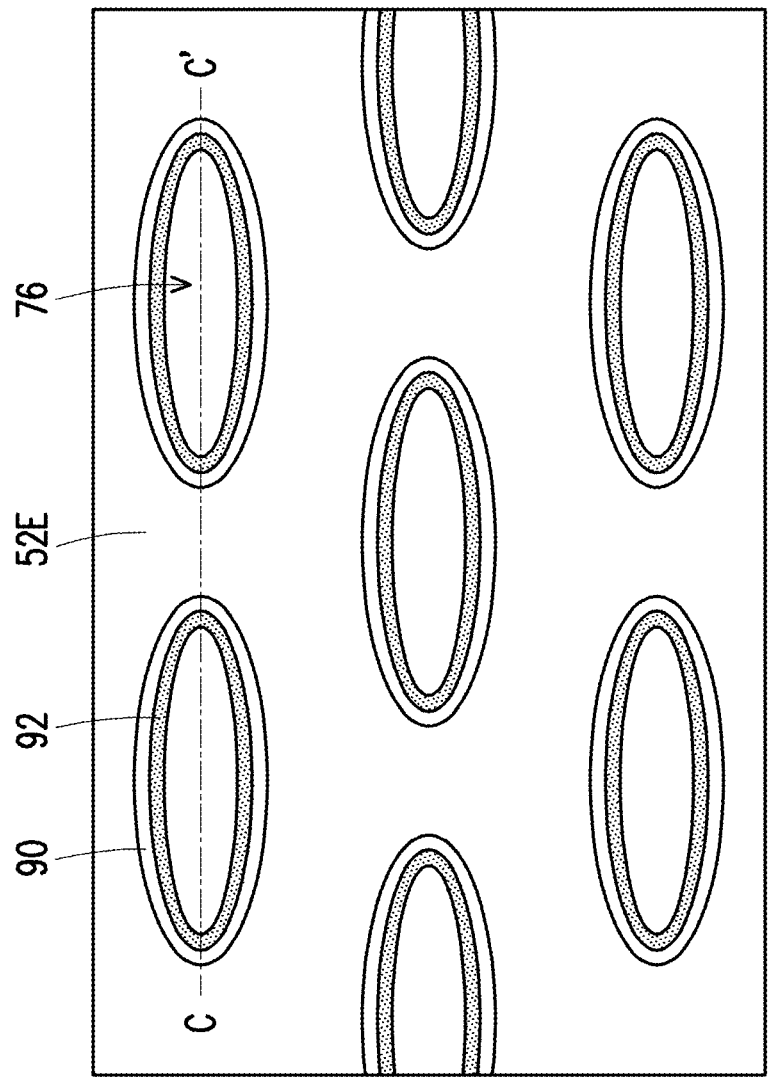
Figure 16B:
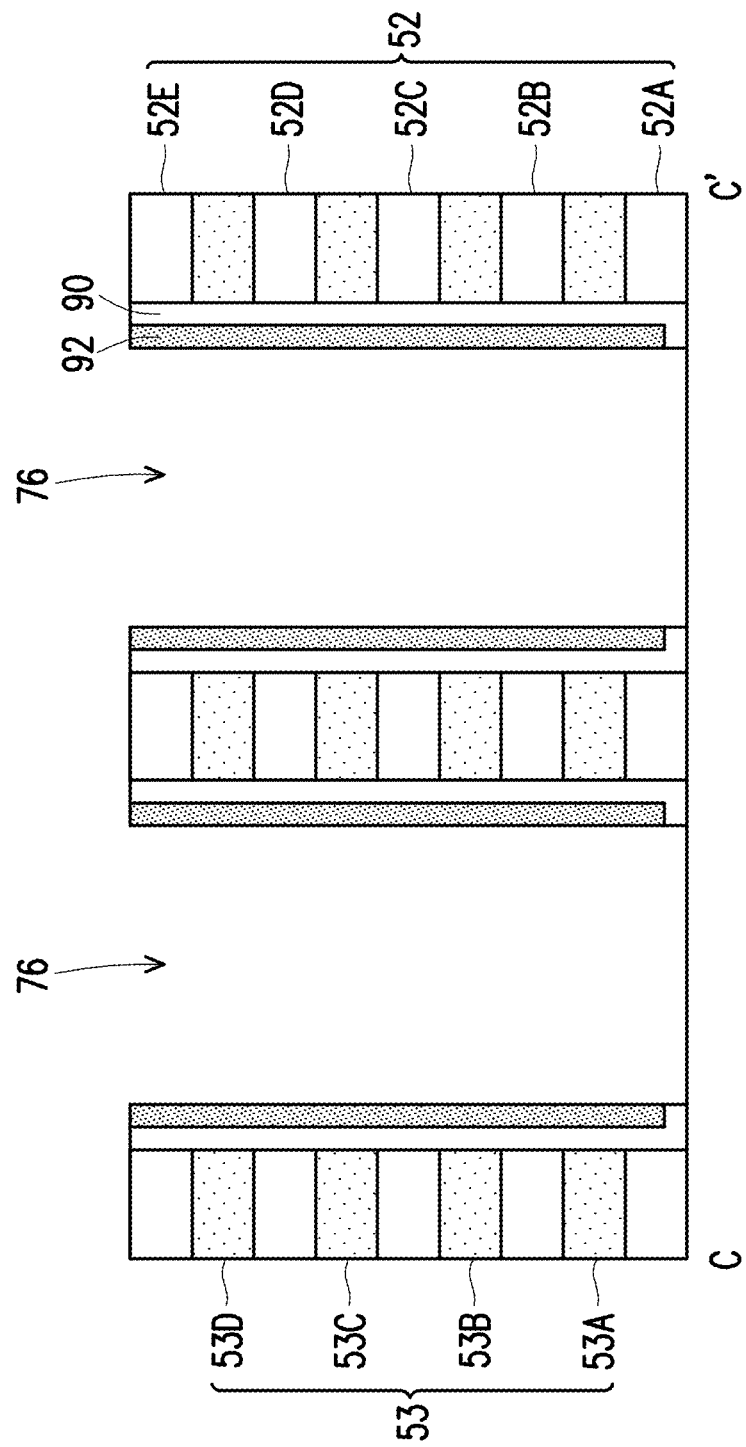

In FIGS. 16A and 16B, bottom portions of the memory material layer 90 and the channel layer 92 are removed in the trenches 76. In some embodiments, top portions of the memory material layer 90 and the channel layer 92 are also removed from the multi-layer stack 58. The removal process includes an acceptable etching process, such as a dry etch (e.g., RIE, NBE, the like), a wet etch, the like, or a combination thereof. The etching may be anisotropic. For example, the removal process is a blanket etch. In some embodiments, as shown in FIG. 16A, the memory material layer 90 and the channel layer 92 are ring-shaped. From a top view, the memory material layer 90 and the channel layer 92 may be any shape such as an oval-like shape, a triangle-like shape, a rectangle-like shape and a polygon-like shape according to the shape of the trench 76. In some embodiments, bottom inner sidewalls of the channel layer 92 and the memory material layer 90 are substantially flush with each other.

FIGS. 17A through 22B illustrate intermediate steps of manufacturing conductive pillars 106A, 106B and 108 (e.g., source/drain pillars) in the memory device 200. The conductive pillars 106A, 106B and 108 may extend along a direction perpendicular to the conductive lines 112 such that individual cells of the memory device 200 may be selected for read and write operations. FIGS. 17A, 18A, 19A, 20A, 21A and 22A illustrate top-down views. FIGS. 17B, 18B, 19B, 20B, 21B and 22B are illustrated along reference cross-section C-C' illustrated in FIGS. 17A, 18A, 19A, 20A, 21A and 22A (also along reference cross-section C-C' illustrated in FIG. 1A).

Figure 17A:
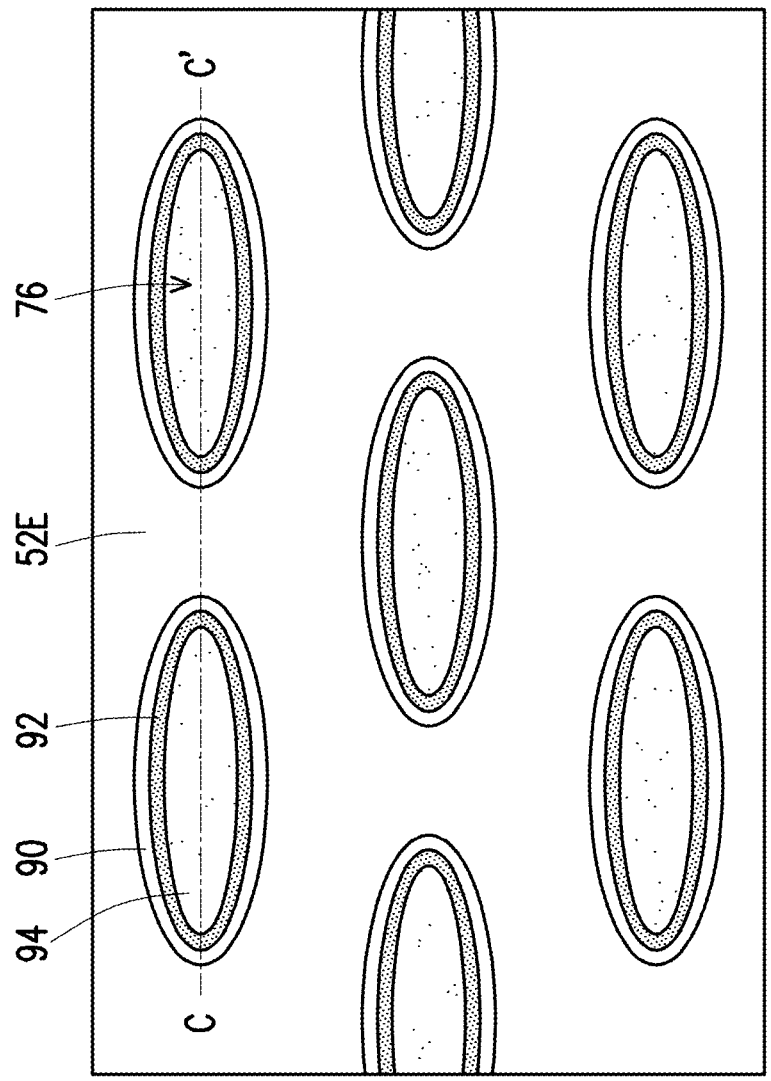
Figure 17B:
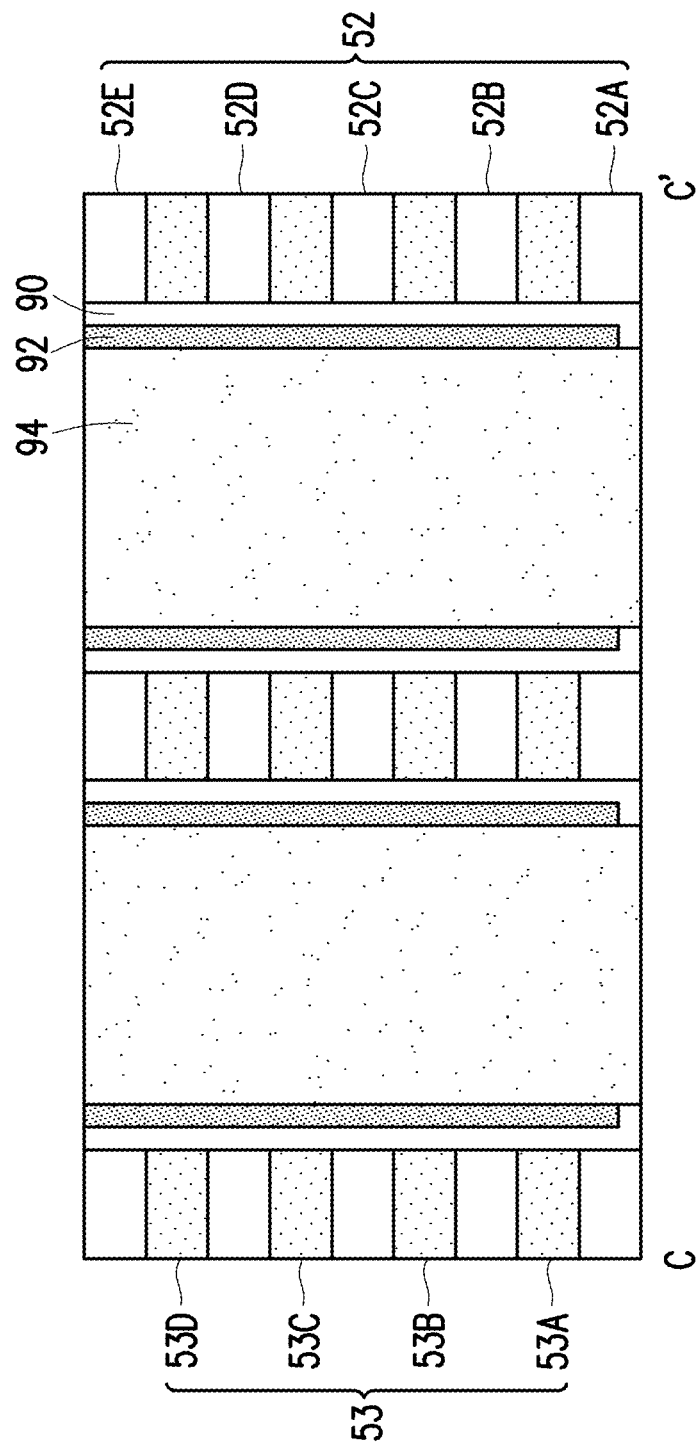

In FIGS. 17A and 17B, a sacrificial layer 94 is deposited in the trenches 76 over the channel layer 92. The sacrificial layer 94 may be patterned and replaced in subsequent steps to define the conductive pillars 106A (e.g., electrically connected to bit lines), the conductive pillars 108 (e.g., electrically connected to source lines) and the conductive pillars 106B (e.g., electrically connected to bit lines). In some embodiments, the sacrificial layer 94 includes SiN, Si, polymer, spin-on-carbon, or the like, which is easily removed by a dry etch process or a wet etch process and has etching selectivity with respect to the dielectric pillars 102 (which may include silicon oxide, silicon nitride, silicon oxynitride, silicon carbide, aluminum oxide, or the like), or the like, which is deposited by CVD, PVD, ALD, PECVD, or the like. The sacrificial layer 94 may extend along the sidewalls and the bottom surfaces of the trenches 76 over the channel layer 92.

Figure 18A:
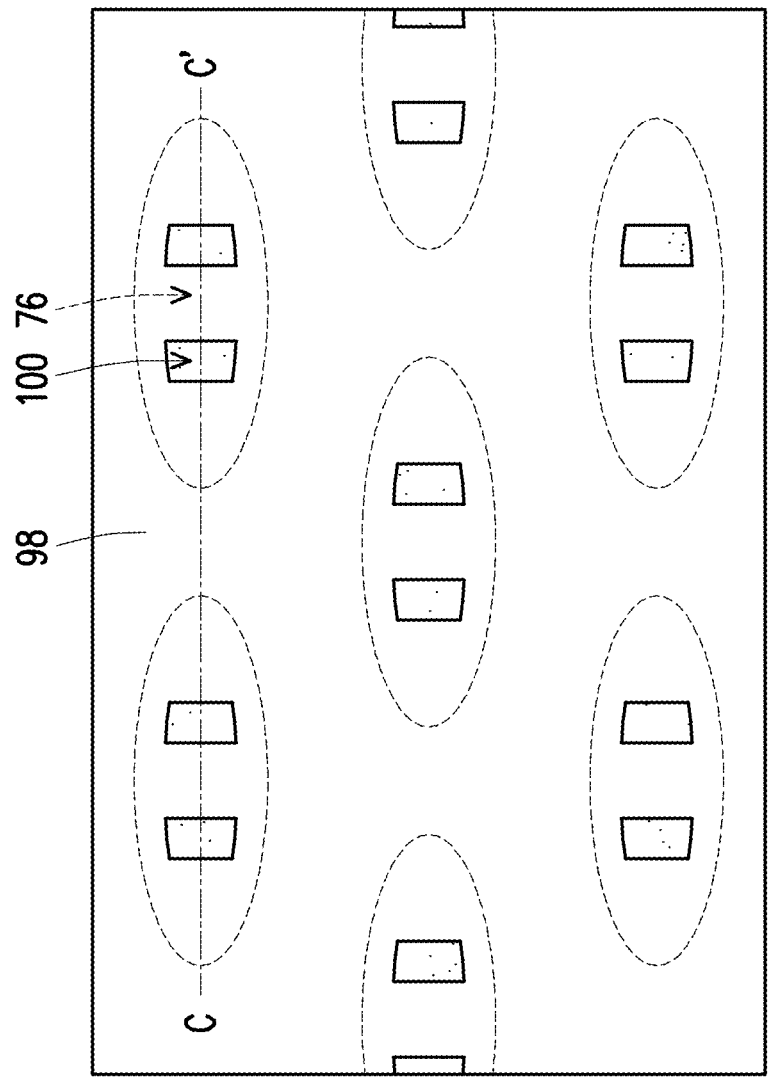
Figure 18B:
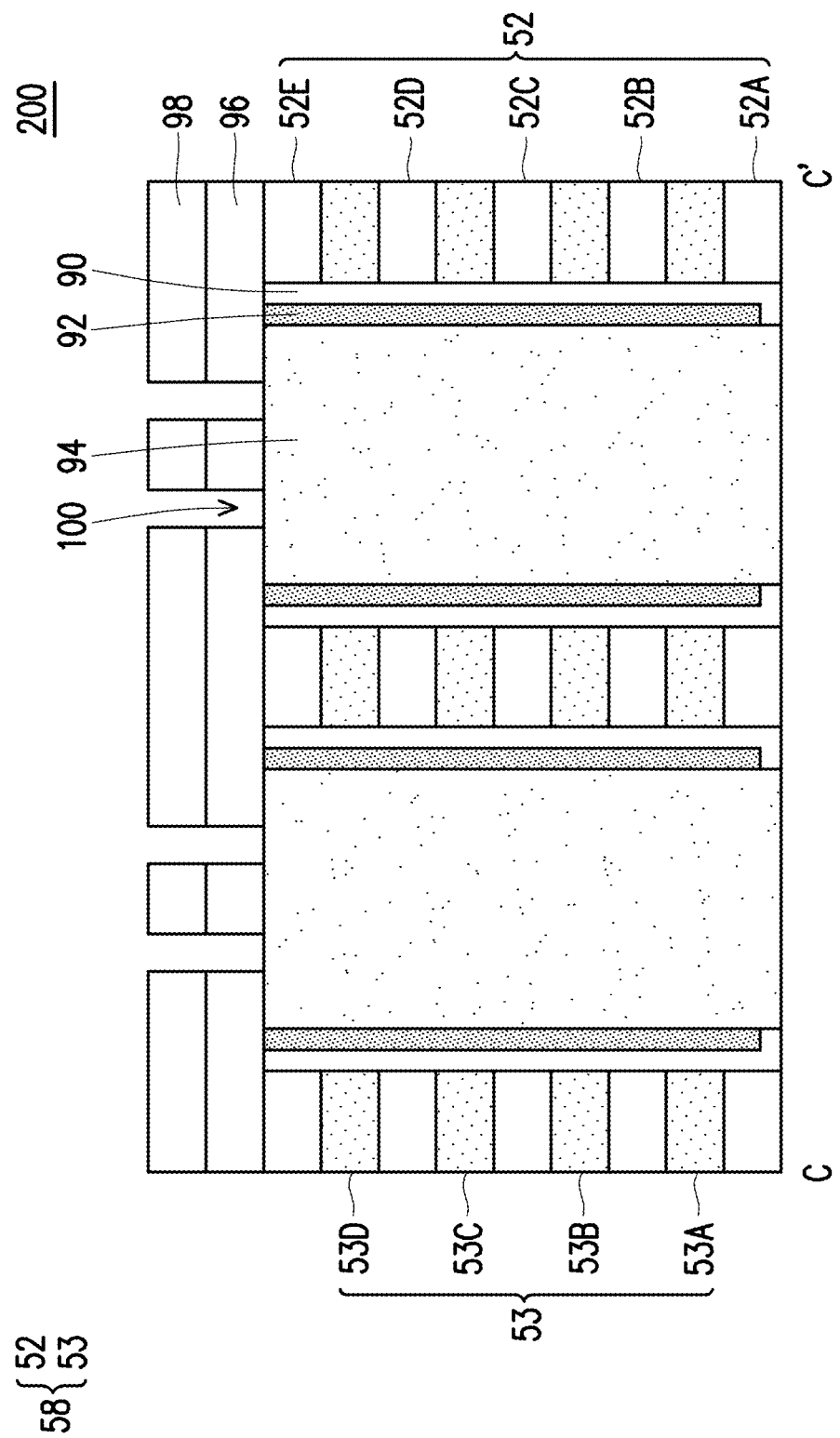

In FIGS. 18A and 18B, photoresist patterns 98 and underlying hard mask patterns 96 are formed over the multi-layer stack 58, the sacrificial layer 94, the channel layer 92, and the memory material layer 90. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 98 and trenches 100 between the photoresist patterns 98. The photoresist is patterned by an acceptable photolithography technique, for example. The patterns of the photoresist patterns 98 are then transferred to the hard mask layer to form hard mask patterns 96 by using an acceptable etching process, such as by a dry etch (e.g., RIE, NBE, the like), a wet etch, the like, or a combination thereof. The etching may be anisotropic. Thus, trenches 100 are formed extending through the hard mask layer. Thereafter, the photoresist patterns 98 may be optionally removed by an ashing process.

Figure 19A:
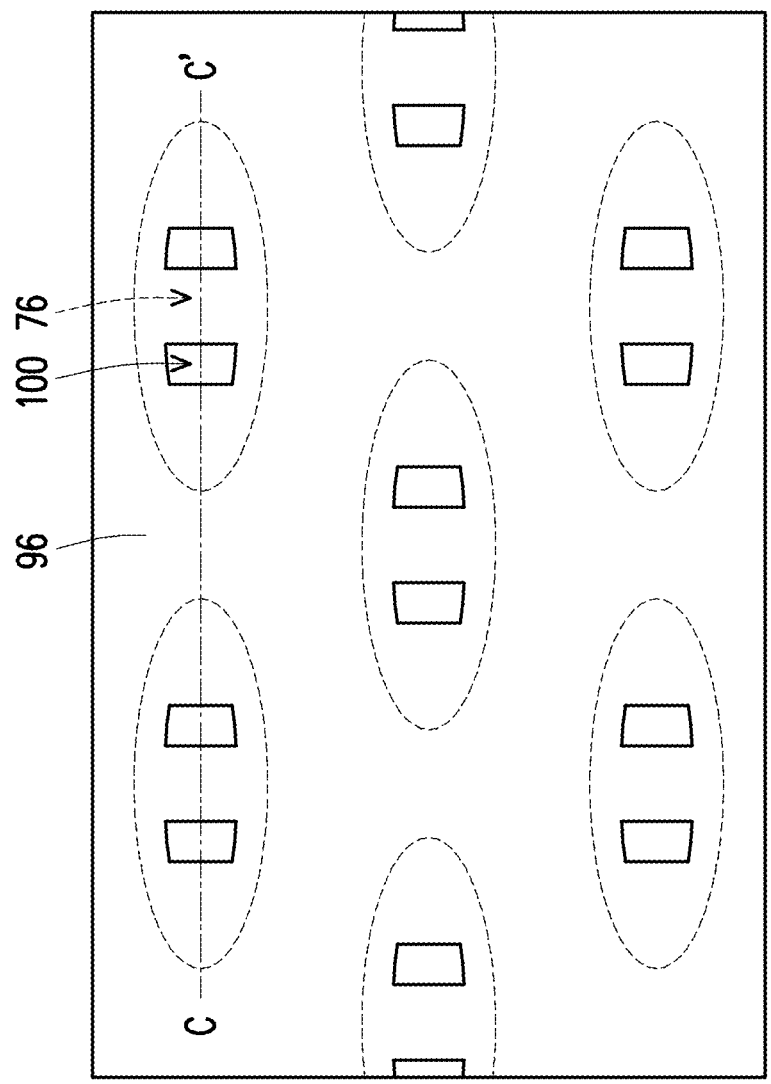
Figure 19B:
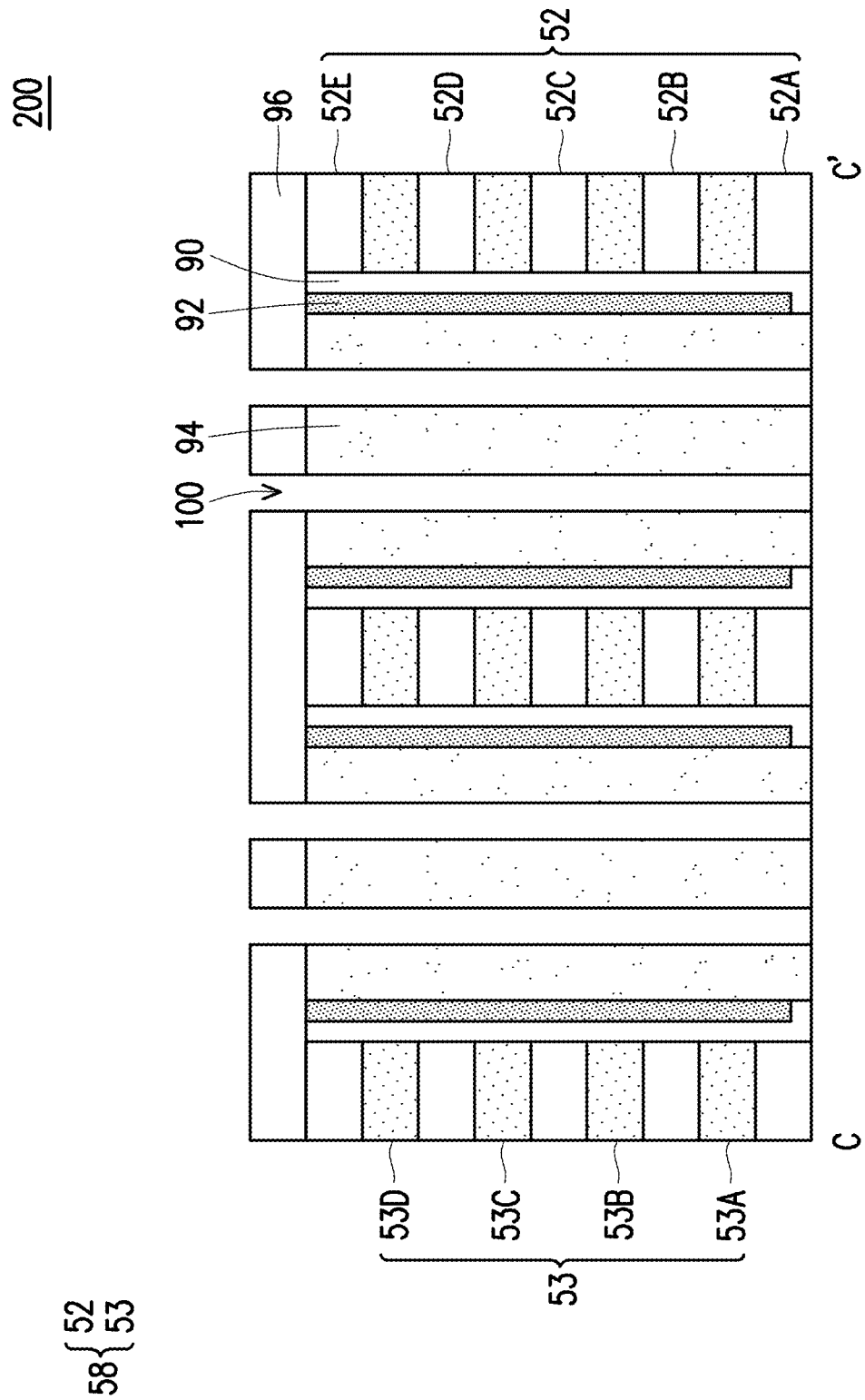

In FIGS. 19A and 19B, the patterns of the hard mask patterns 96 are transferred to the sacrificial layer 94 using one or more acceptable etching processes, such as by a dry etch (e.g., RIE, NBE, the like), a wet etch, the like, or a combination thereof. The etching processes may be anisotropic. Thus, the trenches 100 extend through the sacrificial layer 94 are accordingly defined.

Figure 20A:
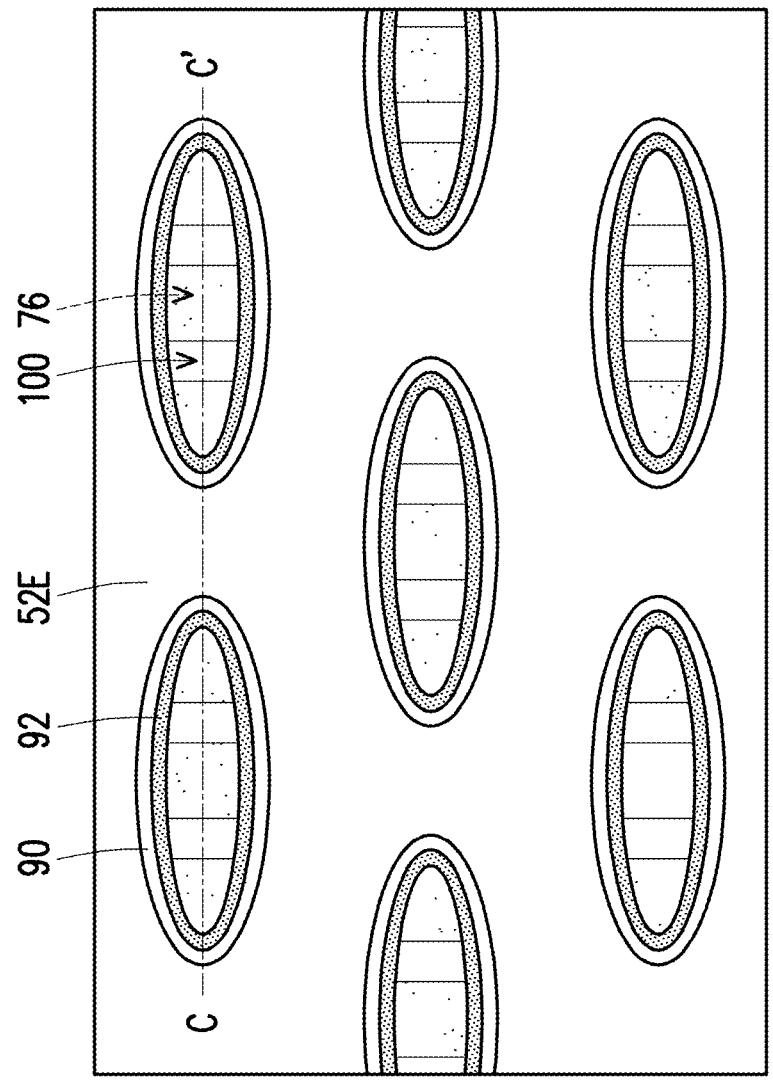
Figure 20B:
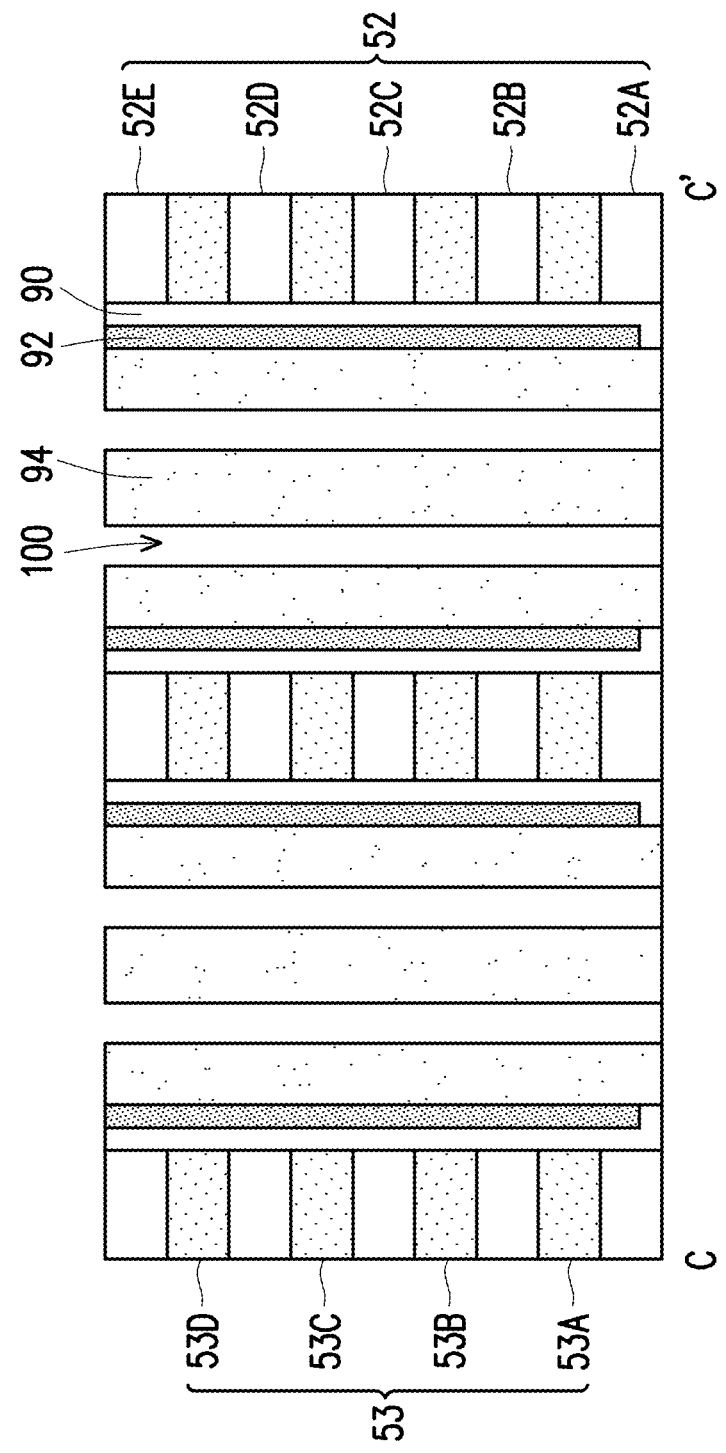

In FIGS. 20A and 20B, the hard mask patterns 96 are removed. The hard mask patterns 96 may be removed by an acceptable process, such as a wet etching process, a dry etching process, a planarization process, combinations thereof, or the like. Although three trenches 100 are illustrated, any number of trenches 100 may be formed as required.

Figure 21A:
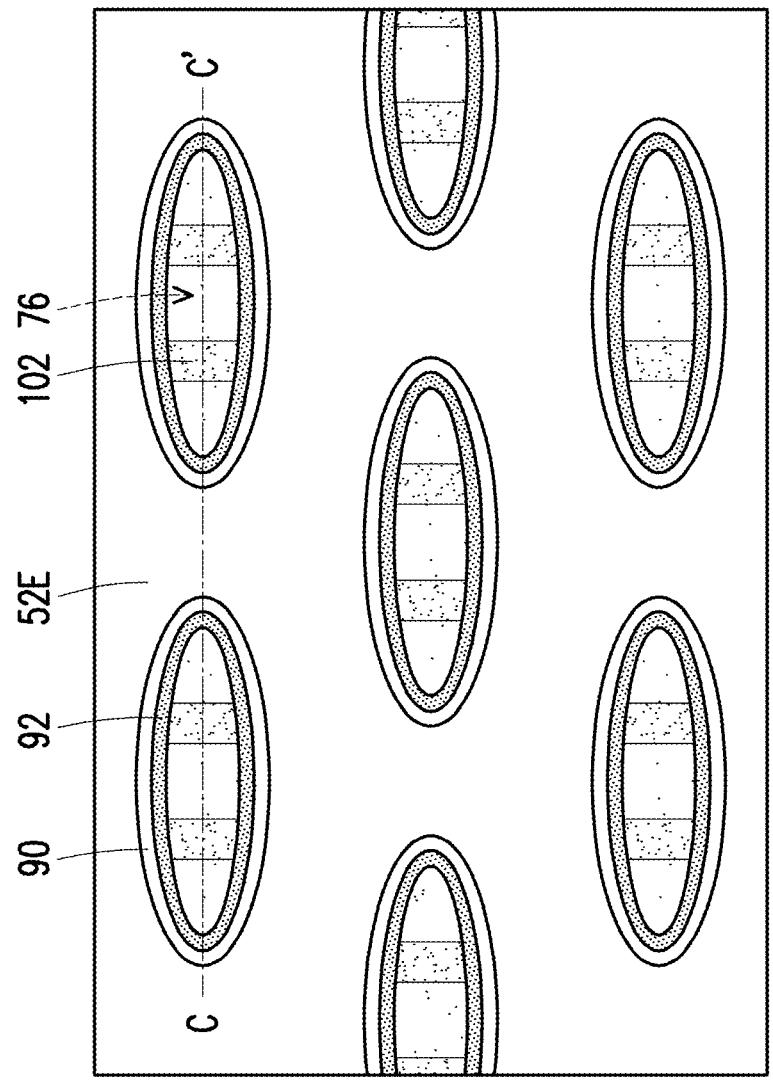
Figure 21B:
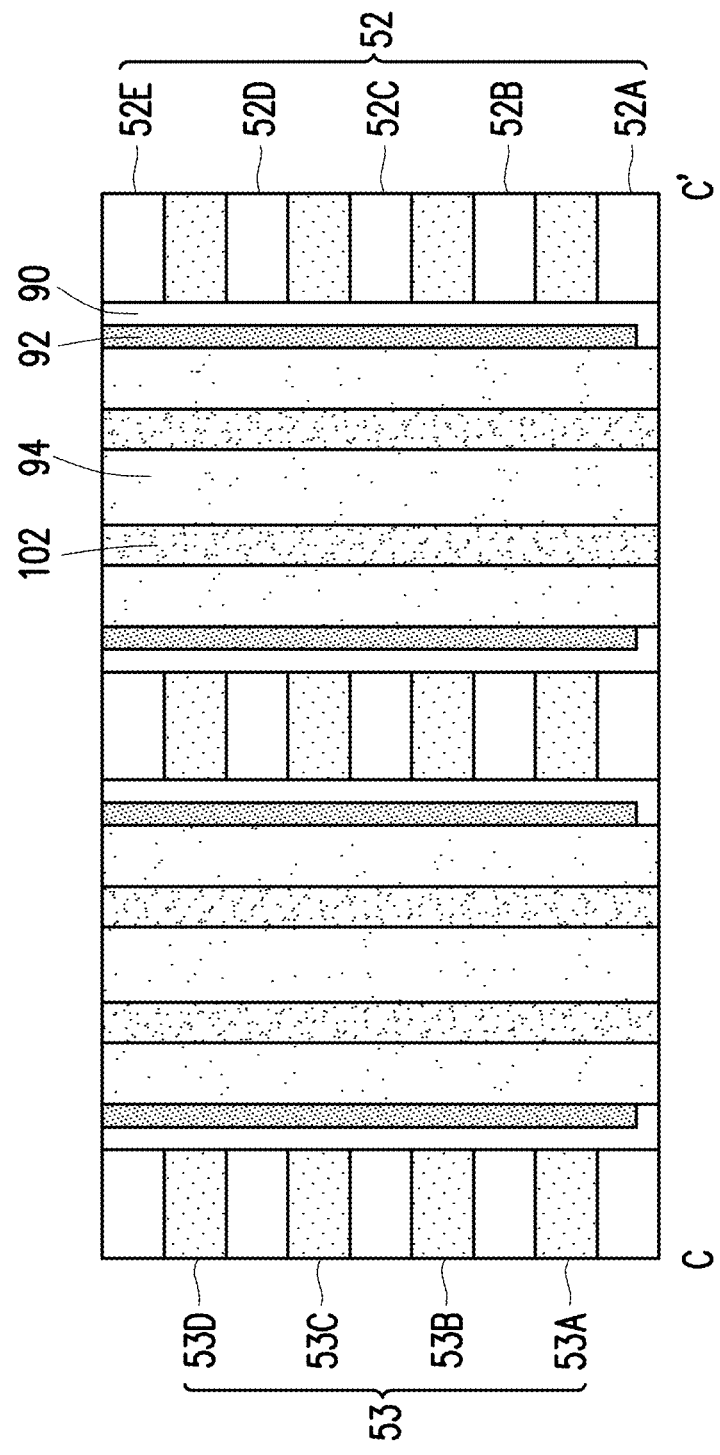

In FIGS. 21A and 21B, dielectric pillars 102 are formed in the trenches 100. In some embodiments, a dielectric layer is deposited over the multi-layer stack 58 filling in the trenches 100. The dielectric layer may include silicon oxide, silicon nitride, silicon oxynitride, silicon carbide, aluminum oxide, or the like, which is deposited by CVD, PVD, ALD, PECVD, or the like. After deposition, a planarization process (e.g., a CMP, etch back, or the like) may be performed to remove excess portions of the dielectric layer. Then, the dielectric pillars 102 are formed. In the resulting structure, top surfaces of the multi-layer stack 58 (e.g., dielectric layer 52E), the memory material layer 90, the channel layer 92, the sacrificial layer 94, the dielectric pillars 102 may be substantially level (e.g., within process variations). In some embodiments, materials of the sacrificial layer 94 and the dielectric pillars 102 are selected so that they are etched selectively relative each other, and materials of the sacrificial layers 53 and the dielectric pillars 102 are selected so that they are etched selectively relative each other. For example, the sacrificial layer 94 and the sacrificial layers 53 include nitride and the dielectric pillars 102 include oxide. Other materials are also possible. The sacrificial layer 94 and the sacrificial layers 53 may include different materials.

Figure 22A:
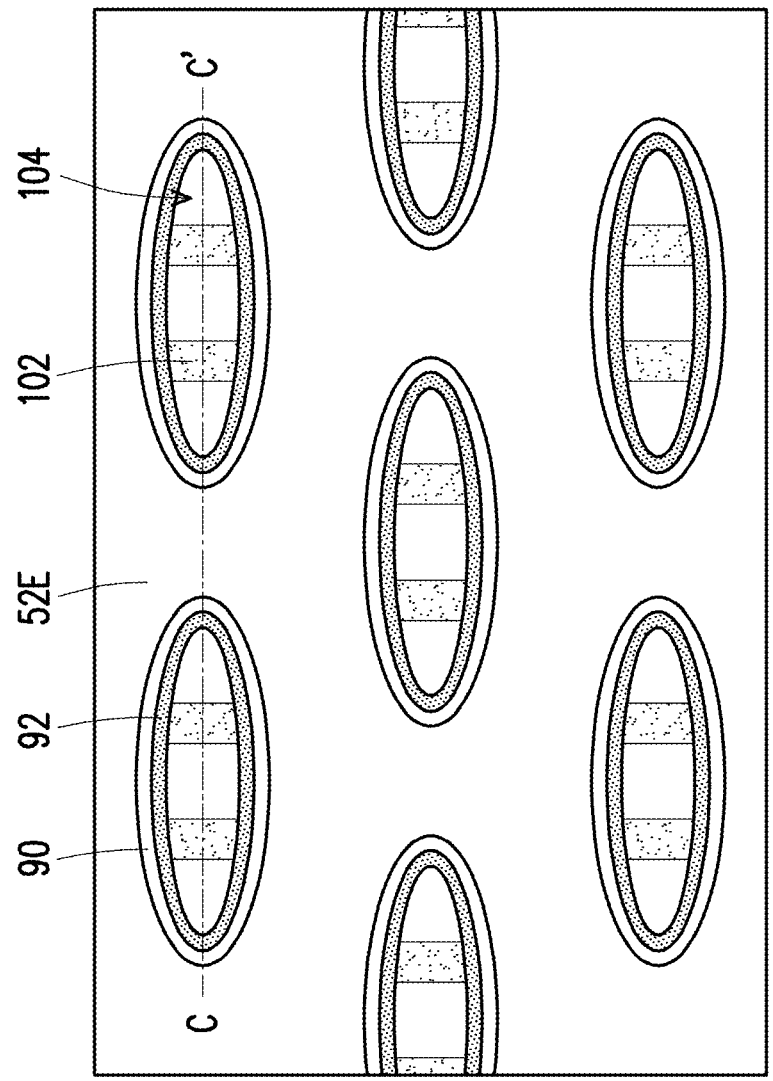
Figure 22B:
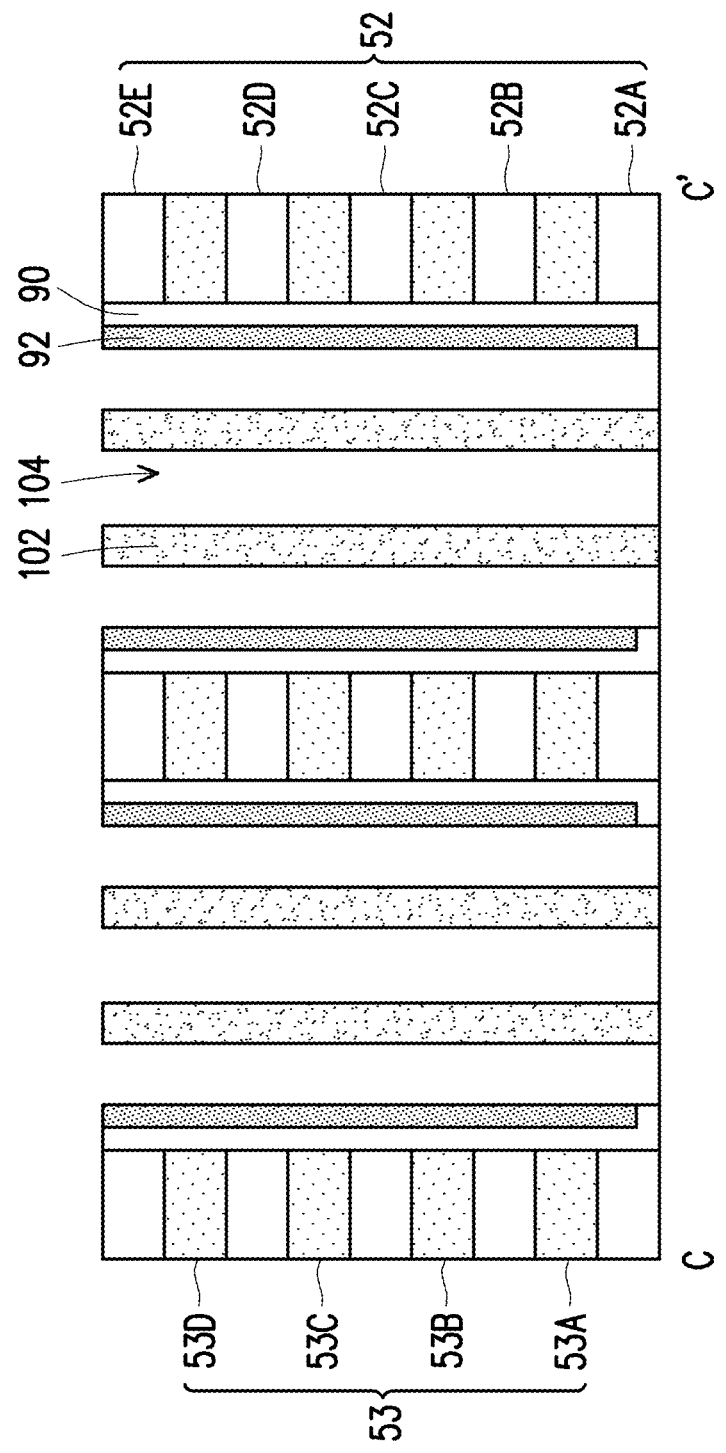

In FIGS. 22A and 22B, the sacrificial layer 94 are removed, so as to define trenches 104 between the dielectric pillars 102. In some embodiments, the sacrificial layer 94 is removed by an acceptable process, such as a wet etching process, a dry etching process or both.

Figure 23A:
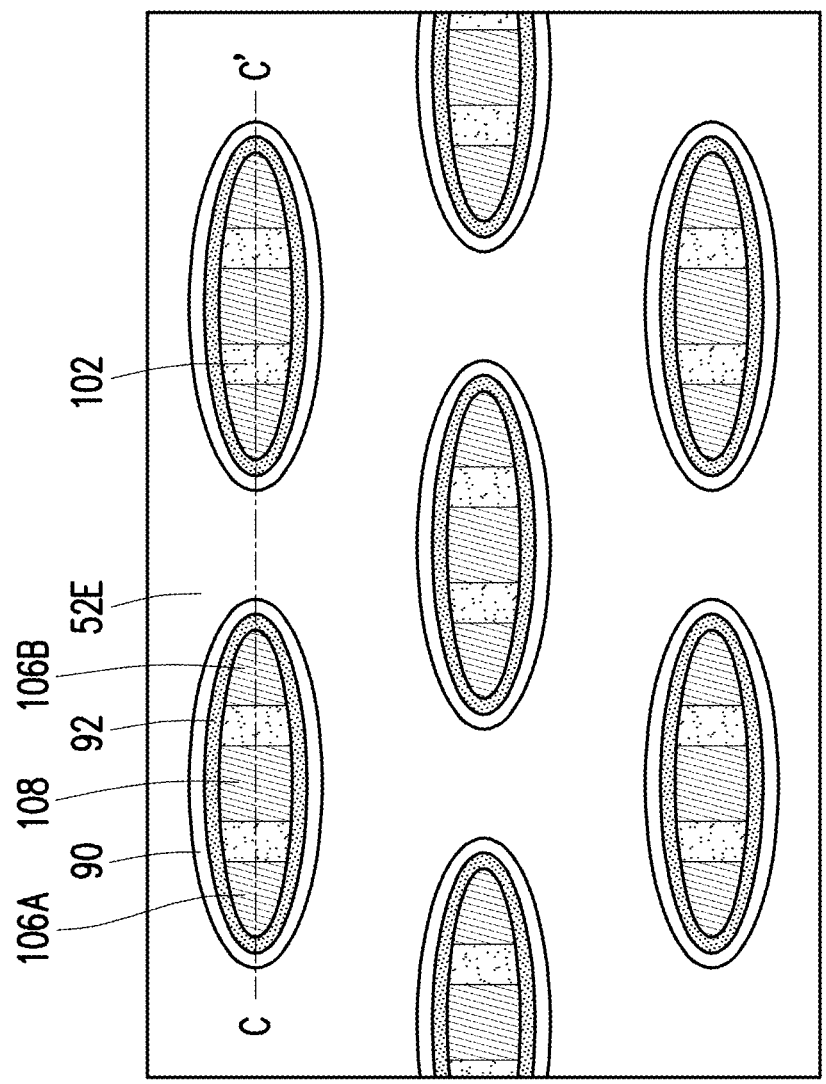
Figure 23B:
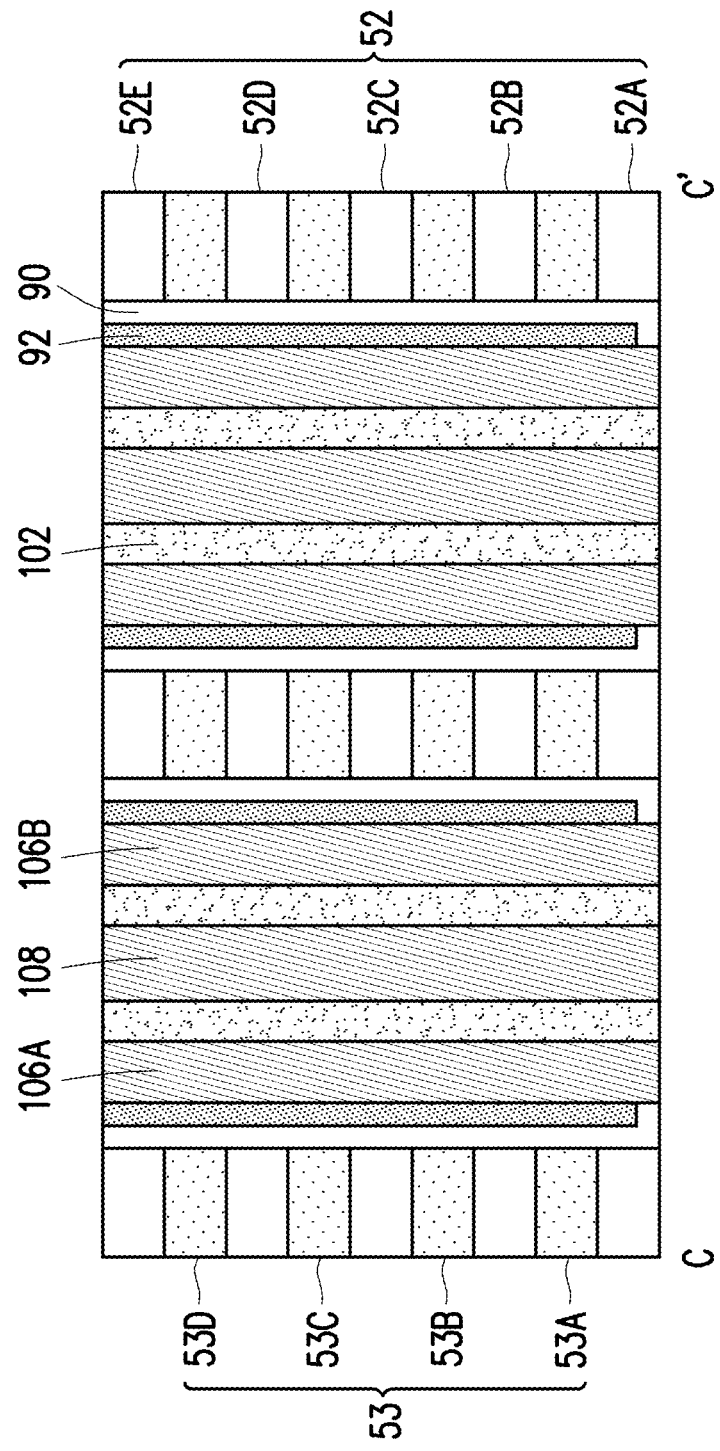

In FIGS. 23A and 23B, the trenches 104 are filled with a conductive material to form the conductive pillars 106A, 106B and 108. The conductive material may include copper, titanium, titanium nitride, tantalum, tantalum nitride, tungsten, ruthenium, aluminum, polysilicon, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106A, 106B and 108. In the resulting structure, top surfaces of the multi-layer stack 58 (e.g., the dielectric layer 52E), the memory material layer 90, the channel layer 92, the dielectric pillars 102, the conductive pillars 106A, the conductive pillars 106B and the conductive pillars 108 may be substantially level (e.g., within process variations). In some embodiments, the conductive pillars 106A and the conductive pillars 106B correspond to and are electrically connected to the bit lines in the memory device 200, and the conductive pillars 108 correspond to correspond to and are electrically connected to the source lines in the memory device 200. In alternative embodiments, the conductive pillars 106A and the conductive pillars 106B correspond to and are electrically connected to the source lines in the memory device 200, and the conductive pillars 108 correspond to and are electrically connected to the bit lines in the memory device 200.

In some embodiments, the conductive pillars 106A, 106B and 108 are surrounded by the channel layer 92 and the memory material layer 90. For example, the channel layer 92 and the memory material layer 90 are continuously disposed over outer sidewall surfaces of the conductive pillar 106A, the dielectric pillar 102 between the conductive pillar 106A and the conductive pillar 106B, the conductive pillar 108, the dielectric pillar 102 between the conductive pillar 108 and the conductive pillar 106B, and the conductive pillar 106B. The channel layer 92 may be in direct contact with the conductive pillars 106A, 106B and 108 and the dielectric pillars 102 therebetween. The memory material layer 90 may be continuously disposed on outer sidewall surfaces of the channel layer 92. In some embodiments, the memory material layer 90 is in direct contact with the outer sidewall surfaces and the bottom surface of the channel layer 92.

The conductive pillars 106A, 106B are disposed at different sides of the conductive pillar 108. For example, the conductive pillars 106A, 106B are disposed at opposite sides of the conductive pillar 108. In some embodiments, the conductive pillars 106A, 106B have a decreasing width at its ends. However, in other embodiments, the conductive pillars 106A, 106B have a constant width.

Figure 24A:
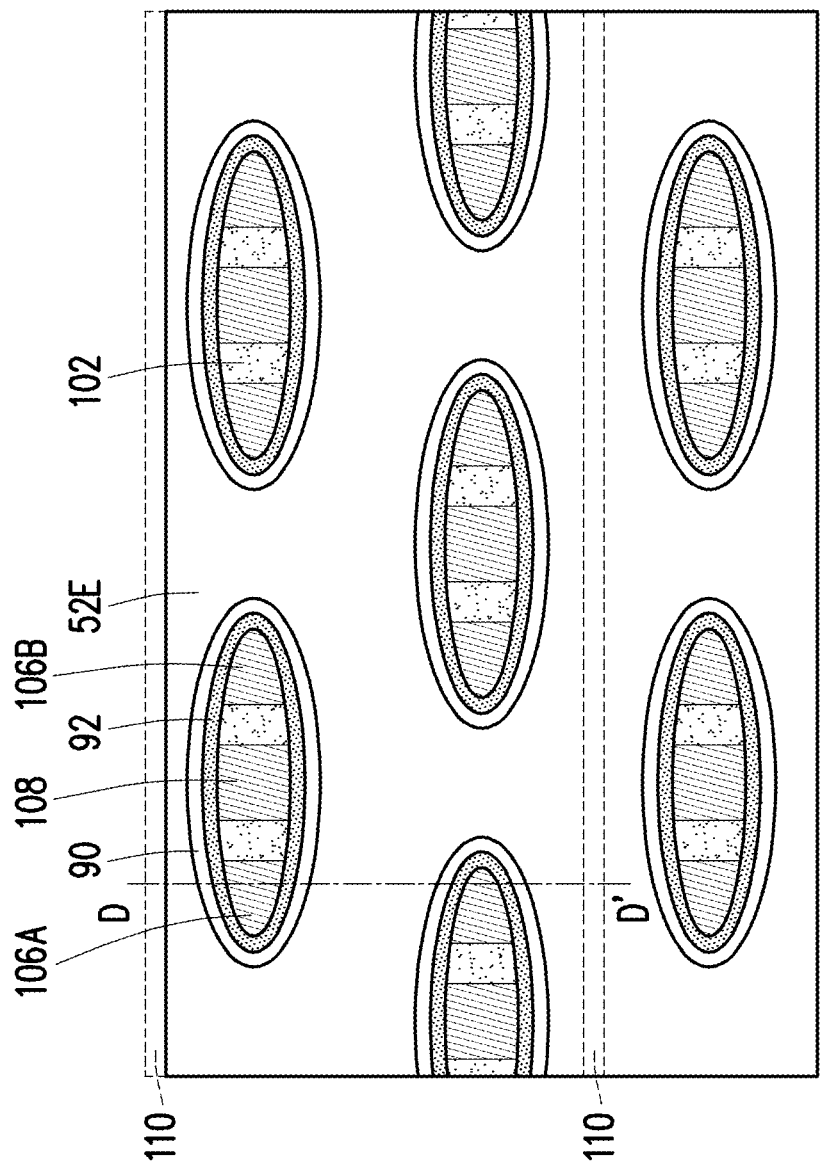
Figure 24B:
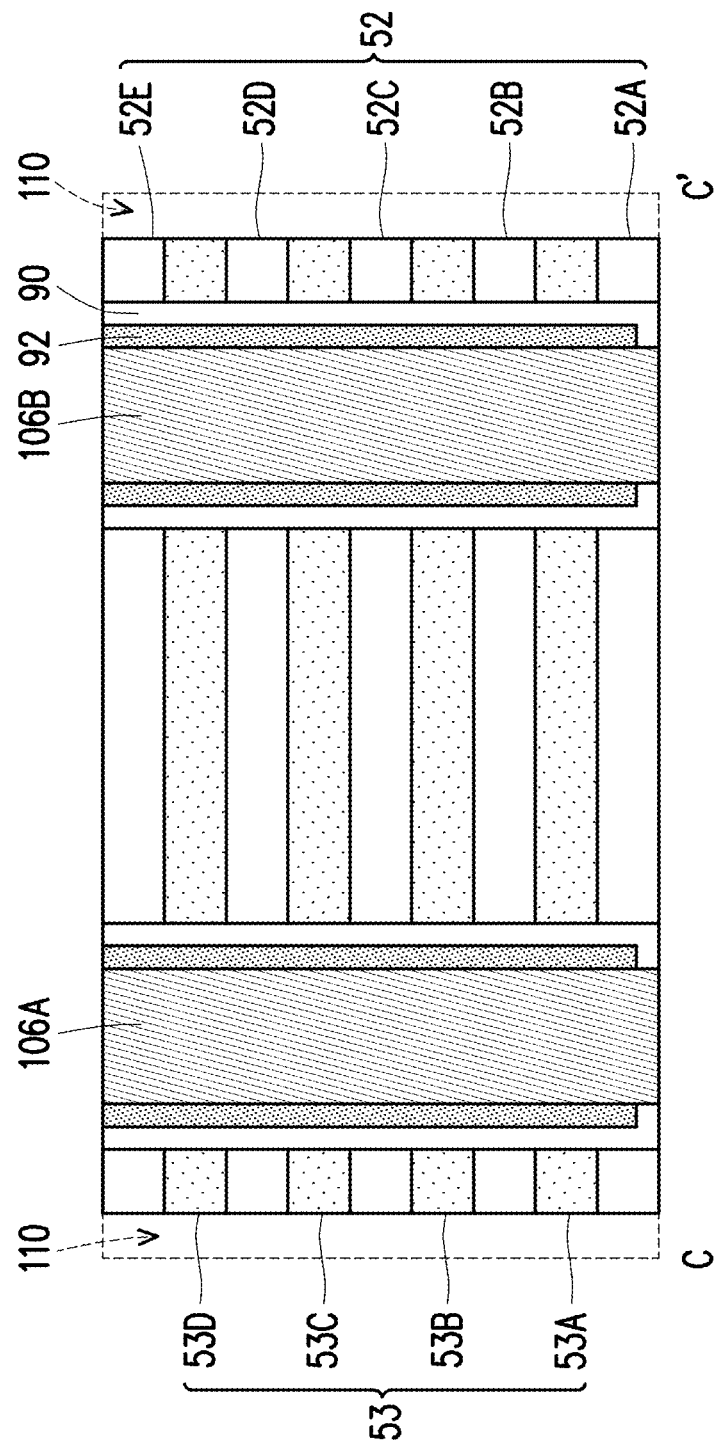
Figure 25:
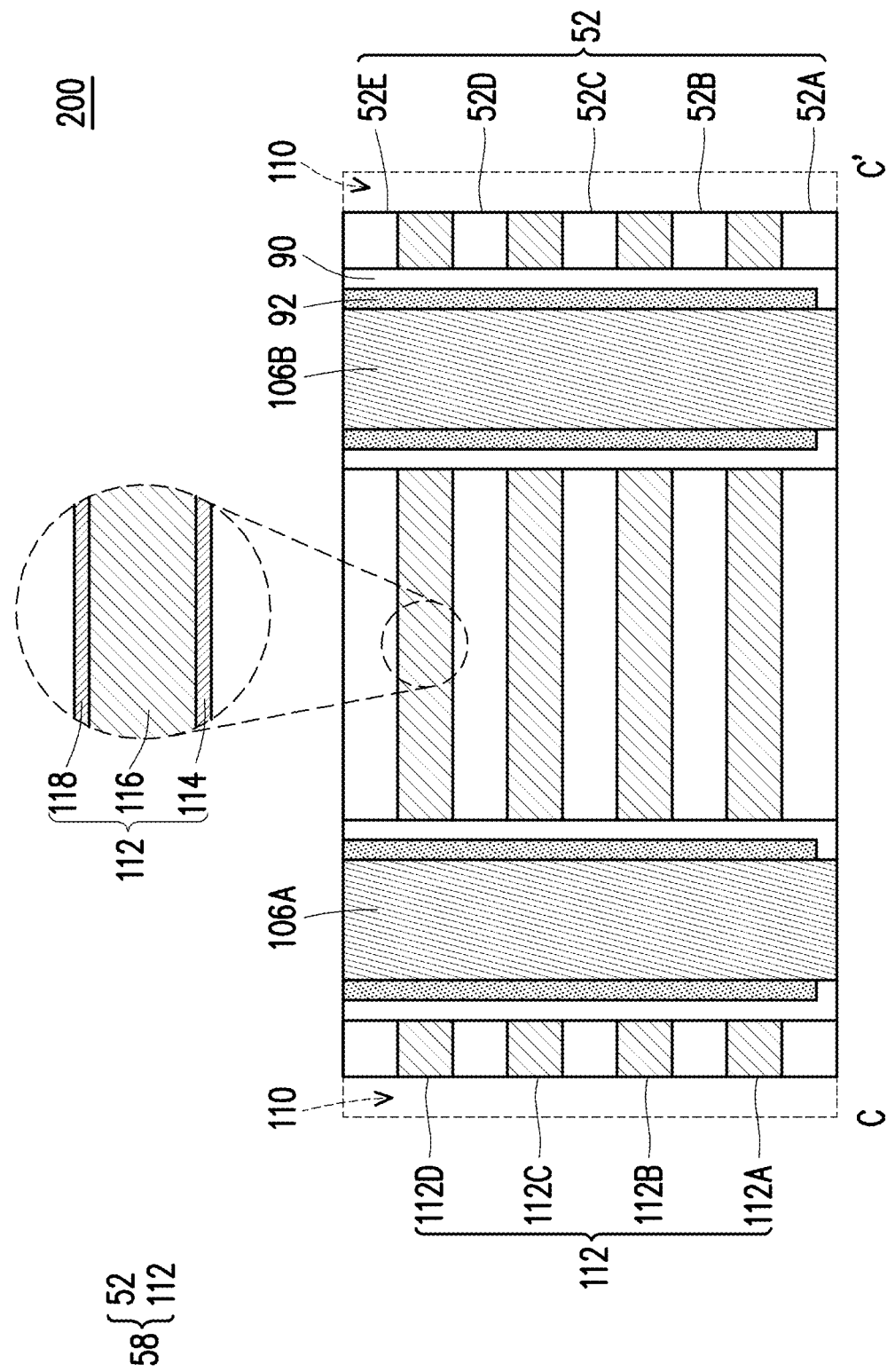
Figure 26A:
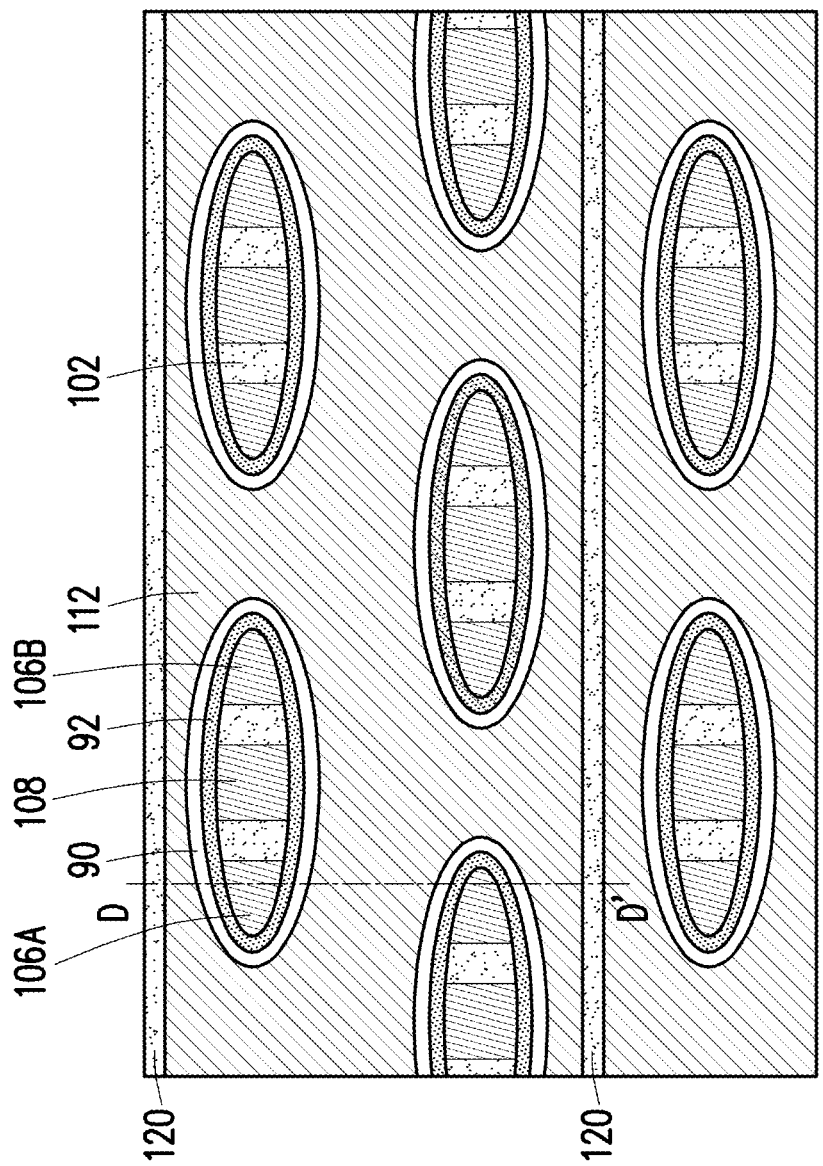
Figure 26B:
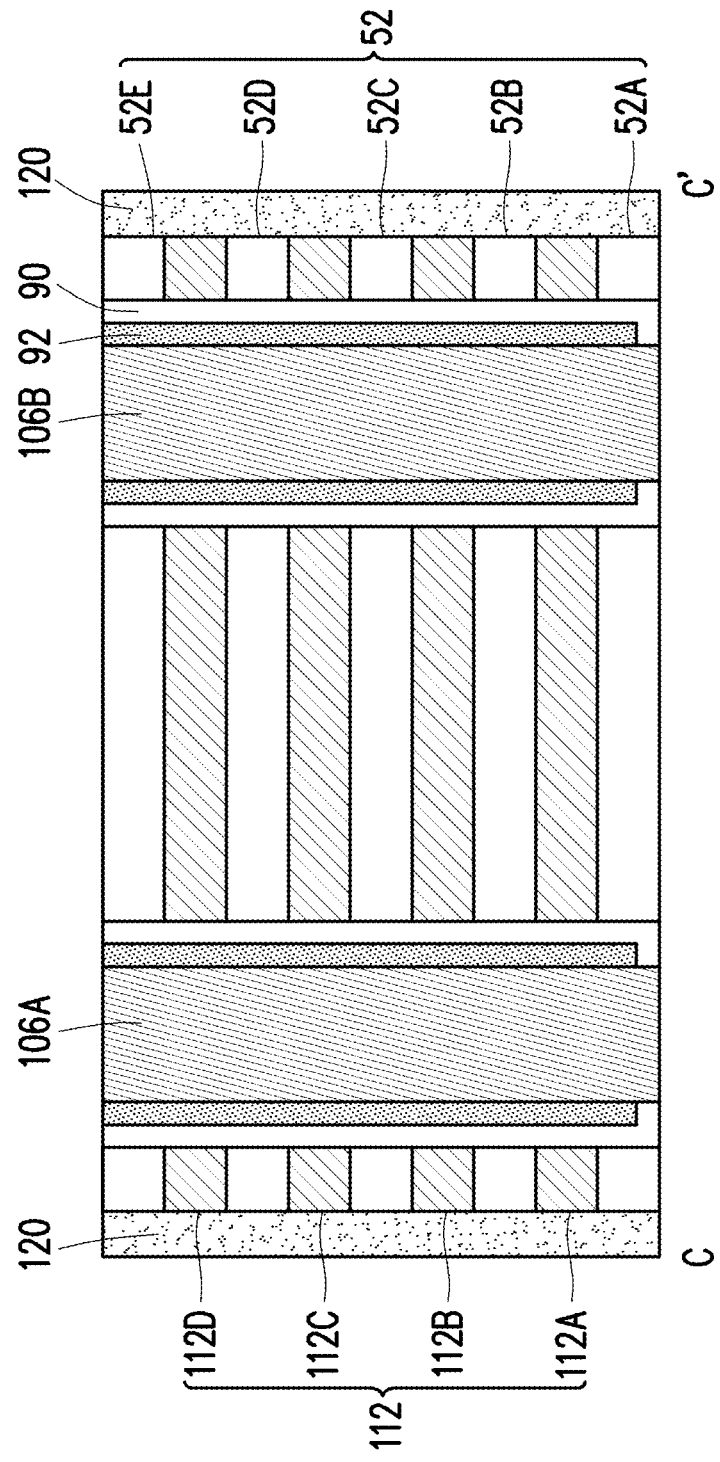

FIGS. 24A through 26B are views of intermediate stages in the manufacturing of a conductive line of the memory device 200, in accordance with some embodiments. In FIGS. 24A through 26B, the bulk multi-layer stack 58 is patterned to form trenches 110 therethrough, and sacrificial layers 53 are replaced with conductive materials to define the conductive lines 112. The conductive lines 112 may correspond to word lines in the memory device 200, and the conductive lines 112 may further provide gate electrodes for the resulting memory cells of the memory device 200. FIGS. 24A and 26A illustrate top-down views. FIGS. 24B and 26B are illustrated along reference cross-section D-D' illustrated in FIGS. 24A and 26A (also reference cross-section D-D' illustrated in FIG. 1A), and FIG. 25 is illustrated along reference cross-section D-D' illustrated in FIG. 24A (also reference cross-section D-D' illustrated in FIG. 1A).

In FIGS. 24A through 24B, the trenches 110 extend through the bulk multi-layer stack 58. The trenches 110 are formed by using a combination of photolithography and etching, for example.

In FIG. 25, the sacrificial layers 53A-53D (collectively referred to as sacrificial layers 53) are replaced with conductive lines 112A-112D (collectively referred to as conductive lines 112). In some embodiments, the sacrificial layers 53 are removed by an acceptable process, such as a wet etching process, a dry etching process or both. For example, hot phosphoric acid is used to remove the sacrificial layers 53. Thereafter, conductive lines 112 are filled into the space between two adjacent dielectric layers 52. As shown in the local enlarged view, each conductive line 112 includes two barrier layers 114 and 118 and a metal layer 116 between the barrier layers 114 and 118. Specifically, the barrier layer 114 or 118 is disposed between the metal layer 116 and the adjacent dielectric layer 52. The barrier layers 114 and 118 may prevent the metal layer from diffusion to the adjacent dielectric layers 52. The barrier layers 114 and 118 may also provide the function of increasing the adhesion between the metal layer 116 and the adjacent dielectric layers 52, and may be referred to as glue layers in some examples. In some embodiments, both barrier layers and glue layers with different materials are provided as needed. The barrier layers 114 and 118 are formed of a first conductive material, such as a metal nitride, such as titanium nitride, tantalum nitride, molybdenum nitride, zirconium nitride, hafnium nitride, or the like. The metal layer 116 may are formed of a second conductive material, such as a metal, such as tungsten, ruthenium, molybdenum, cobalt, aluminum, nickel, copper, silver, gold, alloys thereof, or the like. The barrier layers 114, 118, and metal layer 116 may each be formed by an acceptable deposition process such as CVD, PVD, ALD, PECVD, or the like. The first conductive material of the barrier layers 114, and 118, and the second conductive material of the metal layer 116 are further deposited on the sidewalls of the multi-layer stack 58 and fill in the trenches 110. Thereafter, the first conductive material of the barrier layers 114, and 118, and the second conductive material of the metal layer 116 in the trenches 110 are removed by an etching back process and/or a pull back process to avoid the short between the conductive lines 112. An acceptable etch back process and/or a pull back process may be performed to remove excess materials from the sidewalls of the dielectric layers 52 and bottom surfaces of the trenches 110. The acceptable etch back process and/or a pull back process may include a dry etch (e.g., RIE, NBE, the like), a wet etch, the like, or a combination thereof. The acceptable etch back process and/or a pull back process may be anisotropic.

In FIGS. 26A and 26B (in FIG. 26A, the dielectric layer 52E is omitted for clarity), dielectric layers 120 are formed in the trenches 110 to isolate the adjacent common conductive lines 112. In some embodiments, a dielectric layer is deposited over the multi-layer stack 58 filling in the trenches 110. The dielectric layer may include, for example, silicon oxide, silicon nitride, silicon oxynitride, or the like, which may be deposited by CVD, PVD, ALD, PECVD, or the like. The dielectric layer may extend along sidewalls and bottom surfaces of the trenches 110. After deposition, a planarization process (e.g., a CMP, etch back, or the like) may be performed to remove excess portions of the dielectric layer. In the resulting structure, top surfaces of the multi-layer stack 58 (e.g., dielectric layer 52E), the memory material layer 90, the channel layer 92, and the dielectric layers 120 may be substantially level (e.g., within process variations).

In some embodiments, upon the replacement process, the sacrificial layers 53 of the strip-shaped staircase structures are subsequently replaced with conductive lines 112 (see FIG. 1A).

Thus, stacked memory cells 202 may be formed in the memory device 200, as shown in FIG. 1A. Each memory cell 202 includes a gate electrode (e.g., a portion of a corresponding conductive line 112), a gate dielectric (e.g., a portion of a corresponding memory material layer 90), a channel region (e.g., a portion of a corresponding channel layer 92), and source/drain pillars (e.g., portions of corresponding conductive pillars 106A, 106B and 108). The memory cells 202 may be disposed in an array of vertically stacked rows and columns. In some embodiments, adjacent rows of the memory cells 202 share a common conductive line 112 (e.g., word line) therebetween, and the common conductive lines 112 are isolated by the dielectric layers 120 therebetween. However, the disclosure is not limited thereto.

Figure 27A:
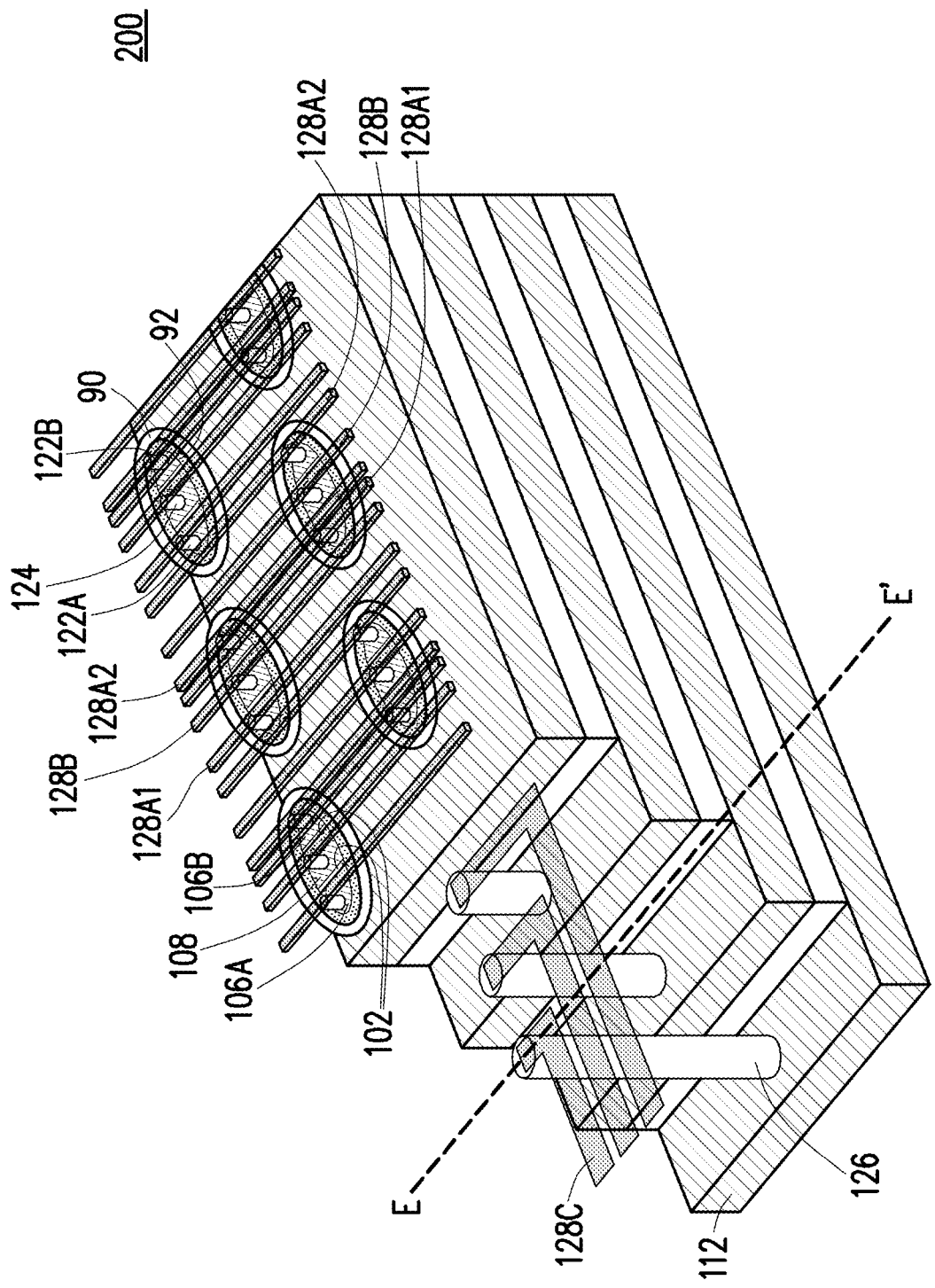
Figure 27D:
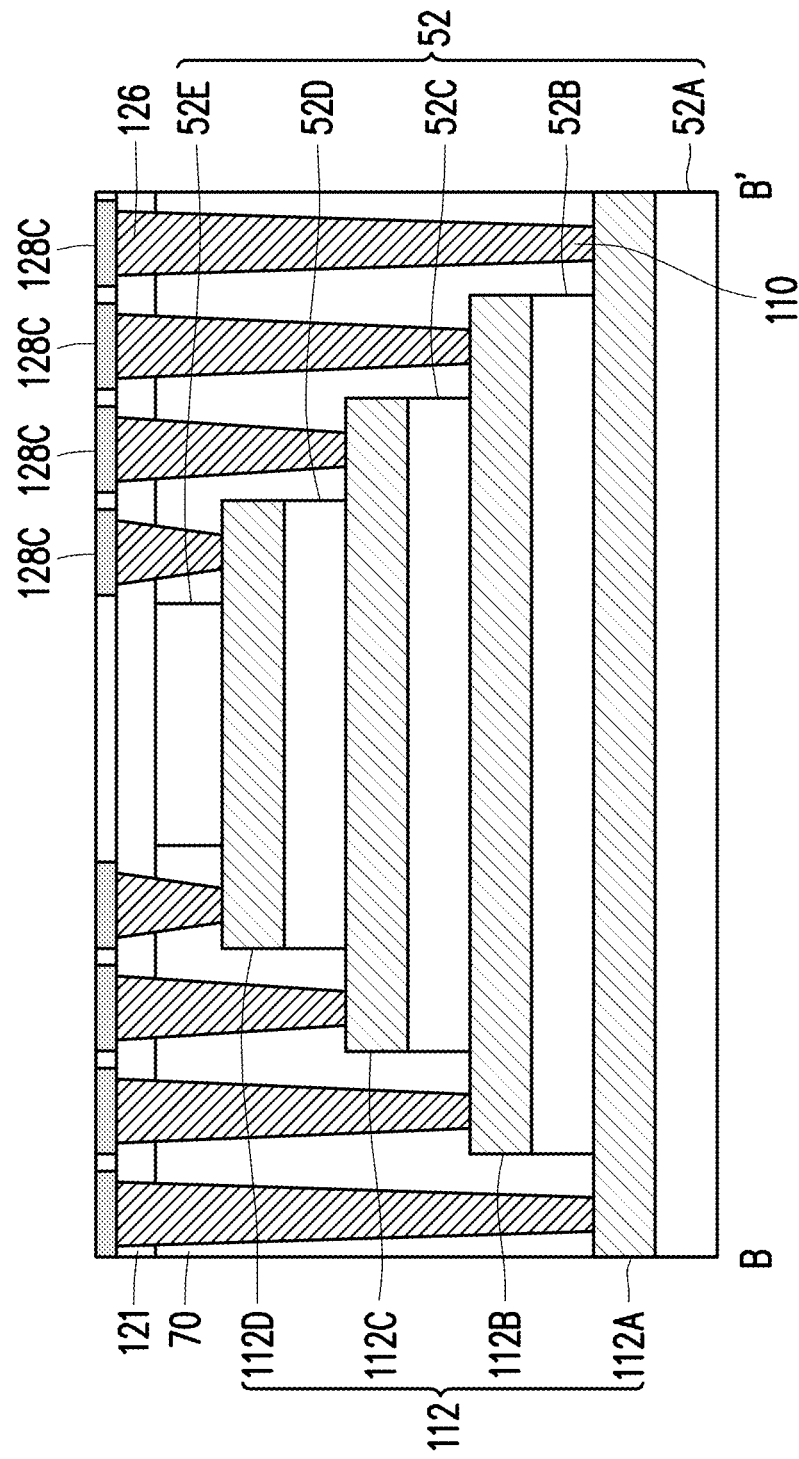

In FIGS. 27A, 27B, 27C and 27D, an IMD layer 121 is formed on top surfaces of the multi-layer stack 58 (e.g., the dielectric layer 52E), the memory material layer 90, the channel layer 92, the conductive pillars 106A, 106B, the conductive pillars 108 and the IMD 70. Conductive contacts 122A, 122B, 124 and 126 are made on the conductive lines 112, the conductive pillars 106A, 106B, and the conductive pillars 108, respectively. FIG. 27A illustrates a perspective view of the memory device 200; FIG. 27B illustrates a cross-sectional view of the device along line C-C' of FIG. 1A; FIG. 27C illustrates a cross-sectional view of the device along line E-E' of FIG. 27A; and FIG. 27D illustrates a cross-sectional view of the device along line B-B' of FIG. 1A.

The IMD 121 may be formed of a dielectric material, and may be deposited by any suitable method, such as CVD, PECVD, flowable CVD (FCVD), or the like. The dielectric materials may include phospho-silicate glass (PSG), borosilicate glass (BSG), boron-doped phospho-silicate glass (BPSG), undoped silicate glass (USG), a low-k dielectric material or the like. In some embodiments, the IMD 121 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 121 to remove excess dielectric material over the multi-layer stack 58 and the IMD 70. In some embodiments, the removal process may be a planarization process, such as a chemical mechanical polish (CMP), an etch-back process, combinations thereof, or the like.

In some embodiments, the staircase shape of the conductive lines 112 provides a surface on each of the conductive lines 112 for the conductive contacts 126 to land on. In some embodiments, forming the conductive contacts 126 may include patterning openings in the IMD 121 and IMD 70 to expose portions of the conductive lines 112 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 121. The remaining liner and conductive material form the conductive contacts 126 in the openings.

As also illustrated by the perspective view of FIG. 27A, conductive contacts 122A, 122B and 124 may also be made on the conductive pillars 106A, 106B and the conductive pillars 108, respectively. The conductive contacts 122A, 122B, 124 and 126 may be electrically connected to conductive lines 128A1, 128A2, 128B and 128C, respectively, which connect the memory array to an underlying/overlying circuitry (e.g., control circuitry) and/or signal, power, and ground lines in the semiconductor die. For example, as shown in FIG. 27C, the conductive contacts 126 extend through the IMD 121 and IMD 70 to electrically connect conductive lines 128C to the conductive lines 112. Other conductive contacts or vias may be formed through the IMD 121 to electrically connect the conductive lines 128A1, 128A2, 128B and 128C to the underlying active devices on the substrate. In alternative embodiments, routing and/or power lines to and from the memory array may be provided by an interconnect structure formed over the memory device 200 in addition to or in lieu of the interconnect structure 320. Accordingly, the memory device 200 may be completed. In some embodiments, a common conductive pillar (i.e., the conductive pillar 108) electrically connected to a common source line is disposed between two conductive pillars (i.e., the conductive pillars 106A, 106B) electrically connected to bit lines. In this configuration, by changing the source line/bit line voltage, the trapped charge may be addressed to 4 bits in one memory cell. That is, the memory cell 202 is operated as a 4-bits memory cell, for example. Thus, the operation speed of the memory cell is faster, and the device performance is accordingly improved.

Figure 28:
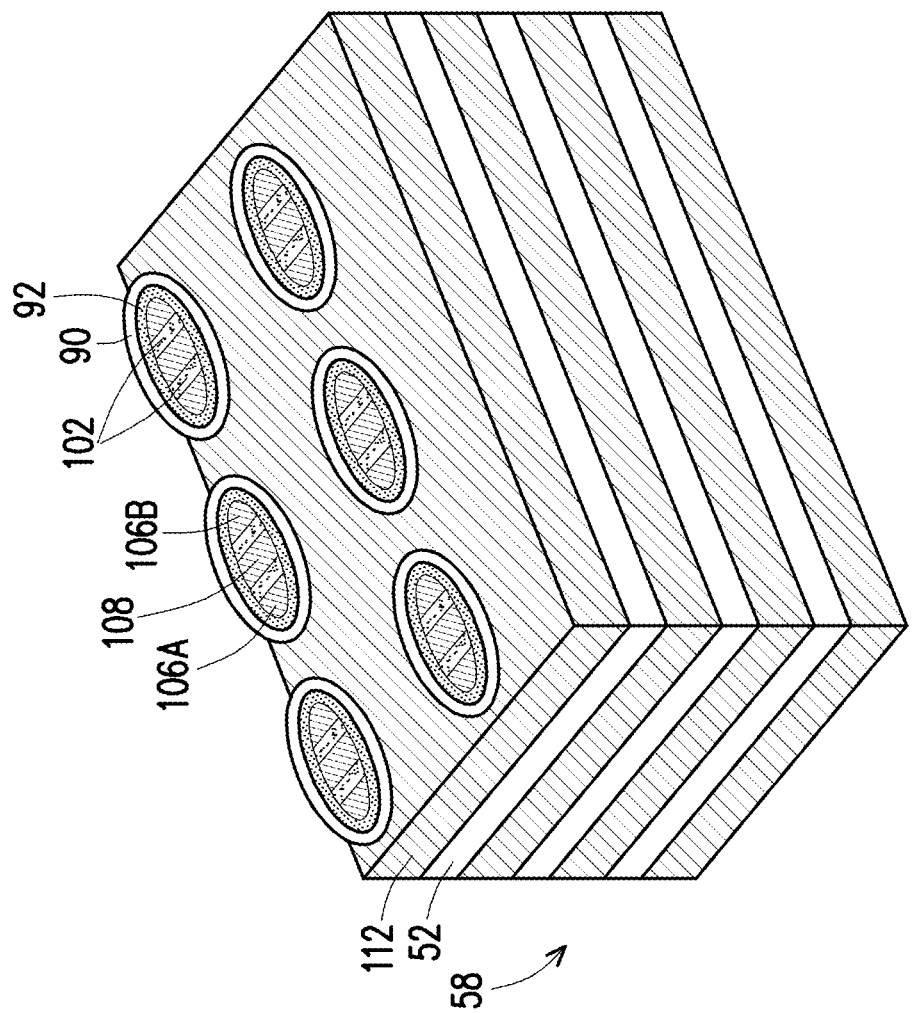
FIG. 28 illustrates a simplified perspective view of a memory device in accordance with alternative embodiments.

Although the embodiments of FIGS. 1A through 27B illustrate a particular pattern for the conductive pillars 106A, 106B and 108, other configurations are also possible. For example, in these embodiments, the conductive pillars 106A, 106B and 108 have a staggered pattern. However, in other embodiments, the conductive pillars 106A, 106B and 108 in a same row of the array are all aligned with each other, as shown in the memory device 200A of FIG. 28.

Figure 29A:
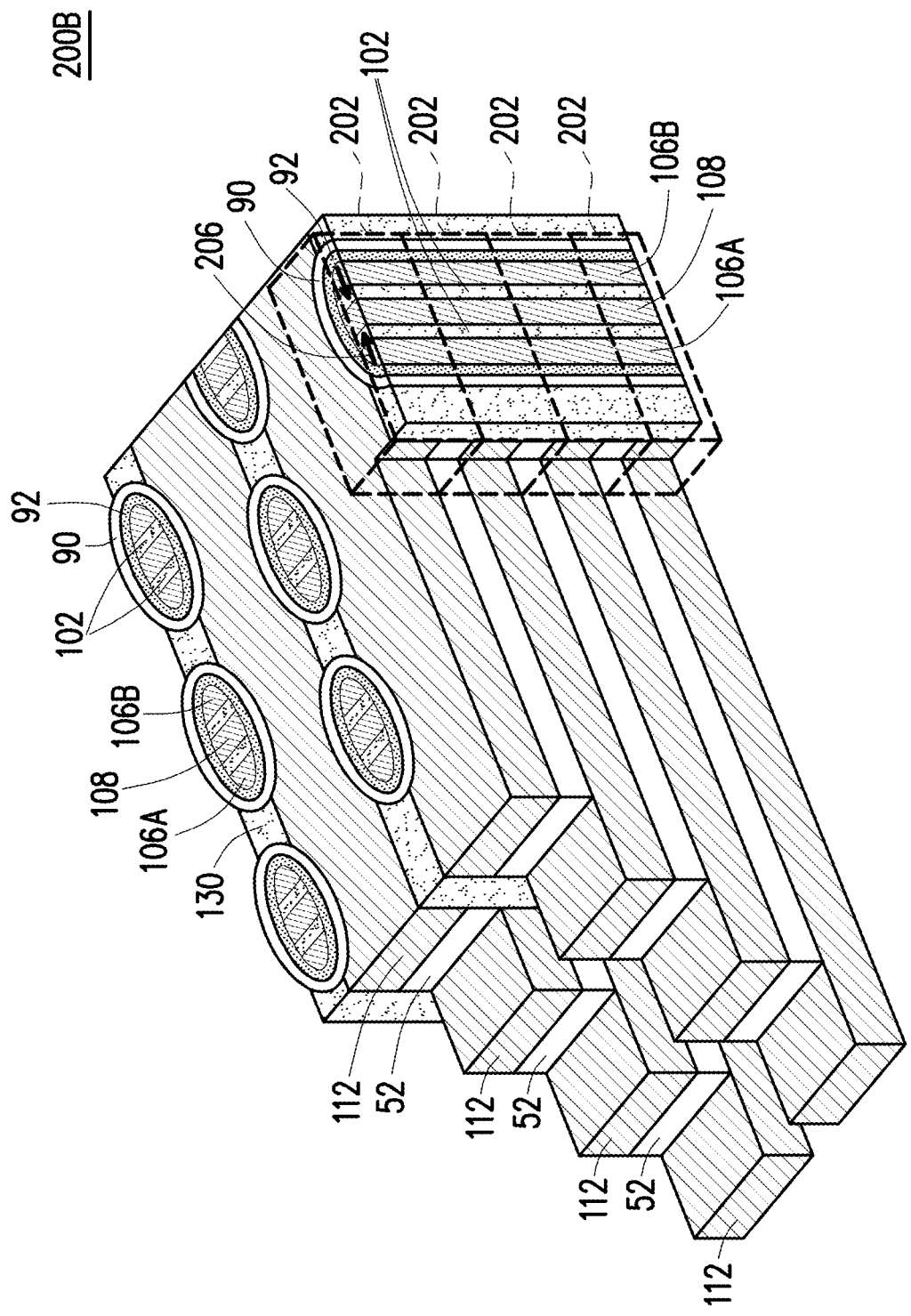
FIGS. 29A and 29B illustrates simplified perspective views of a memory device in accordance with alternative embodiments.
Figure 29B:
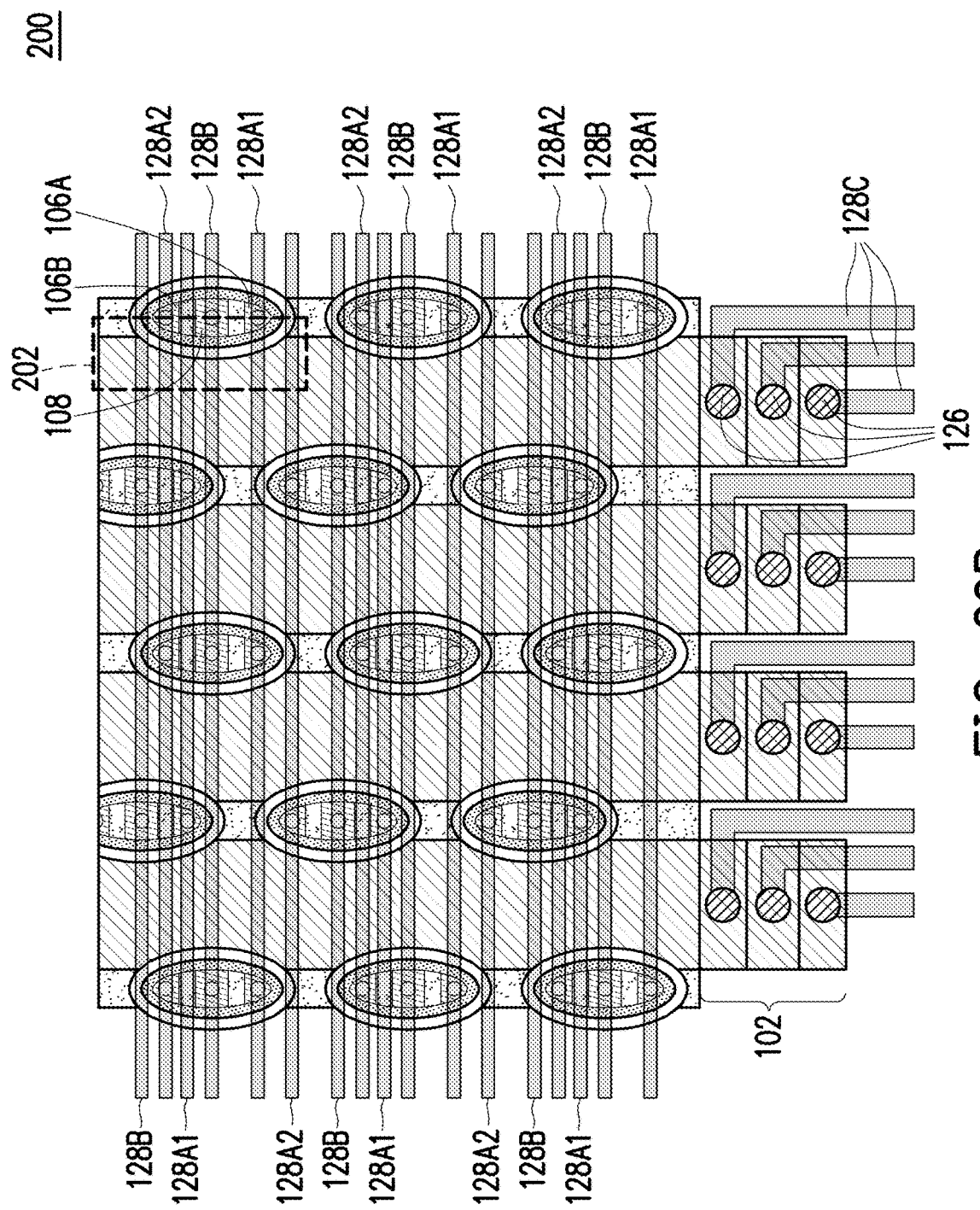
Figure 30A:
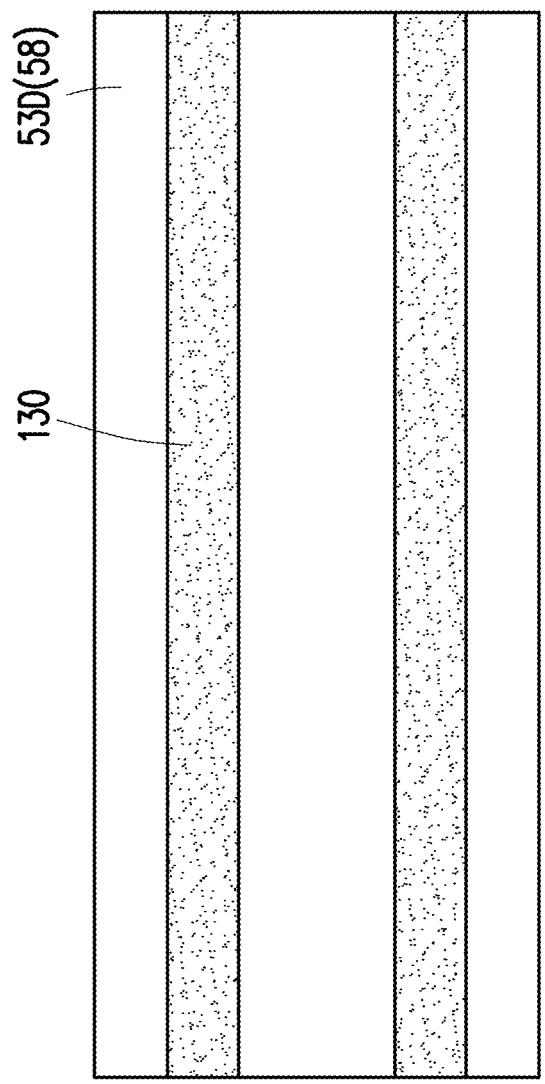
FIGS. 30A to 30C illustrate varying top down views of manufacturing a memory device in accordance with some embodiments.
Figure 30B:
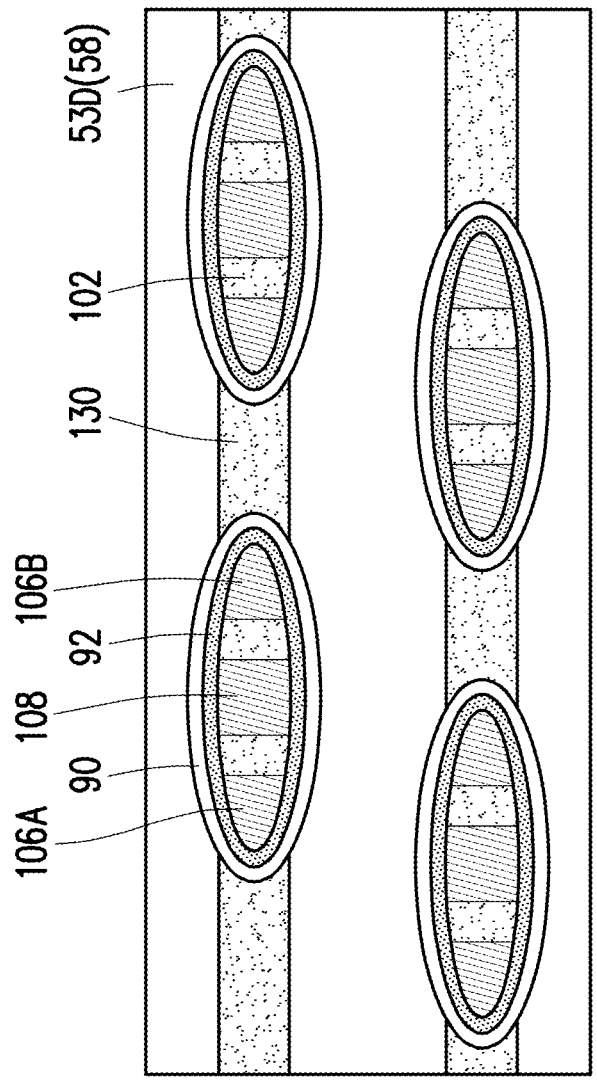
Figure 30C:
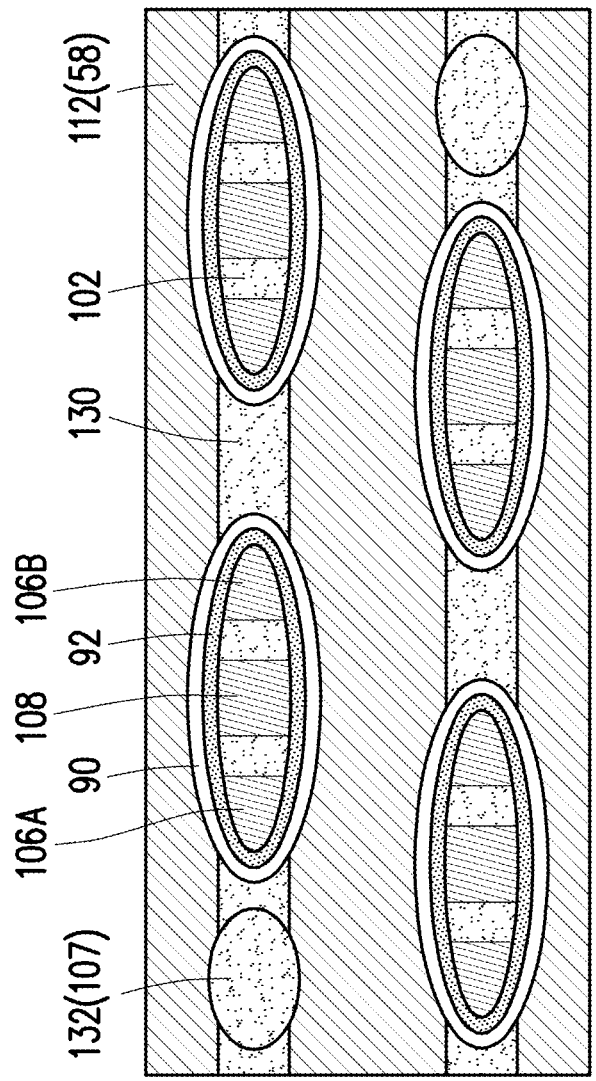

In some embodiments, adjacent rows of the memory cells 202 share a common conductive line 112 (e.g., word line) therebetween. However, the disclosure is not limited thereto. In alternative embodiments, as shown in the memory device 200B of FIGS. 29A and 29B, separated conductive lines 112 (e.g., word lines) are formed for each row of the memory cells 202, and dielectric layers 130 are disposed between and isolates adjacent sets of the conductive pillars 106A, 106B and 108. FIGS. 30A to 30C illustrate varying top down views of manufacturing a memory device in accordance with some embodiments, and the dielectric layer 52E is omitted for clarity. In such embodiments, as shown in FIG. 30A, after forming the multi-layer stack 58 as shown in FIG. 12, a plurality of trenches are formed, and then the trenches are filled with dielectric layers 130. In some embodiments, the dielectric layers 130 include silicon nitride. Then, as shown in FIG. 30B, conductive pillars 106A, 106B and 108, dielectric pillars 102 and memory material layer 90, channel layer 92 are formed. Thereafter, as shown in FIG. 30C, a plurality of trenches 107 are formed in the dielectric layers 130, and the sacrificial layers 53 are replaced with conductive materials through the trenches 107, to define the conductive lines 112. This step is similar to FIG. 25. After the conductive lines 112 are formed, dielectric layers 132 are formed in the trenches 107. In some embodiments, a material of the dielectric layers 132 is the same as a material of dielectric layers 130. However, the disclosure is not limited.

Figure 31:
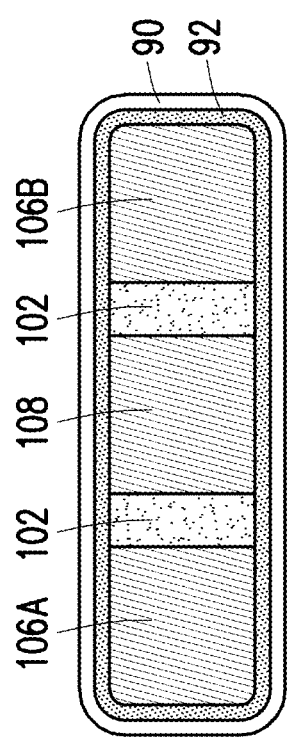
FIG. 31 illustrates a top down view of a memory cell of a memory device in accordance with alternative embodiments.
Figure 32:
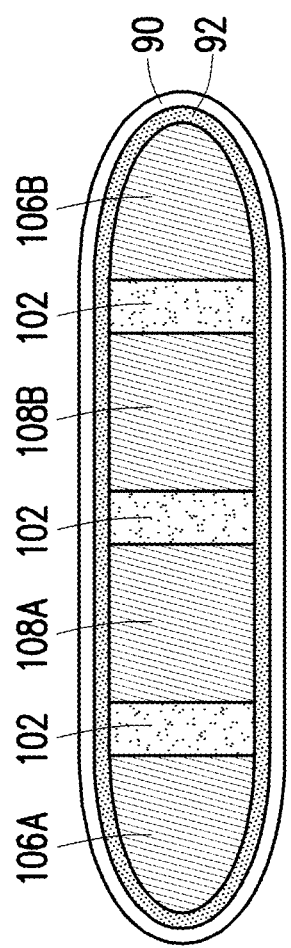
FIG. 32 illustrates a top down view of a memory cell of a memory device in accordance with alternative embodiments.

In some embodiments, the conductive pillars 106A, 106B and 108 are arranged as an oval-like shape. In alternative embodiments, the conductive pillars 106A, 106B and 108 are arranged to form other shape such as a rectangular shape, as shown in FIG. 31. In such embodiments, the conductive pillars 106A and 106B are disposed at opposite sides of the conductive pillar 108. The conductive pillars 106A, 106B may be electrically connected to first conductive lines (e.g., the bit lines), and the conductive pillar 108 may be electrically connected to second conductive line (e.g., the source line). In alternative embodiments, the conductive pillars 106A, 106B are electrically connected to the source lines, and the conductive pillar 108 is electrically connected to the bit line. In above embodiments, three conductive pillars 106A, 106B and 108 are illustrated. However, other embodiments may include other numbers of the conductive pillars. For example, in FIG. 32, there are four conductive pillars 106A, 106B, 108A and 108B. The conductive pillars 108A and 108B are disposed between the conductive pillars 106A and 106B. The conductive pillars 106A, 106B may be electrically connected to first conductive lines (e.g., the bit lines), and the conductive pillars 108A, 108B may be electrically connected to second conductive lines (e.g., the source lines). In alternative embodiments, the conductive pillars 106A, 106B are electrically connected to the source lines, and the conductive pillars 108A, 108B are electrically connected to the bit lines.

Figure 33:
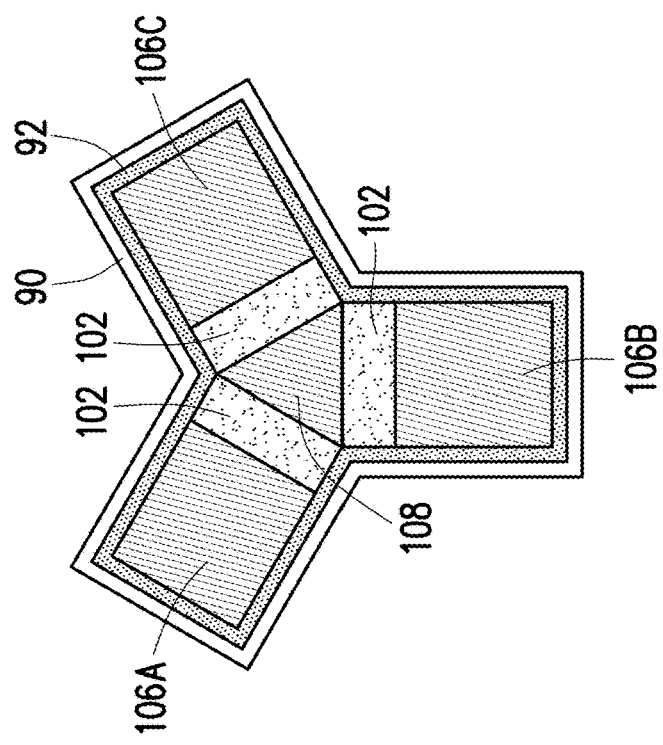
FIG. 33 illustrates a top down view of a memory cell of a memory device in accordance with alternative embodiments.
Figure 34:
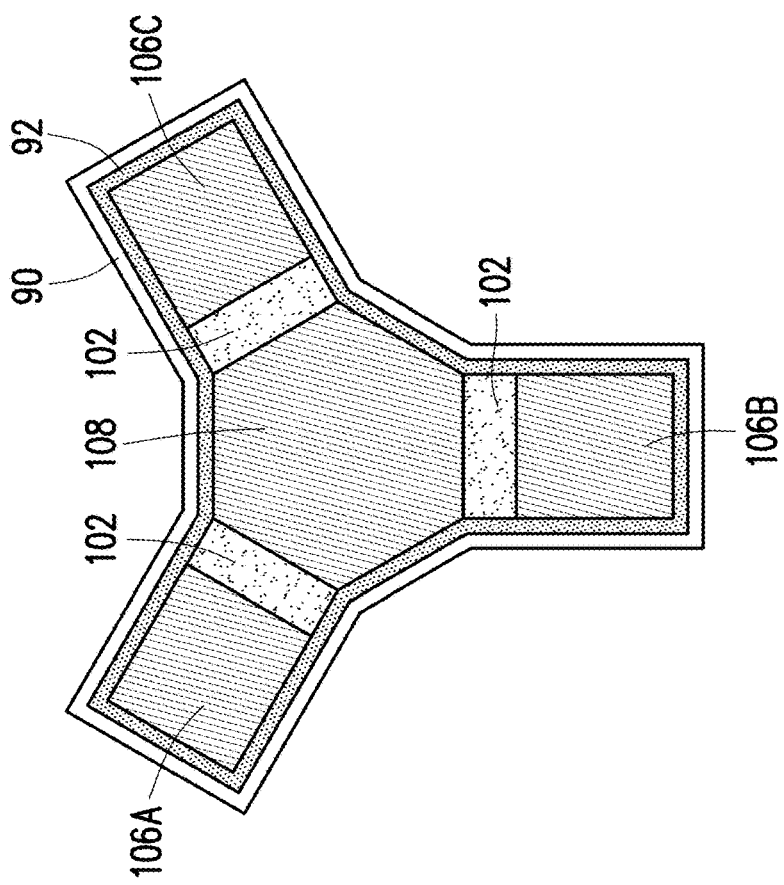
FIG. 34 illustrates a top down view of a memory cell of a memory device in accordance with alternative embodiments.

In some embodiments, as shown in FIGS. 33 and 34, there are four conductive pillars 106A, 106B, 106C and 108. The central conductive pillar (e.g., the conductive pillar 108) is a polygon column, and other conductive pillars (e.g., the conductive pillars 106A, 106B, 106C) are disposed at different sides of the polygon column respectively. For example, as shown in FIG. 33, the conductive pillar 108 is a triangular column, and the conductive pillars 106A, 106B, 106C are disposed at all sides of the conductive pillar 108 respectively. The conductive pillars 106A, 106B, 106C may be electrically connected to first conductive lines (e.g., the bit lines), and the conductive pillar 108 may be electrically connected to a second conductive line (e.g., the source line). In alternative embodiments, the conductive pillars 106A, 106B, 106C are electrically connected to the source lines, and the conductive pillar 108 is electrically connected to the bit line. In some embodiments, as shown in FIG. 34, the conductive pillar 108 is a hexagonal column, and the conductive pillars 106A, 106B, 106C are disposed at three sides of the conductive pillar 108 respectively. The conductive pillars 106A, 106B, 106C may be electrically connected to first conductive lines (e.g., the bit lines), and the conductive pillar 108 may be electrically connected to a second conductive line (e.g., the source line). In alternative embodiments, the conductive pillars 106A, 106B, 106C are electrically connected to the source lines, and the conductive pillar 108 is electrically connected to the bit line.

In FIGS. 31 to 34, the conductive pillars are surrounded by the channel layer 92 and the memory material layer 90. For example, the channel layer 92 and the memory material layer 90 are continuously disposed over outer sidewall surfaces of the conductive pillars (e.g., the conductive pillars 106A, 106B, 106C, 108A, 108B), the dielectric pillar 102 between adjacent ones of the conductive pillars (e.g., the conductive pillars 106A, 106B, 106C, 108A, 108B). The channel layer 92 may be in direct contact with the conductive pillars (e.g., the conductive pillars 106A, 106B, 106C, 108A, 108B) and the dielectric pillars 102 therebetween. The memory material layer 90 may be continuously disposed on outer sidewall surfaces of the channel layer 92, and the memory material layer 90 may be in direct contact with the outer sidewall surfaces of the channel layer 92. Although corners of the conductive pillars (e.g., the conductive pillars 106A, 106B, 106C, 108A, 108B) are illustrated as sharp corners, the corners of the conductive pillars (e.g., the conductive pillars 106A, 106B, 106C, 108A, 108B) may be rounded corners. By these configurations of FIGS. 31 to 34, by changing the source line/bit line voltage, the trapped charge may be addressed to more than two bits in one memory cell. That is, the memory cell is operated as a multiple-bits memory cell, for example. Thus, the operation speed of the memory cell is faster, and the device performance is accordingly improved.

Figure 35:
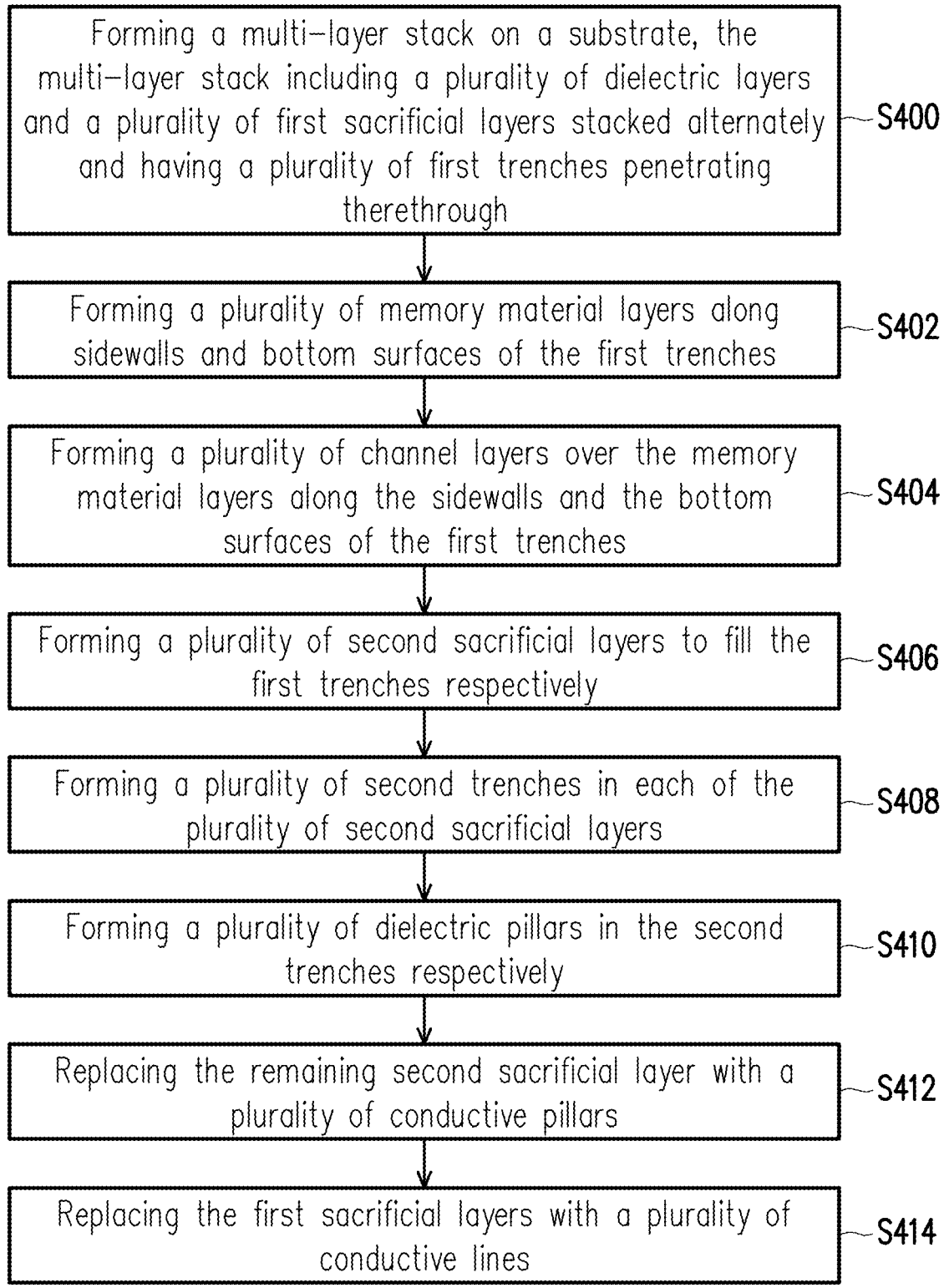
FIG. 35 illustrates a method of forming a memory device in accordance with some embodiments.

FIG. 35 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S400, a multi-layer stack is formed on a substrate, and the multi-layer stack includes a plurality of dielectric layers and a plurality of first sacrificial layers stacked alternately and has a plurality of first trenches penetrating therethrough. FIG. 4 to FIG. 14B illustrate varying views corresponding to some embodiments of act S400.

At act S402, a plurality of memory material layers are formed along sidewalls and bottom surfaces of the first trenches. FIG. 15A to FIG. 16B illustrate varying views corresponding to some embodiments of act S402.

At act S404, a plurality of channel layers are formed over the memory material layers along the sidewalls and the bottom surfaces of the first trenches. FIG. 15A to FIG. 16B illustrate varying views corresponding to some embodiments of act S404.

At act S406, a plurality of second sacrificial layers are formed to fill the first trenches respectively. FIG. 17A and FIG. 17B illustrates a cross-sectional view corresponding to some embodiments of act S406.

At act S408, a plurality of second trenches are formed in each of the plurality of second sacrificial layers. FIG. 18A to FIG. 19B illustrate varying views corresponding to some embodiments of act S408.

At act S410, a plurality of dielectric pillars are formed in the second trenches respectively. FIG. 21A and FIG. 21B illustrate varying views corresponding to some embodiments of act S410.

At act S412, the remaining second sacrificial layer is replaced with a plurality of conductive pillars. FIG. 22A and FIG. 23B illustrate varying views corresponding to some embodiments of act S412.

At act S414, the first sacrificial layers are replaced with a plurality of conductive lines. FIG. 24A and FIG. 25B illustrate varying views corresponding to some embodiments of act S414.

In some embodiments of the disclosure, a stackable 3D non-volatile memory (NVM) architecture is formed to provide an ultra-high density, and all memory cells in the 3D array are connected in parallel. Thus, a sum-of-product operation is enabled. In some embodiments of the disclosure, the cell is formed with a common source line. For example, more than 2 bits are formed in each memory cell. In some embodiments, 2n (n is an integer larger than 1) bits is formed per cell. Thus, the operation speed of the memory cell is faster, and the device performance is accordingly improved.

In the above embodiments, the memory device is formed by a "staircase first process" in which the staircase structure is formed before the memory cells are formed. However, the disclosure is not limited thereto. In other embodiments, the memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

In accordance with some embodiments of the present disclosure, a memory device includes a multi-layer stack, a channel layer, a memory material layer and at least three conductive pillars. The multi-layer stack is disposed on a substrate and includes a plurality of conductive layers and a plurality of dielectric layers stacked alternately. The channel layer penetrates through the plurality of conductive layers and the plurality of dielectric layers. The memory material layer is disposed between the channel layer and each of the plurality of conductive layers and the plurality of dielectric layers. The conductive pillars are surrounded by the channel layer and the memory material layer, wherein the at least three conductive pillars are electrically connected to conductive lines respectively.

In accordance with alternative embodiments of the present disclosure, a memory device includes a multi-layer stack, a first conductive pillar, a plurality of second conductive pillars, a plurality of dielectric pillars, a channel layer and a memory material layer. The multi-layer stack is disposed on a substrate and includes a plurality of gate electrode layers and a plurality of dielectric layers stacked alternately. The first conductive pillar penetrates through the multi-layer stack. The second conductive pillars are at different sides of the first conductive pillar. The first conductive pillar and the second conductive pillars are electrically connected to conductive lines respectively. The dielectric pillars penetrate through the multi-layer stack and disposed between the first conductive pillar and each of the second conductive pillars. The channel layer surrounds the first conductive pillar, the second conductive pillars and the dielectric pillars. The memory material layer is disposed between the channel layer and the multi-layer stack.

In accordance with yet alternative embodiments of the present disclosure, a method of forming a memory device includes the following steps. A multi-layer stack is formed on a substrate, wherein the multi-layer stack comprises a plurality of dielectric layers and a plurality of first sacrificial layers stacked alternately and has a plurality of first trenches penetrating therethrough. A plurality of memory material layers are formed along sidewalls and bottom surfaces of the plurality of first trenches. A plurality of channel layers are formed over the plurality of memory material layers along the sidewalls and the bottom surfaces of the plurality of first trenches. A plurality of second sacrificial layers are formed to fill the plurality of first trenches respectively. A plurality of second trenches are formed in each of the plurality of second sacrificial layers. A plurality of dielectric pillars are formed in the plurality of second trenches respectively. The remaining second sacrificial layer is replaced with a plurality of conductive pillars respectively. The plurality of first sacrificial layers are replaced with a plurality of conductive lines respectively.

In accordance with yet alternative embodiments of the present disclosure, a method of forming a memory device includes the following steps. A first conductive pillar is formed. A plurality of second conductive pillars are formed at different sides of the first conductive pillar. A plurality of dielectric pillars are respectively formed between the first conductive pillar and the plurality of second conductive pillars. A channel layer is formed to continuously surround the first conductive pillar, the plurality of second conductive pillars and the plurality of dielectric pillars. A memory material layer is formed to surround the channel layer.

In accordance with yet alternative embodiments of the present disclosure, a method of forming a memory device includes the following steps. A multi-layer stack is formed, wherein the multi-layer stack includes a plurality of dielectric layers and a plurality of first sacrificial layers stacked alternately. A first trench penetrating through the multi-layer stack is formed. A memory material layer is formed on a sidewall of the first trench. A channel layer is formed over the memory material layer on the sidewall of the first trench. A plurality of conductive pillars and a plurality of dielectric pillars are formed to alternately arrange in the first trench. The plurality of first sacrificial layers are replaced with a plurality of conductive lines respectively.

In accordance with yet alternative embodiments of the present disclosure, a method of forming a memory device includes the following steps. A multi-layer stack is formed, wherein the multi-layer stack includes a plurality of dielectric layers and a plurality of first sacrificial layers stacked alternately. A first trench penetrating through the multi-layer stack is formed. A memory material layer is formed in the first trench. A channel layer is formed over the memory material layer in the first trench. A second sacrificial layer to is formed fill the first trench. A plurality of second trenches are formed in the second sacrificial layer, to separate the second sacrificial layer into a plurality of sacrificial pillars. A plurality of dielectric pillars are formed in the plurality of second trenches respectively. The plurality of sacrificial pillars are replaced with a plurality of conductive pillars respectively. The plurality of first sacrificial layers are replaced with a plurality of conductive lines respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, comprising:
   forming a first conductive pillar;
   forming a plurality of second conductive pillars at different sides of the first conductive pillar;
   forming a plurality of dielectric pillars between the first conductive pillar and the plurality of second conductive pillars respectively;

forming a channel layer to continuously surround outer sidewalls of the first conductive pillar, the plurality of second conductive pillars and the plurality of dielectric pillars; and forming a memory material layer to surround the channel layer.

2. The method of claim 1, wherein the plurality of second conductive pillars are formed at opposite sides of the first conductive pillar.

3. The method of claim 1, wherein the plurality of second conductive pillars are formed to surround the first conductive pillar.

4. The method of claim 1, wherein the first conductive pillar incudes a plurality of first sides and second sides alternately arranged, and the plurality of second conductive pillars are disposed at the first sides respectively.

5. The method of claim 1, wherein forming the first conductive pillar, the plurality of second conductive pillars and the plurality of dielectric pillars comprises:
  forming a first trench penetrating through a multi-layer stack, wherein the multi-layer stack comprises a plurality of dielectric layers and a plurality of first sacrificial layers stacked alternately;
  forming a second sacrificial layer to fill the first trench;
  forming a plurality of second trenches in the second sacrificial layer;
  forming the plurality of dielectric pillars in the plurality of second trenches;
  by removing the remaining second sacrificial layer, forming a third trench and a plurality of fourth trenches at different sides of the third trench;
  forming the first conductive pillar in the third trench; and
  forming the plurality of second conductive pillars in the plurality of fourth trenches, respectively.

6. The method of claim 5, further comprising replacing the plurality of first sacrificial layers with a plurality of conductive lines respectively.

7. A method of forming a memory device, comprising:
  forming a multi-layer stack, wherein the multi-layer stack comprises a plurality of dielectric layers and a plurality of first sacrificial layers stacked alternately along a first direction;
  forming a first trench penetrating through the multi-layer stack;
  forming a memory material layer on a sidewall of the first trench;
  forming a channel layer over the memory material layer on the sidewall of the first trench;
  forming at least three conductive pillars and a plurality of dielectric pillars alternately arranged in the first trench, wherein the at least three conductive pillars are aligned along a second direction substantially perpendicular to the first direction; and
  replacing the plurality of first sacrificial layers with a plurality of conductive lines respectively.

8. The method of claim 7, further comprising forming a plurality of first signal lines to electrically connect to first conductive pillars of the at least three conductive pillars respectively, and forming a second signal line to electrically connect to a second conductive pillar of the at least three conductive pillars, wherein the second conductive pillar is disposed between the first conductive pillars.

9. The method of claim 7, wherein forming the memory material layer and the channel layer comprises:
  conformally forming a memory material on exposed surfaces of the first trench and the multi-layer stack;
  conformally forming a channel material on an exposed surface of the memory material layer over the first trench and the multi-layer stack; and
  removing portions of the memory material and the channel layer on a top surface of the multi-layer stack and a bottom surface of the first trench.

10. The method of claim 9, wherein an inner sidewall of a portion of the memory material layer on the bottom surface of the first trench is substantially flush with an inner sidewall of the channel layer, and a top surface of the memory material layer is substantially coplanar with a top surface of the channel layer.

11. The method of claim 7, wherein forming the at least three conductive pillars and the plurality of dielectric pillars comprises:
  forming a second sacrificial layer to fill the first trench;
  forming a plurality of second trenches in the second sacrificial layer;
  forming the plurality of dielectric pillars in the plurality of second trenches;
  forming a plurality of third trenches by removing the remaining second sacrificial layer; and
  forming the at least three conductive pillars in the plurality of third trenches.

12. The method of claim 7, wherein each of the plurality of dielectric pillars is disposed between adjacent two of the at least three conductive pillars.

13. A method of forming a memory device, comprising:
  forming a multi-layer stack, wherein the multi-layer stack comprises a plurality of dielectric layers and a plurality of first sacrificial layers stacked alternately;
  forming a first trench penetrating through the multi-layer stack;
  forming a memory material layer in the first trench;
  forming a channel layer over the memory material layer in the first trench;
  forming a second sacrificial layer to fill the first trench;
  forming a plurality of second trenches in the second sacrificial layer, to separate the second sacrificial layer into a plurality of sacrificial pillars;
  forming a plurality of dielectric pillars in the plurality of second trenches respectively;
  replacing the plurality of sacrificial pillars with a plurality of conductive pillars respectively; and
  replacing the plurality of first sacrificial layers with a plurality of conductive lines respectively.

14. The method of claim 13, further comprising:
  removing portions of the multi-layer stack, to form a plurality of third trenches penetrating through the multi-layer stack, wherein the first trench is disposed between the plurality of third trenches; and
  forming a plurality of isolation pillars in the plurality of third trenches respectively.

15. The method of claim 14, wherein the plurality of isolation pillars have an etching selectivity with respect to the plurality of first sacrificial layers during replacing the plurality of first sacrificial layers with the plurality of conductive lines.

16. The method of claim 13, wherein the plurality of dielectric pillars have an etching selectivity with respect to the plurality of first sacrificial layers during replacing the plurality of first sacrificial layers with the plurality of conductive lines.

17. The method of claim 13, wherein replacing the plurality of sacrificial pillars with the plurality of conductive pillars comprises:

removing the plurality of sacrificial pillars, to form a plurality of third trenches between the plurality of dielectric pillars;

forming a conductive material to fill up the plurality of third trenches; and removing the conductive material outside the plurality of third trenches.

18. The method of claim 13, wherein replacing the plurality of first sacrificial layers with the plurality of conductive lines comprises:

forming a plurality of third trenches in the multi-layer stack;

removing the plurality of first sacrificial layers through the plurality of third trenches; and forming the plurality of conductive lines into spaces between the plurality of dielectric layers.

19. The method of claim 13, wherein forming the memory material layer, the channel layer and the second sacrificial layer comprise:

forming a memory material along a sidewall and a bottom surface of the first trench and a top surface of the multi-layer stack;

forming a channel material over the memory material along the sidewall and the bottom surface of the first trench and over the top surface of the multi-layer stack;

forming a sacrificial material over the memory material to fill the first trench; and removing the memory material, the channel material and the sacrificial material outside the first trench.

20. The method of claim 13, wherein a top view of the first trench is ring-shaped.

* * * * *